United States Patent
Takatori

(10) Patent No.: US 8,384,462 B2
(45) Date of Patent: Feb. 26, 2013

(54) DELAY ELEMENT, VARIABLE DELAY LINE, AND VOLTAGE CONTROLLED OSCILLATOR, AS WELL AS DISPLAY DEVICE AND SYSTEM COMPRISING THE SAME

(75) Inventor: Kenichi Takatori, Kawasaki (JP)

(73) Assignee: NLT Technologies, Ltd., Kanagawa (JP)

( * ) Notice: Subject to any disclaimer, the term of this patent is extended or adjusted under 35 U.S.C. 154(b) by 2 days.

(21) Appl. No.: 12/323,164

(22) Filed: Nov. 25, 2008

(65) Prior Publication Data
US 2009/0153214 A1    Jun. 18, 2009

(30) Foreign Application Priority Data

Nov. 29, 2007 (JP) ................................. 2007-308622
Oct. 31, 2008 (JP) ................................. 2008-281019

(51) Int. Cl.
*H03H 11/26* (2006.01)
(52) U.S. Cl. ......... 327/262; 327/261; 327/371; 327/512
(58) Field of Classification Search ................... 327/261, 327/262, 371, 512, 513, 538
See application file for complete search history.

(56) References Cited

U.S. PATENT DOCUMENTS

| | | | | |
|---|---|---|---|---|
| 5,241,286 A * | 8/1993 | Mirow | ...................... | 331/108 B |
| 5,359,303 A * | 10/1994 | Mirow | .......................... | 331/176 |
| 5,621,260 A * | 4/1997 | Fukuoka et al. | ......... | 310/154.04 |
| 5,621,360 A * | 4/1997 | Huang | ............................ | 331/57 |
| 6,262,616 B1 * | 7/2001 | Srinivasan et al. | ............ | 327/264 |
| 6,333,652 B1 * | 12/2001 | Iida et al. | ...................... | 327/161 |
| 6,700,365 B2 * | 3/2004 | Isham et al. | .................. | 323/317 |
| 7,154,324 B1 * | 12/2006 | Maangat et al. | .............. | 327/288 |
| 7,477,090 B2 * | 1/2009 | Takahashi | ..................... | 327/512 |
| 7,629,826 B2 * | 12/2009 | Song | ............................. | 327/291 |
| 2005/0094421 A1 * | 5/2005 | Flore et al. | ...................... | 363/60 |
| 2005/0156647 A1 | 7/2005 | Kim | | |

FOREIGN PATENT DOCUMENTS

| | | |
|---|---|---|
| CN | 1665135 A | 9/2005 |
| CN | 1968006 A | 5/2007 |
| JP | 64-051818 A | 2/1989 |
| JP | 04-287511 A | 10/1992 |
| JP | 05-136693 A | 6/1993 |
| JP | 07-143405 A | 6/1995 |

(Continued)

OTHER PUBLICATIONS

Japanese Office Action issued Nov. 13, 2012 in corresponding Japanese Patent Application No. 2008-281019.

*Primary Examiner* — An Luu
(74) *Attorney, Agent, or Firm* — Sughrue Mion, PLLC

(57) ABSTRACT

To provide, with a simple structure, a voltage controlled oscillator, etc., whose center oscillation frequency is stable even if there is a change in the temperature. A delay element includes: a delay generating part which adds a delay amount to an input signal to generate an output signal; and a delay control part which controls the delay. The delay control part has a delay adjusting circuit which outputs a first control signal for adjusting the delay amount, and a temperature compensating circuit which outputs a second control signal for compensating property changes caused by the temperature. The delay control part outputs a third control signal obtained by synthesizing the first control signal and the second control signal to the delay generating part to control the delay amount. The delay control part obtains the third control signal by having the delay adjusting circuit and the temperature compensating circuit connected in series.

19 Claims, 63 Drawing Sheets
(2 of 63 Drawing Sheet(s) Filed in Color)

FOREIGN PATENT DOCUMENTS

| | | |
|---|---|---|
| JP | 08-213892 A | 8/1996 |
| JP | 08-306998 A | 11/1996 |
| JP | 09-172356 A | 6/1997 |
| JP | 09-321614 A | 12/1997 |
| JP | 10-290147 A | 10/1998 |
| JP | 11-068523 A | 3/1999 |
| JP | 11-145800 A | 5/1999 |
| JP | 2000-059181 A | 2/2000 |
| JP | 2000-269810 A | 9/2000 |
| JP | 2002-290212 A | 10/2002 |
| JP | 2003-132676 A | 5/2003 |
| JP | 2004-304564 A | 10/2004 |
| JP | 2005-057768 A | 3/2005 |
| JP | 2005-117442 A | 4/2005 |
| JP | 2006-071564 A | 3/2006 |
| JP | 2006-270856 A | 10/2006 |

* cited by examiner

DELAY ELEMENT, VARIABLE DELAY LINE, AND VOLTAGE CONTROLLED OSCILLATOR, AS WELL AS DISPLAY DEVICE AND SYSTEM COMPRISING THE SAME

CROSS-REFERENCE TO RELATED APPLICATION

This application is based upon and claims the benefit of priority from Japanese patent application No. 2007-308622, filed on Nov. 29, 2007 and Japanese patent application No. 2008-281019, filed on Oct. 31, 2008 the disclosure of which is incorporated herein in its entirety by reference.

BACKGROUND OF THE INVENTION

1. Field of the Invention

The present invention relates to a delay element, a variable delay line, a voltage controlled oscillator, and the like. More specifically, the present invention relates to circuit elements capable of adjusting delay amount or frequency and capable of executing temperature compensation. Further, the present invention relates to a device such as a display device using those circuit elements.

2. Description of the Relates Art

A voltage controlled oscillator capable of changing the oscillation frequency by applied voltages can easily control the oscillation frequency, since it can generate control signals more easily than a current control type. Thus, such voltage controlled oscillator is used widely. There are several techniques known as the voltage controlled oscillator. Among those, often used is a circuit in which a closed loop is formed by a plurality of units (each unit includes an inverter configured with a transistor and a function capable of adjusting delay of the converter), due to its simple circuit structure. The inverter configured with the closed loop can form an oscillator called a ring oscillator, which is formed to oscillate according to a feedback method. In the voltage controlled oscillators configured with the inverters, there exists a type of circuit which has a function of adjusting delay of the inverter achieved by a structure that has additional transistor added to a junction part between the inverter and a power supply, and takes a delay element configured by the inverter and the added transistor as one unit. With such circuit, the oscillation frequency can be changed by adjusting bias to the gate of the transistor that is connected to the power supply.

Japanese Unexamined Patent Publication 05-136693 (FIG. 1, paragraphs 0003-0004, 0009-0011, etc: Patent Document 1) discloses a phase lock loop that is configured by adding a technique for compensating the temperature characteristic to such voltage controlled oscillator. FIG. 63 is an illustration showing the phase lock loop depicted in Patent Document 1. The phase lock loop is configured with a voltage controlled oscillator 910, a phase comparator 904, a low-pass filter 905, and a selection circuit 906. Further, a potential compensating circuit 930 for fixing an oscillation clock when starting the oscillation is connected to the selection circuit 906. Furthermore, a temperature compensating circuit 920 is connected to the voltage control circuit 910.

The voltage controlled oscillator 910 is configured with a ring oscillator which obtains oscillation by feeding back output of serially connected odd-numbered stages of CMOS (Complementary Metal Oxide Silicon) transistors 911 to an input side. The frequency of an oscillation clock OCK is determined when an oscillation control voltage is supplied to gates of N-channel type MOS (Metal Oxide Silicon) transistors (referred to as "NMOS transistors" hereinafter) 912 which are connected to ground side of each CMOS transistor 911. The phase comparator 904 detects a phase difference between the oscillation clock OCK of the voltage controlled oscillator 910 and a specific-cycle reference clock RCK, and inputs a detection output PD that indicates phase difference between those clocks to the low-pass filter 905. The low-pass filter 905 eliminates a high-frequency component of the output PD of the phase comparator 904 indicating the phase difference between the oscillation clock OCK and the reference clock RCK, and inputs it to the selection circuit 906 as a first control voltage VC1. The first control voltage VC1 or a second control voltage VC2 is supplied from the selection circuit 906 to the gate of the MOS transistor 912 which determines the frequency of the oscillation clock OCK of the voltage controlled oscillator 910.

Further, P-channel type MOS transistors (referred to as "PMOS transistor" hereinafter) 913 are connected to the current source side of the respective CMOS transistors 911, and temperature compensating voltage VTC for turning on the PMOS transistors 913 in accordance with a temperature increase is applied to the gates of the PMOS transistors 913. The temperature compensating circuit 920 that generates the temperature compensating voltage VTC is configured with: a resistance 921 connected in series between the power supply grounds, and an NMOS transistor 922 whose gate is connected to the drain; a CMOS transistor 923 for receiving output of a junction point between the resistance 921 and the NMOS transistor 922; and a PMOS transistor 924 that is connected to the output side of the CMOS transistor 923, while its gate being connected to the drain. The output of the CMOS transistor 923 is supplied to the voltage controlled oscillator 910 as the temperature compensating voltage VTC. Therefore, when the driving capacity of the MOS transistor 922 becomes deteriorated by a temperature increase, voltage drop in the NMOS transistor 922 becomes significant. Thus, the potential at the junction point between the resistance 921 and the NMOS transistor 922 increased, so that the P-channel side of the CMOS transistor 923 is turned off and the N-channel side thereof is turned on. Thereby, the temperature compensating voltage VTC that is the output of the CMOS transistor 923 is pulled up. Because of the increase in the temperature compensating voltage VTC, on-resistance of the PMOS transistors 913 connected to each CMOS transistor 911 of the voltage controlled oscillator 910 is lowered. Therefore, deterioration in the driving capacity of the CMOS transistor 911 caused due to the temperature increase can be compensated, thereby suppressing an increase in the delay amount of each CMOS transistor 911. As a result, a large fluctuation in the frequency of the oscillation clock OCK can be prevented.

Further, the selection circuit 906 supplies, to the gates of the NMOS transistors 912, the first control voltage VC1 that fluctuates in accordance with the phase difference between the oscillation clock OCK and the reference clock RCK or the second control voltage VC2 of a fixed level. The first control voltage VC1 is obtained from the compared output PD of the phase comparator 904 which detects the phase difference between the oscillation clock OCK outputted from the voltage controlled oscillator 910 and the reference clock RCK, and it is inputted to the selection circuit 906. In the meantime, the second control voltage VC2 is obtained from the voltage compensating circuit 930 that is capable of obtaining a constant-level output regardless of fluctuations in the current source potential, and it is inputted to the selection circuit 906. The voltage compensating circuit 930 which generates the second control voltage VC2 of a constant level is configured with: an NMOS transistor 931 that is connected to the power supply side and has a power supply potential supplied to its gate; and two NMOS transistors 932, 933 connected in series on the ground side and have the gates connected to the drains. The voltage compensating circuit 930 outputs the potential of the junction point between the NMOS transistor 931 and the NMOS transistor 932 as the second control voltage VC2. With the use of such voltage compensating circuit 930, the potential on the power supply side of the NMOS transistor 932 shows a voltage higher by amount of threshold values of the NMOS transistors 932, 933 than the ground potential at all times. Therefore, the second control voltage VC2 obtained from the junction point between the NMOS transistors 931, 932 always keeps a constant level regardless of the fluctuation in the power supply potential.

However, in the delay element of the voltage controlled oscillator depicted in Patent Document 1, there are two sections that can be adjusted from outside for stabilizing the oscillation frequency with respect to changes in the temperature. Thereby, the structure becomes complicated. In addition, there are some issues as described in the followings.

A first issue is that the temperature compensation is insufficient, since the temperature compensation executed by the temperature compensating circuit of Patent Document 1 generates a temperature compensation voltage by utilizing only the difference between the temperature dependencies of the resistance and the diode-connected transistor. The temperature compensation becomes insufficient with this structure, due to the three following reasons.

The first reason is that there is a large difference in voltage-current characteristics of the resistance and the diode-connected transistor. Particularly, the diode-connected transistor is often used as a substitute for the resistance, however, linearity of the voltage and current is not good. Thus, the voltage determined by those two elements exhibits poor linearity for a change in the current caused due to the temperature.

The second reason is that the temperature dependency of the resistance and the diode-connected transistor varies depending on the voltage region. There is a small change in the temperature dependency of the resistance caused by the voltage. In the meantime, the temperature dependency of the transistor varies greatly depending on the voltages, since the temperature dependency of mobility and the temperature dependency of the threshold value have great roles, and the effects thereof are inverted from each other with respect to the temperatures. Therefore, changes in the voltages generated depending on the temperatures at both ends of the two elements vary, so that the correspondence between the changes in the temperature and the changes in the voltage becomes a nonlinear form. In some cases, the relation thereof becomes inverted, which makes it difficult to perform control thereon.

The third reason is that there is no accurate correspondence between the voltage for the temperature generated by the temperature compensating circuit configured with the resistance and the diode-connected transistor and the voltage for compensating the characteristic change caused due to the temperature change generated within the voltage controlled oscillator configured with the transistor. That is, the voltage controlled oscillator and the temperature compensating circuit have different temperature dependencies, so that the temperature compensation effect is not sufficient. Because of the three reasons, the temperature compensation executed with the technique of Patent Document 1 is insufficient.

The second issue is that there is a large chronological change in the performance, since it is necessary to apply biases (voltages) under different controls to both the power supply side and the ground side of the delay element. That is, a bias from the temperature compensating circuit is applied to the power supply side, and a bias from the potential compensating circuit is applied to the ground side. With this structure, the power supply side and the ground side are to be under completely different controls. Thus, the transistor (913 in FIG. 63) which receives the bias on the power supply side and the transistor (912 in FIG. 63) which receives the bias on the ground side are used under largely different bias conditions. As a result, deterioration states of the transistors on the current source side and the ground side vary greatly, so that deterioration caused due to one of the transistors changes the performance of the voltage controlled oscillator and affects the long-term reliability greatly. As described, the chronological change in the performance is significant.

Like the second issue, the third issue is caused due to the fact that the function of the potential compensating circuit for adjusting the frequency and the function of the temperature compensating circuit for compensating the temperature work at different sections of the delay element. That is, the technique of Patent Document 1 requires two sections that can be adjusted from outside provided within the delay element. As a result, the technique described above cannot be applied to a structure that has only one section that can be adjusted from outside provided within the delay element.

Further, in a case where there are two externally adjustable sections within the delay element, if both of the externally adjustable sections are configured to be controlled in the same manner in order to avoid the chronological change that is the second issue, it turns out as the same structure as the case of having only one adjustable section. Therefore, the technique described above cannot be applied to such case. That is, when it is structured to have a transistor for receiving the bias provided to the current source side and to the ground side, respectively, to be controlled simultaneously by respectively supplying a bias with which both transistors change in the same manner, there is only one kind of bias that can be used practically. Therefore, the technique of Patent Document 1 cannot be applied. Furthermore, in a case where there are two externally adjustable sections within the delay element, both of the two adjustable sections are used. Thus, other adjustable functions cannot be added. Therefore, the technique is used only in a very limited condition.

The fourth issue is that there is no versatility in using the structure. That is, the delay element is restricted to be structured with an inverter and a transistor added to the inverter, and no other structure can be used.

SUMMARY OF THE INVENTION

It is therefore an exemplary object of the invention to provide a simple-structured voltage controlled oscillator and the like whose center oscillation frequency can be stable even when there is a change in the temperature. For example, it is to provide a simple-structured voltage controlled oscillator and the like, which can perform temperature compensation without using an external element such as a temperature compensation quartz oscillator or the like.

Another exemplary object of the invention is to provide a delay element which has a function of adjusting the delay amount and compensating the characteristic change caused due to the temperature by applying an effect at a single section of the delay element. Further, it is to provide a variable delay line and a voltage controlled oscillator which can adjust the frequency and compensate the temperature by utilizing that delay element. Still another exemplary object of the present invention is to provide delay elements of various structures which have a function of adjusting the delay amount and compensating the character change caused due to the temperature. Further, it is to provide a variable delay line and a voltage controlled oscillator which can adjust the frequency and compensate the temperature by utilizing that delay elements. Yet another exemplary object of the present invention is to provide a display device having a functional circuit unit whose temperature characteristic is compensated and a display unit formed integrally. Furthermore, it is to provide various devices and systems using that display device as one of the structural modules. Another exemplary object of the present invention is to provide a display device of low power consumption. Further, it is to provide various devices and systems using that display device as one of the structural modules.

A delay element according to an exemplary aspect of the invention includes a delay generating part which generates an output signal by adding a specific delay amount to an input signal, and a delay control part for controlling the delay amount. The delay control part includes a delay adjusting circuit which outputs a first control signal for adjusting the delay amount and a temperature compensating circuit which outputs a second control signal for compensating a property change caused due to a temperature, and outputs a third control signal obtained by synthesizing the first control signal and the second control signal to the delay generating part so as to control the delay amount.

A variable delay line according to another exemplary aspect of the invention includes a plurality of the delay elements of the invention connected in series.

A voltage controlled oscillator according to still another exemplary aspect of the invention is configured with the variable delay line of the invention that has a closed loop in which an output terminal of one of the plurality of delay elements is connected to an input terminal of one of the delay elements of earlier stage than that delay element.

A display device according to still another exemplary aspect of the invention includes the voltage controlled oscillator of the invention and a functional circuit unit including the voltage controlled oscillator.

A system according to still another exemplary aspect of the invention includes the display device of the invention as one of structural modules.

BRIEF DESCRIPTION OF THE DRAWINGS

The patent or application file contains at least one drawing executed in color. Copies of this patent or patent application publication with color drawing(s) will be provided by the office upon request and payment of the appropriate fee.

FIG. 1 shows block diagrams of a delay element according to a first exemplary embodiment of the invention, in which

FIG. 10 shows block diagrams of a delay element according to a second exemplary embodiment of the invention, in which

DETAILED DESCRIPTION OF THE EXEMPLARY EMBODIMENTS

First Exemplary Embodiment

Figure 1A:
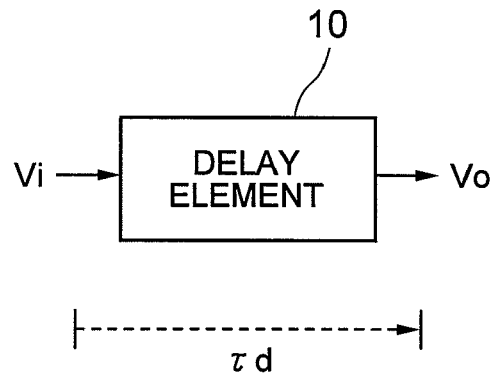
FIG. 1A shows a schematic view of the delay element.
Figure 1B:
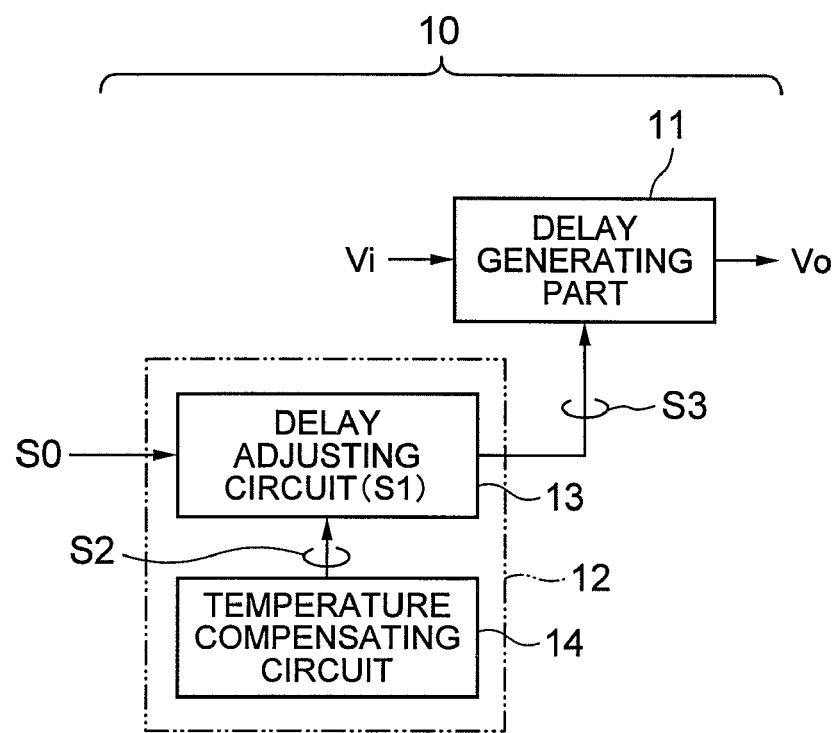
FIG. 1B shows details of the delay element.

FIGS. 1A and 1B show block diagrams of a delay element according to a first exemplary embodiment of the invention, in which FIG. 1A shows a schematic view of the delay element, and FIG. 1B shows details of the delay element. Explanations will be provided hereinafter by referring to the drawings.

A delay element 10 of this exemplary embodiment includes: a delay generating part 11 which adds a delay amount τd to an input signal Vi to generate an output signal;

and a delay control part 12 which controls the delay amount τd. The delay control part 12 has a delay adjusting circuit 13 which outputs a control signal S1 as a first control signal for adjusting the delay amount τd, and has a temperature compensating circuit 14 which outputs a control signal S2 as a second control signal for compensating characteristic changes caused due to the temperature. The delay control part 12 outputs a control signal S3 as a third control signal that is obtained by synthesizing the control signal S1 and the control signal S2 to the delay generating part 11 so as to control the delay amount τd. The delay control part 12 obtains the control signal S3 by having the delay adjusting circuit 13 and the temperature compensating circuit 14 connected in series. A control signal S0 corresponds to a prescribed delay amount τd, and it is outputted to the delay adjusting circuit 13 from another circuit that is not shown.

That is, the delay control part 12 for controlling delay has a structure in which the delay adjusting circuit 13 and the temperature compensating circuit 14 are connected in series. As shown in FIG. 1A, the delay element 10 generates a specific delay amount τd between the input signal Vi from the left side of the drawing and the output signal Vo of the right side. Referring to FIG. 1B, in addition to having the delay generating part 11, the delay element 10 has the delay control part 12 that is configured with the delay adjusting circuit 13 and the temperature compensating circuit 14. The delay adjusting circuit 13 and the temperature compensating circuit 14 are connected in series with respect to each other. In FIG. 1B, the control signal S3 is outputted from the delay adjusting circuit 13 to the delay generating part 11. However, the control signal S3 may be outputted from the temperature compensating circuit 14 or from the junction part between the delay adjusting circuit 13 and the temperature compensating circuit 14.

By connecting the delay adjusting circuit 13 and the temperature compensating circuit 14 in series, both functions can be synthesized. That is, it is possible to generate the control signal S3 in which the function of adjusting the delay amount τd and the function of compensating the temperature characteristic are synthesized.

Particularly, when the main part configuring the delay adjusting circuit 13 and the temperature compensating circuit 14 is a voltage-current conversion element, it is possible to form the delay element 10 that can be adjusted with a voltage. The voltage-current conversion element outputs a current in accordance with an inputted voltage. In this exemplary embodiment, the delay adjusting circuit 13 and the temperature compensating circuit 14 are connected in series, so that one of the voltage-current conversion elements is affected by the other. Thus, the current outputted from each of the voltage-current conversion elements becomes changed. For example, when an applied voltage of the voltage-current conversion element within the temperature compensating circuit 14 is changed while the applied voltage of the voltage-current conversion element within the delay adjusting circuit 13 is set constant, not only the current outputted from the voltage-current conversion element within the temperature compensating circuit 14 is changed, but also the current outputted from the voltage-current conversion element within the delay adjusting circuit 13 becomes changed. In this manner, the effects of the delay adjusting circuit 13 and the temperature compensating circuit 14 can be synthesized. The synthesized effect, i.e., the output current from the voltage-current conversion elements, is added directly or indirectly to the delay generating part 11 as the control signal S3, and the delay amount τd is adjusted.

Figure 2:
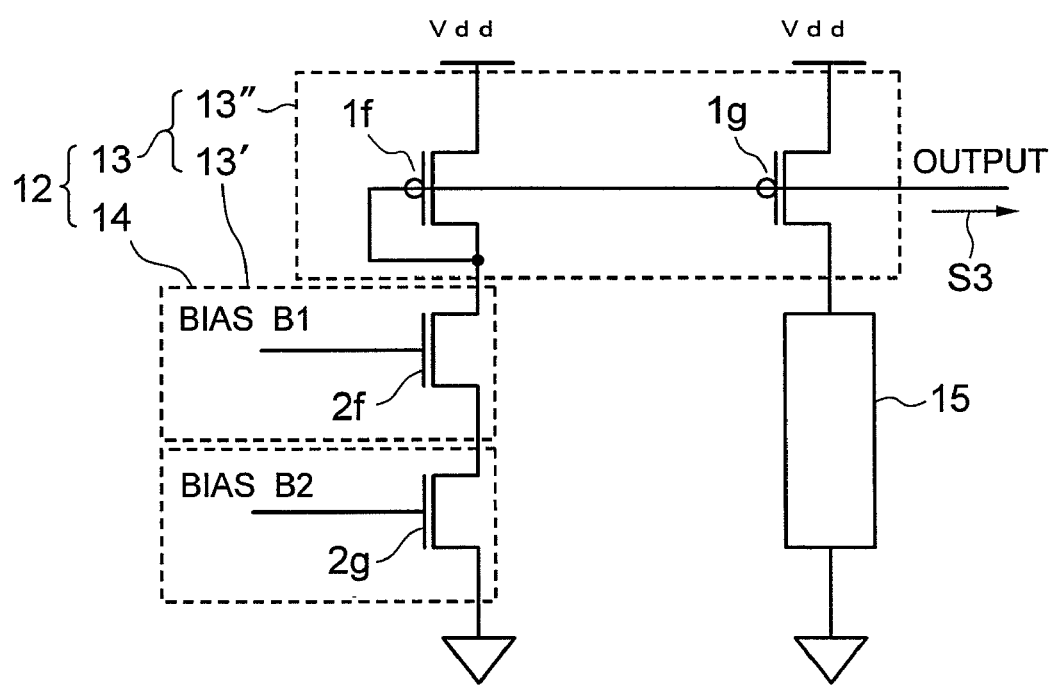
FIG. 2 is a circuit block diagram showing a first example of a delay control part of the first exemplary embodiment.

For example, the main parts of the delay adjusting circuit 13 and the temperature compensating circuit 14 may be formed with the voltage-current conversion elements, and the outputted current can be current-voltage converted to be applied to the delay generating part 11 as a voltage bias. FIG. 2 shows an example of the delay control part 12 that materializes such structure.

FIG. 2 is a circuit block diagram showing a first example of the delay control part according to this exemplary embodiment. Explanations will be provided hereinafter by referring to FIG. 1 and FIG. 2.

The delay control part 12 has the delay adjusting circuit 13 and the temperature compensating circuit 14. In this example, the voltage-current conversion element is configured with an NMOS transistor. The delay adjusting circuit 13 has a circuit 13' containing an NMOS transistor 2f as the voltage-current conversion element, and a current mirror circuit 13". The temperature compensating circuit 14 contains an NMOS transistor 2g as the voltage-current conversion element. The NMOS transistors 2f and 2g are connected in series, and the currents outputted therefrom are inputted to the current mirror circuit 13" that is configured with PMOS transistors 1f, 1g. In the current mirror circuit 13", the current according to the current generated from the NMOS transistors 2f, 2g flows in the PMOS transistor 1g. At this time, the gate voltage of the PMOS transistors 1f, 1g is the voltage between the PMOS transistor 1f and the NMOS transistor 2f. This voltage is determined by the NMOS transistor 1f and the NMOS transistors 2f, 2g. That is, current-voltage conversion is executed through this connection. The gate voltage of the PMOS transistors 1f, 1g is outputted as the control signal S3 for controlling the delay generating part 11.

Further, another circuit 40 other than the main part of this example is connected in series with the PMOS transistor 1g. Bias B1 corresponds to the control signal S0, for example. Bias B2 is a signal corresponding to a present temperature, and it is outputted from a temperature sensor (not shown) within the temperature compensating circuit 14, for example.

With this exemplary embodiment, delay adjustment and temperature compensation can be achieved in a structure that has only one externally controllable section within the delay generating part 11. In the meantime, with a structure having a plurality of externally adjustable sections within the delay generating part 11, only one adjustable section needs to be used for regular delay adjustment and temperature compensation. Thus, it is possible to use the remaining adjustable sections for other usages, e.g., for delicate adjustment of delay.

Various types are used for the delay generating part 11 of this exemplary embodiment. Some examples of the delay generating part 11 will be described hereinafter by referring to the drawings.

Figure 3:
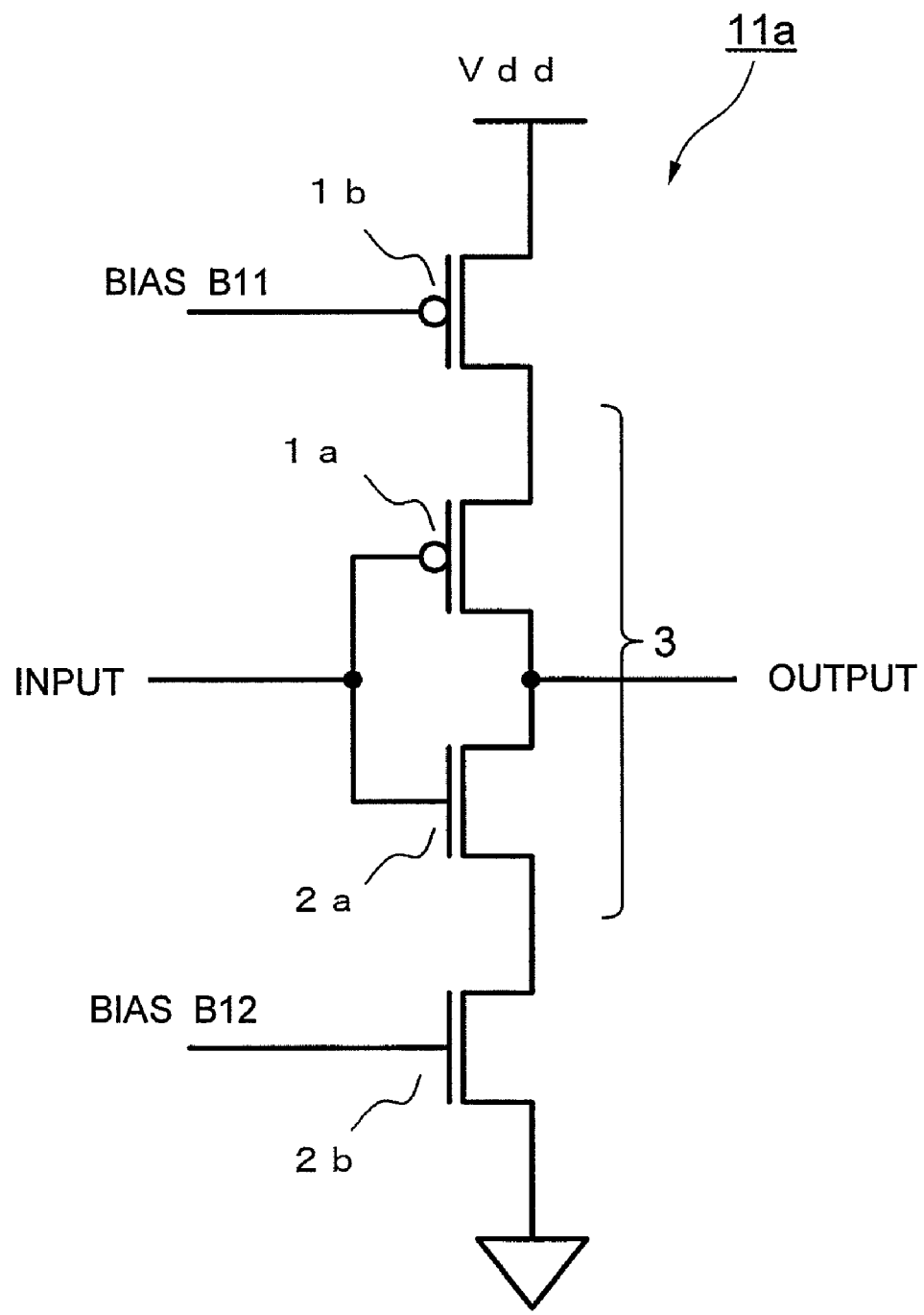
FIG. 3 is a circuit block diagram showing a first example of a delay generating part of the first exemplary embodiment.

FIG. 3 is a circuit block diagram showing a first example of the delay generating part according to this exemplary embodiment. Explanations will be provided hereinafter by referring to this drawing.

A delay generating part 11a of this example is a circuit called a current-starved inverter. In the delay generating part 11a, a PMOS transistor 1a and an NMOS transistor 2a connected between the input and the output configure an inverter 3. A PMOS transistor 1b and an NMOS transistor 2b are connected, respectively, between the inverter 3 and a high-voltage side power supply (Vdd in the drawing) and between the inverter 3 and a low-voltage side power supply (ground in the drawing; may be a potential other than the ground). In other words, the PMOS transistor 1b is connected between the PMOS transistor 1a and the high-voltage side power supply, and the NMOS transistor 2b is connected between the NMOS transistor 2a and the low-voltage side power supply.

A bias B11 is applied to the gate electrode of the PMOS transistor 1b, and a bias B12 is applied to the gate electrode of the NMOS transistor 2b. By adjusting the biases B1 and B12, the drain-source resistance of the PMOS transistor 1b and the NMOS transistor 2b can be adjusted, so that the currents flown to the PMOS transistor 1a and the NMOS transistor 2a are changed as well. As a result, the delay amount of the delay generating part 11a can be adjusted by the biases B11 and B12. That is, when the drain-source resistance is increased by both of or one of the biases B11 and B12, the current flown to the inverter 3 becomes decreased so that the delay amount τd of the delay generating part 11a is increased. Inversely, when the drain-source resistance is decreased, the current flown to the inverter 3 becomes increased so that the delay amount τd of the delay generating part 11a is decreased.

In this exemplary embodiment, the adjustment bias (i.e., the control signal S3) generated by serially connecting the delay adjusting circuit 13 and the temperature compensating circuit 14 is inputted to the bias B11 or the bias B12. This makes it possible to perform delay adjustment and temperature compensation. The single current-starved inverter only needs to have either the PMOS transistor 1b or the NMOS transistor 2b. That is, it can be structured with three transistors.

Figure 4:
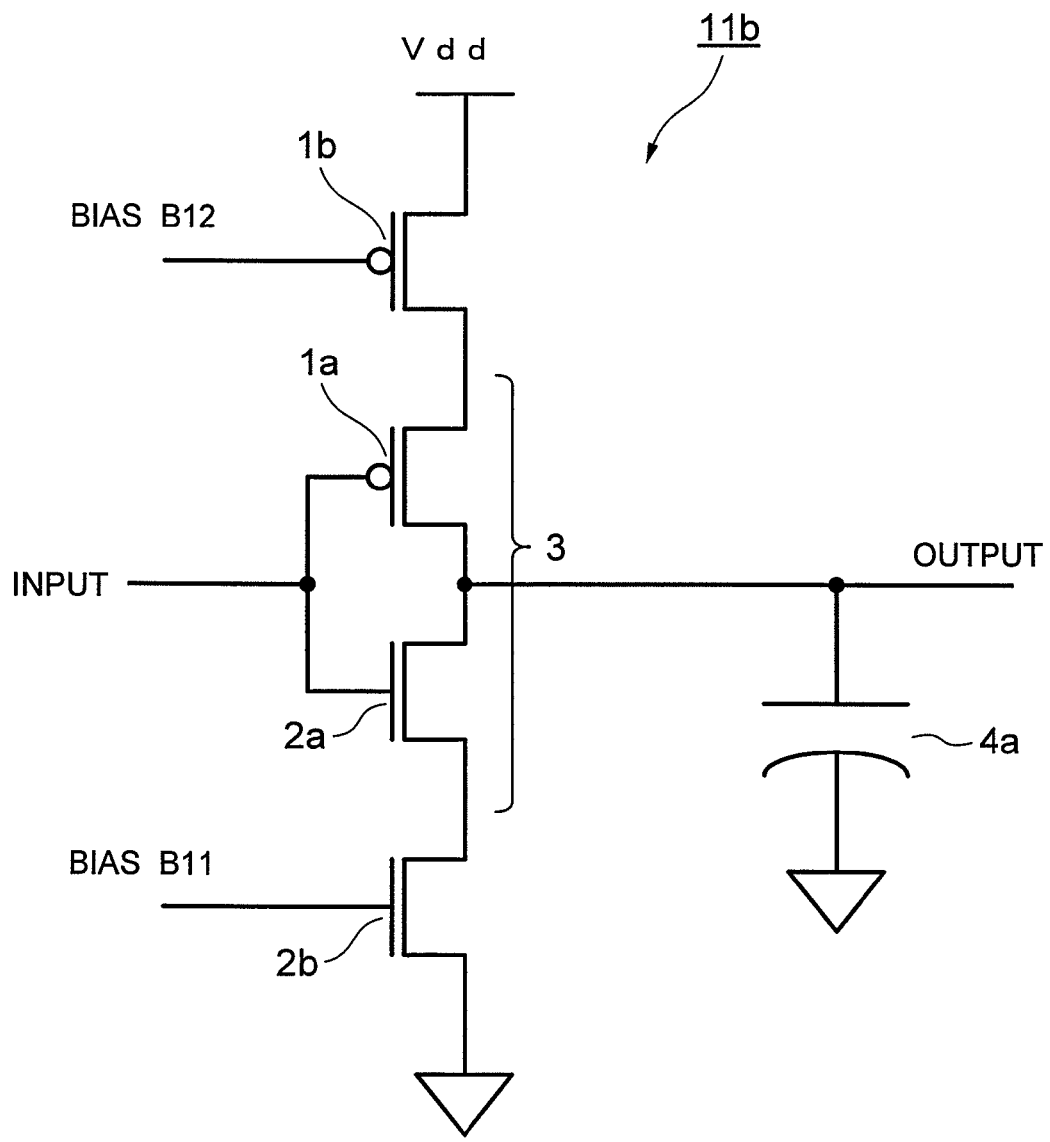
FIG. 4 is a circuit block diagram showing a second example of the delay generating part of the first exemplary embodiment.

FIG. 4 is a circuit block diagram showing a second example of the delay generating part according to this exemplary embodiment. Explanations will be provided hereinafter by mainly referring to FIG. 4.

A delay generating part 11b of this example has an additional capacitance 4a added to a current-starved inverter. That is, the delay generating part 11b is formed by adding the additional capacitance 4a to the output part of the delay generating part 11a of FIG. 3. Charge and discharge currents to the capacitance are increased by adding the additional capacitance 4a, so that the delay amount τd is increased. With the delay generating part 11b, it is possible to form a delay element that has longer delay time than that of the delay generating part 11a of FIG. 3. That is, when a voltage controlled oscillator is structured by using the delay generating part 11b, the voltage controlled oscillator with lower frequency can be formed than the case of using the delay generating part 11a of FIG. 3. Further, it is possible to control a reference value of the oscillation frequency by the capacitance value of the additional capacitance 4a.

Figure 5:
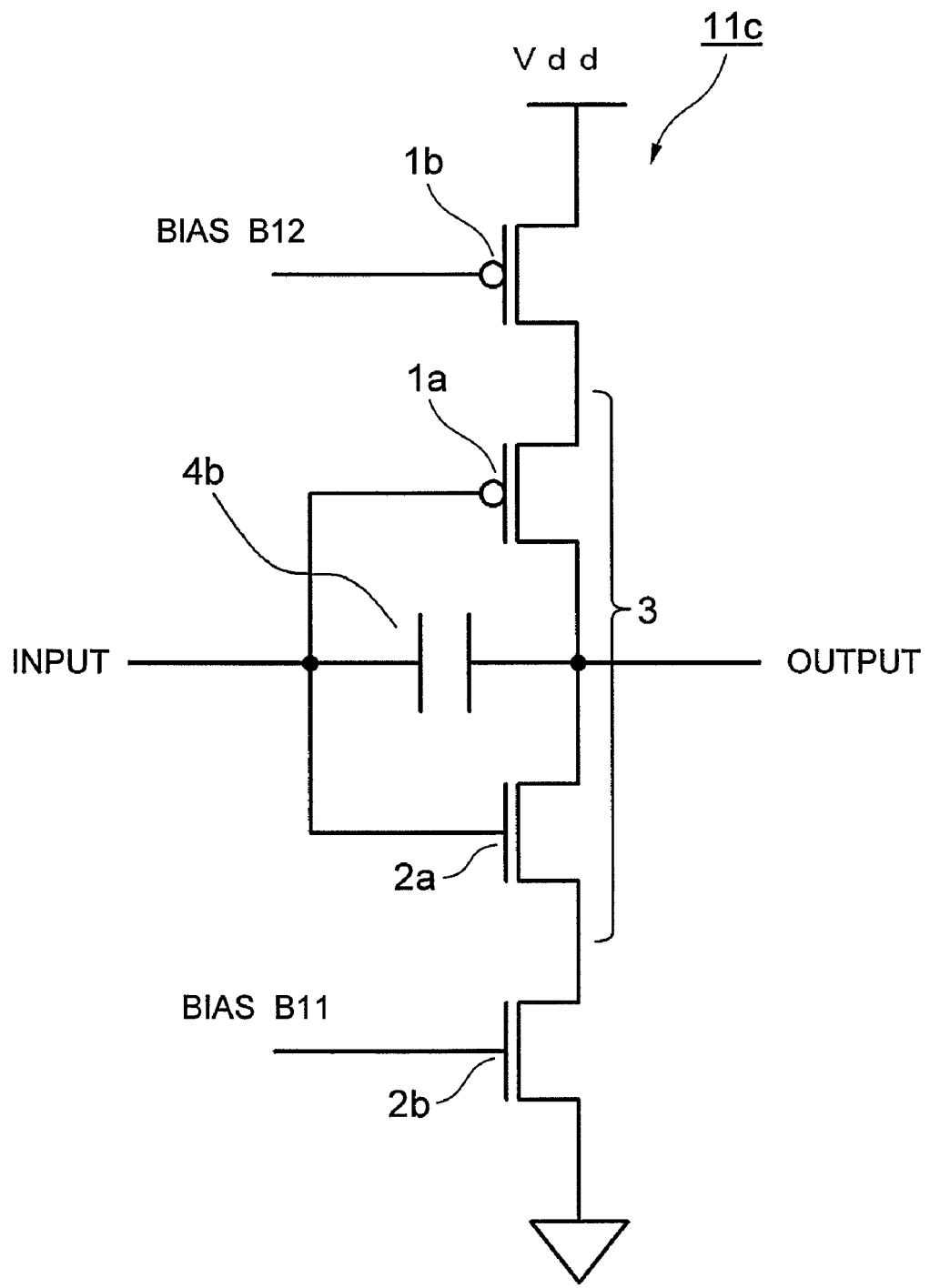
FIG. 5 is a circuit block diagram showing a third example of the delay generating part of the first exemplary embodiment.
Figure 6:
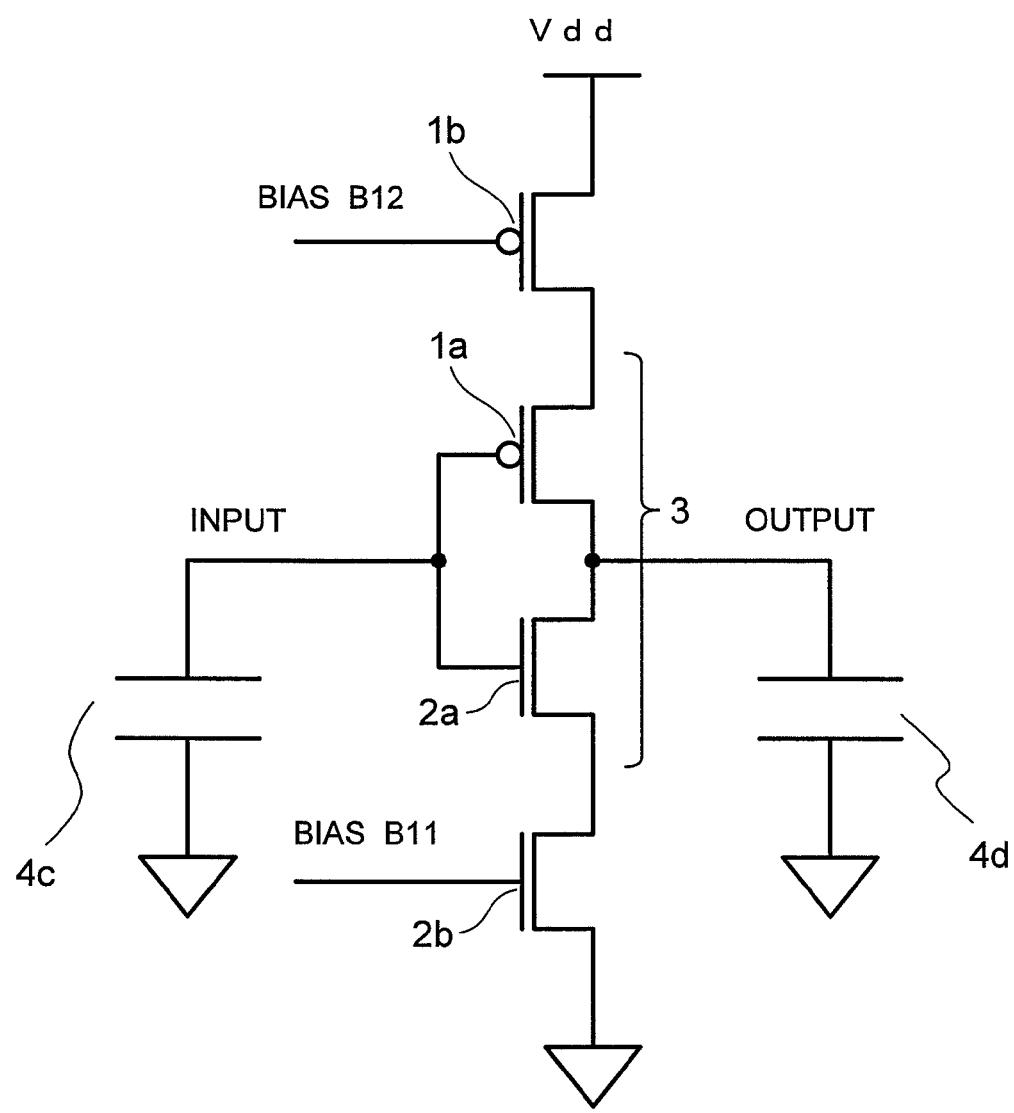
FIG. 6 is a circuit block diagram showing a mirror effect of the delay generating part shown in FIG. 5.

FIG. 5 is a circuit block diagram showing a third example of the delay generating part according to this exemplary embodiment. FIG. 6 is a circuit block diagram showing the mirror effect of the delay generating part shown in FIG. 5. Explanations will be provided hereinafter by mainly referring to FIG. 5 and FIG. 6.

A delay generating part 11c of this example has an additional capacitance 4b added to a current-starved inverter. That is, the delay generating part 11c is formed by adding the additional capacitance 4b between the input and the output the delay generating part 11a of FIG. 3. A large difference between the delay generating part 11c and the delay generating part 11b of FIG. 4 is that the additional capacitance 4b is formed as a mirror capacitance.

FIG. 6 illustrates the additional capacitance 4b as a mirror capacitance for describing the mirror effect. As a mirror capacitance substituted for the additional capacitance 4b, an input mirror capacitance 4c between the input and the low-voltage side power supply is connected, and an output mirror capacitance 4d between the output and the low-voltage side power supply is connected. It is assumed here that the capacitance value of the additional capacitance 4a of FIG. 4 is C, the capacitance value of the additional capacitance 4b is also C, and the gain of the inverter 3 is A. In that case, the capacitance value of the input mirror capacitance 4c is "(1+|A|)·C", and the capacitance value of the output mirror capacitance 4d is "(1+1/|A|)·C". Both values are larger than the original capacitance value C.

The gain A is determined by a drain conductance and a mutual conductance of each transistor within the current-starved inverter. The mutual conductance and the drain conductance change depending on a voltage condition. Particularly, when charged to a capacitance, the mutual conductance becomes large. Thus, the gain |A| becomes a value of about ten times, so that the input mirror capacitance 4c becomes extremely large. Under an operating condition where the drain conductance becomes large, the gain |A| becomes extremely small. Therefore, the output mirror capacitance 4d becomes extremely large. As described, the capacitance values of each mirror capacitance change depending on the voltage condition, and the total capacitance value of the both is "(2+|A|+1/|A|)·C". This value essentially becomes twice the value of the additional capacitance 4a of FIG. 4 or larger. The input mirror capacitance 4c is added as an output capacitance of a previous stage. Thus, when paying attention to a certain stage, a total capacitance of the input mirror capacitance 4c and the output mirror capacitance 4d becomes an additional capacitance of the output.

As a result, for achieving the same capacitance value as that of the additional capacitance 4a of FIG. 4, it simply needs to provide the additional capacitance 4b of a half the capacitance value or less in this example. Thus, the layout area can be reduced. As described, the delay generating part 11c of this example is advantageous compared to the delay generating part 11b of FIG. 4 in terms of the layout area. Further, as in the case of the delay generating part 11b of FIG. 4, it is possible with the delay generating part 11c to form a delay element that has longer delay time than that of the delay generating part 11a of FIG. 3. That is, when a voltage controlled oscillator is structured by using the delay generating part 11c, the voltage controlled oscillator with lower frequency can be formed than the case of using the delay generating part 11a of FIG. 3. Further, it is possible to control a reference value of the oscillation frequency by a capacitance value of the additional capacitance 4b.

Figure 7:
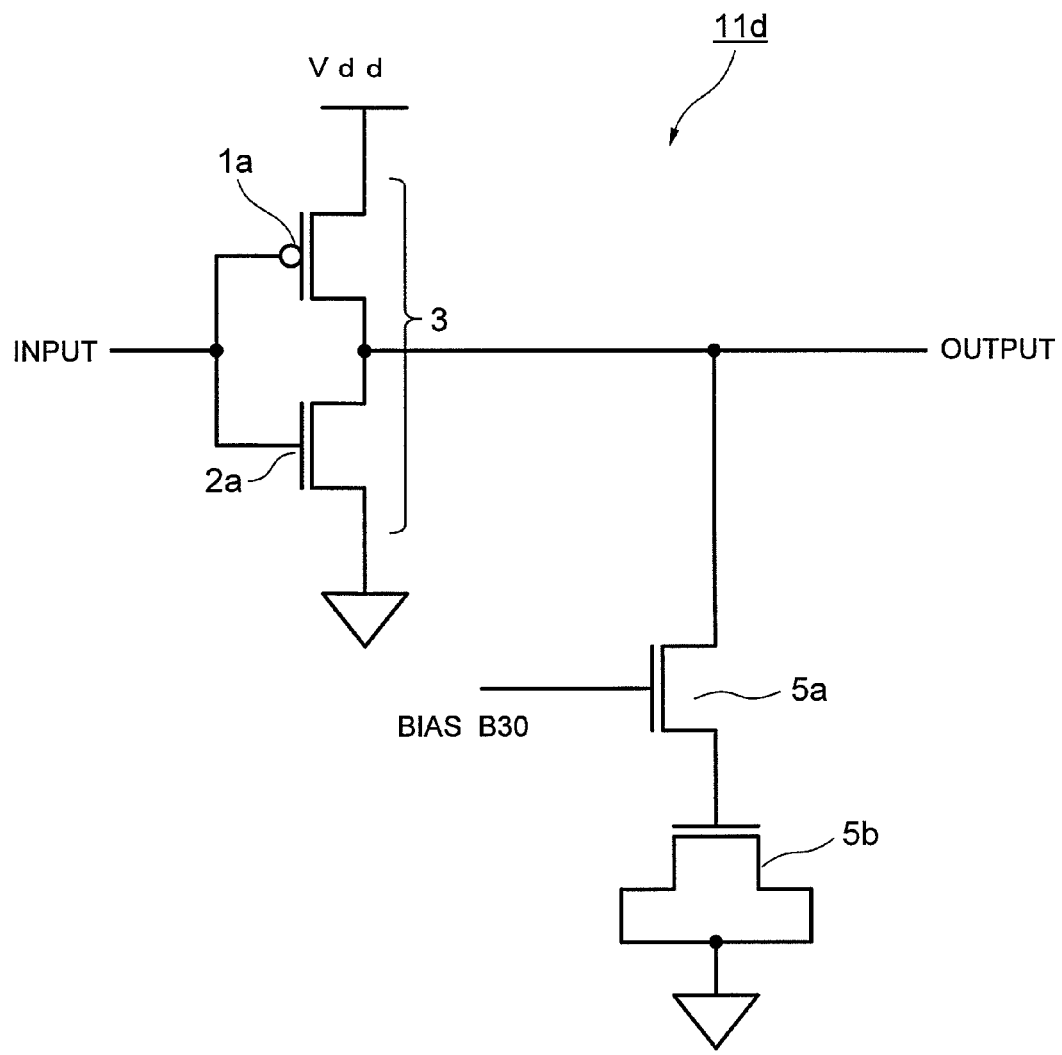
FIG. 7 is a circuit block diagram showing a fourth example of a delay generating part of the first exemplary embodiment.

FIG. 7 is a circuit block diagram showing a fourth example of the delay generating part according to this exemplary embodiment. Explanations will be provided hereinafter by mainly referring to FIG. 7.

A delay generating part 11d of this example is an inverter that uses a transistor capacitance 5b having the source and drain short-circuited as the additional capacitance. In this structure, the drain of an adjusting transistor 5a is connected to the output of the inverter 3 that is configured with the PMOS transistor 1a and the NMOS transistor 2a, and the transistor capacitance 5b is connected between the source of the adjusting transistor 5a and the low-voltage side power supply. The gate of the transistor capacitance 5b is connected to the source of the adjusting transistor 5a, while the source and the drain of the transistor capacitance 5a are short-circuited and connected to the low-voltage side power supply.

With this delay generating part 11d, the drain-source resistance of the adjusting transistor 5a is adjusted by a bias B30 that is applied to the gate of the adjusting transistor 5a. With this, a time constant determined by the resistance value of the drain-source resistance of the adjusting transistor 5a and the capacitance value of the transistor capacitance 5b is changed. As described, it is possible to adjust the time constant that is a product of the additional resistance value of the adjusting transistor 5a by the bias B30 and the additional capacitance value by the transistor capacitance 5b, so that the delay amount τd of the entire delay element 10 can also be adjusted. The adjusting transistor 5a and the transistor capacitance 5b may be formed with PMOS transistors. In that case, the drain and the source of the transistor capacitance 5b are connected to the high-voltage side power supply.

Unlike the case of the delay generating part 11b of FIG. 4 and the delay generating part 11c of FIG. 5, it is unnecessary to form the capacitance as an exclusive-use element with the delay generating part 11d. Thus, basic designs and fabrications can all be done by considering only the transistors as the elements, which makes it easy to execute the process development and fabrications.

Figure 8:
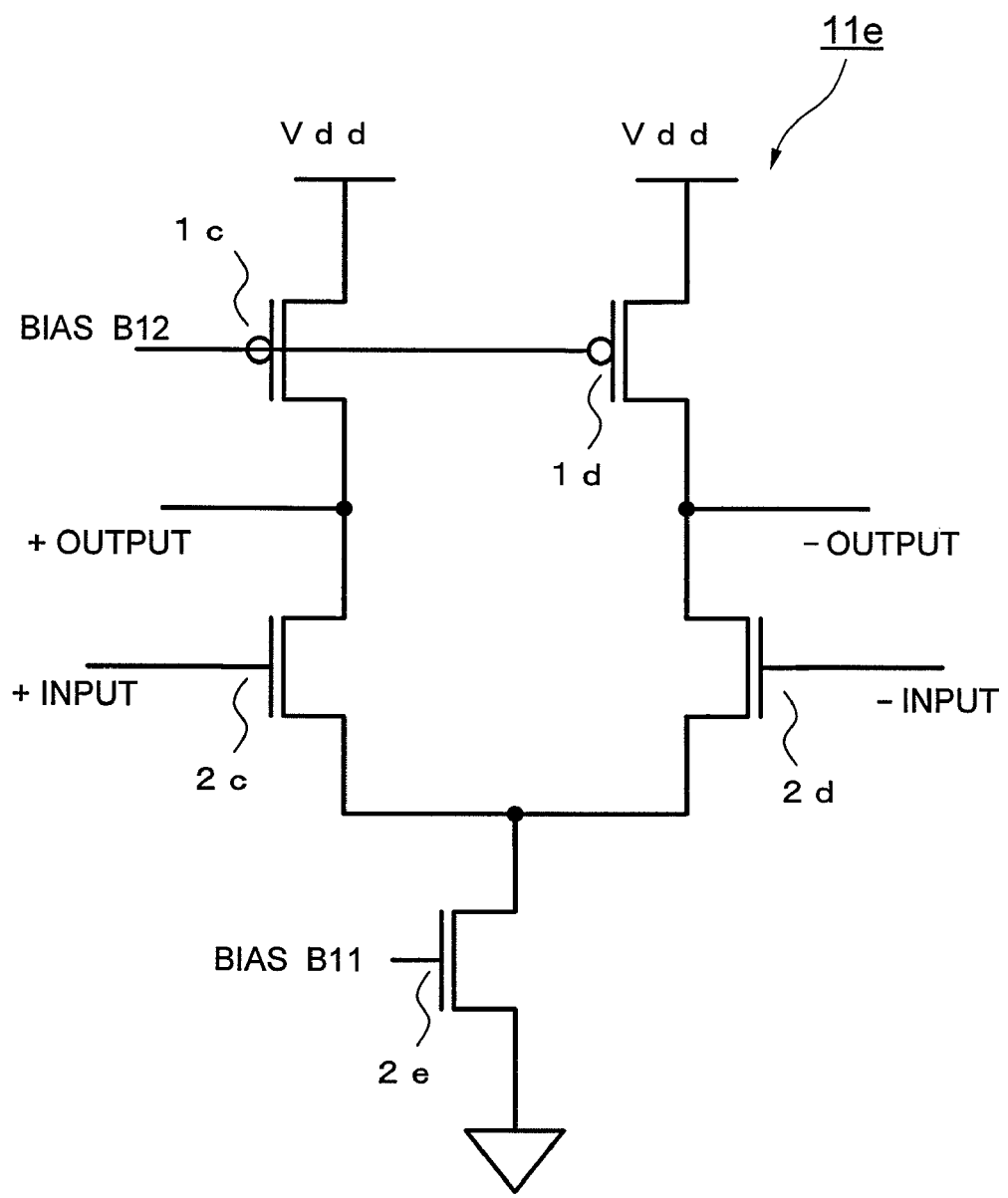
FIG. 8 is a circuit block diagram showing a fifth example of the delay generating part of the first exemplary embodiment.

FIG. 8 is a circuit block diagram showing a fifth example of the delay generating part according to this exemplary embodiment. Explanations will be provided hereinafter by mainly referring to FIG. 8.

A delay generating part 11e of this example is an element of differential inputs, and it is configured with a differential input pair, a resistive load, and a current source, for example. Sources of NMOS transistors 2c and 2d are connected to each other to configure the differential input pair. PMOS transistors 1c and 1d are connected, respectively, to the drains of the NMOS transistors 2c and 2d. Theses PMOS transistors 1c and 1d are operated in a linear region (triode region) to be used as a resistive load. Further, an NMOS transistor 2e functions as a current source.

When a plus input and a minus input are inputted to the two input terminals of the delay generating part 11e, a plus output and a minus output are outputted to the two output terminals. The delay amount τd in the delay generating part 11e is adjusted by the bias B12 that is applied to the PMOS transistors 1c, 1d used as the resistive loads, or by the bias B11 that is applied to the NMOS transistor 2e used as the current source. Further, it is possible to have a structure where the PMOS transistor and the NMOS transistor are switched with each other. Also, any other structure may be employed as long as it has a differential input pair.

Unlike the structures of the first to fourth examples described above, the amplitude of a signal becomes small with the delay generating part 11e since it uses differential signals. Thus, the power consumption can be reduced. Further, since the differential signals are used, influences of noise between a power line and a signal line of the ground and the like can be reduced. This makes it possible to suppress changes in the delay time caused due to the noise. Therefore, the voltage controlled oscillator using the delay generating part 11e has highly stable oscillation frequency.

Figure 9:
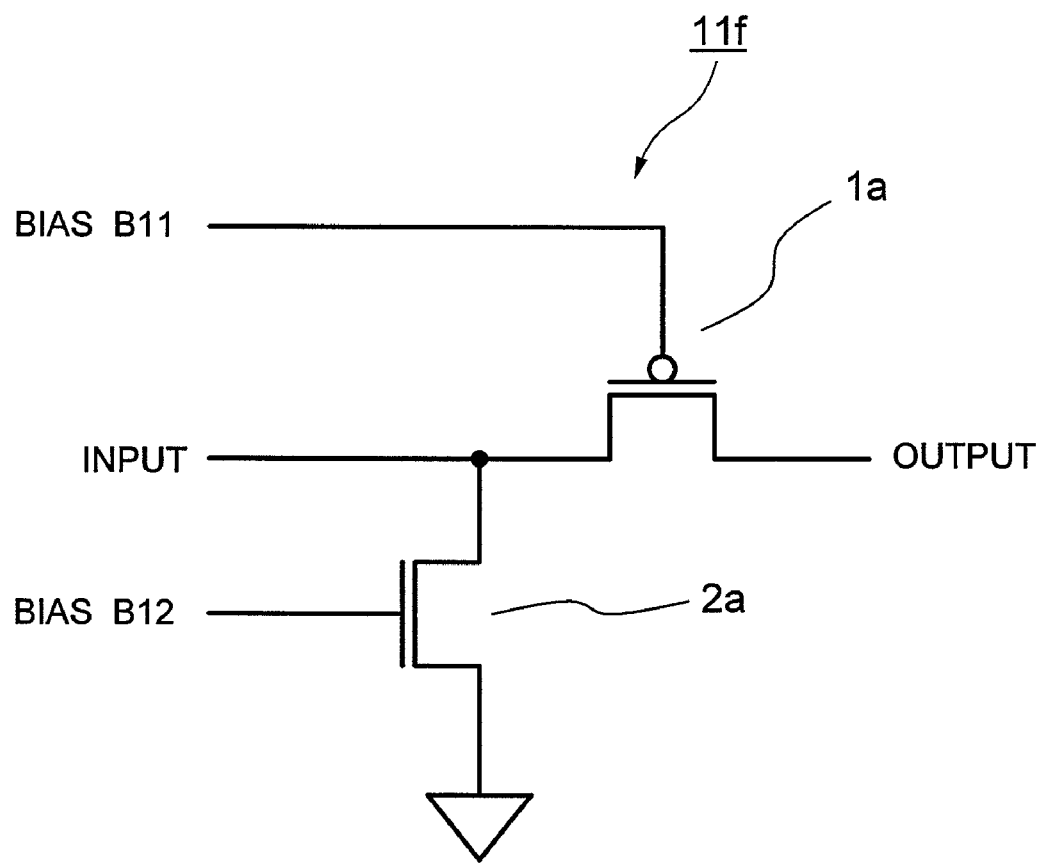
FIG. 9 is a circuit block diagram showing a sixth example of the delay generating part of the first exemplary embodiment.

FIG. 9 is a circuit block diagram showing a sixth example of the delay generating part according to this exemplary embodiment. Explanations will be provided hereinafter by mainly referring to FIG. 9.

A delay generating part 11f of this example is an element configured with two transistors. That is, the delay generating part 11f is configured with a PMOS transistor 1a inserted between signal transmission lines and an NMOS transistor 2a inserted between the signal transmission line and the low-voltage side power supply, for example. It is possible to control the delay amount τd by adjusting the biases (bias B11 and bias B12) applied to the gates of each transistor.

When a signal that changes by amplitude between the low-voltage side power supply and the high-voltage side power supply is inputted to the delay generating part 11f, there may be a case where the output of the delay generating part 11f becomes smaller than the amplitude between the low-voltage side power supply and the high-voltage side power supply. In that case, the inverter or the like configured with the PMOS transistor and the NMOS transistor may be connected at a latter stage of the output so as to recover the lower amplitude to the amplitude between low-voltage side power supply and the high-voltage side power supply. As another structure, it is possible to employ a structure that is configured with an NMOS transistor inserted between the signal transmission lines and a PMOS transistor inserted between the signal transmission line and the high-voltage side power supply.

Compared to the structures of the first to fifth example, it is possible with the delay generating part 11f to achieve a delay element that uses extremely small number of elements. Therefore, the layout area can be reduced. In addition, the cost can be lowered since the degraded manufactures can be reduced due to the reduction in the number of elements.

As an exemplary advantage according to the invention, the control signal from the delay adjusting circuit and the control signal from the temperature compensating circuit are synthesized and outputted to the delay generating part. Thus, the junction part between the delay control part and the delay generating part can be simplified. As a result, it is possible to provide, with a simple structure, the voltage controlled oscillator and the like whose center oscillation is stable even when there is a change in the temperature.

Second Exemplary Embodiment

Figure 10A:
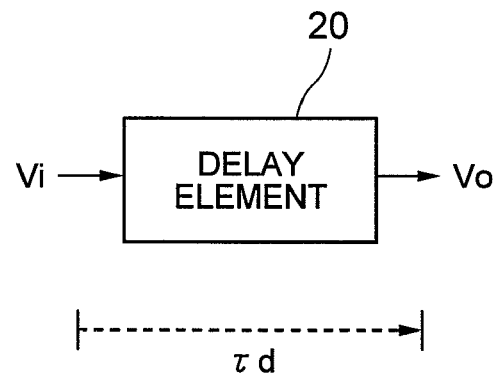
FIG. 10A shows a schematic view of the delay element.
Figure 10B:
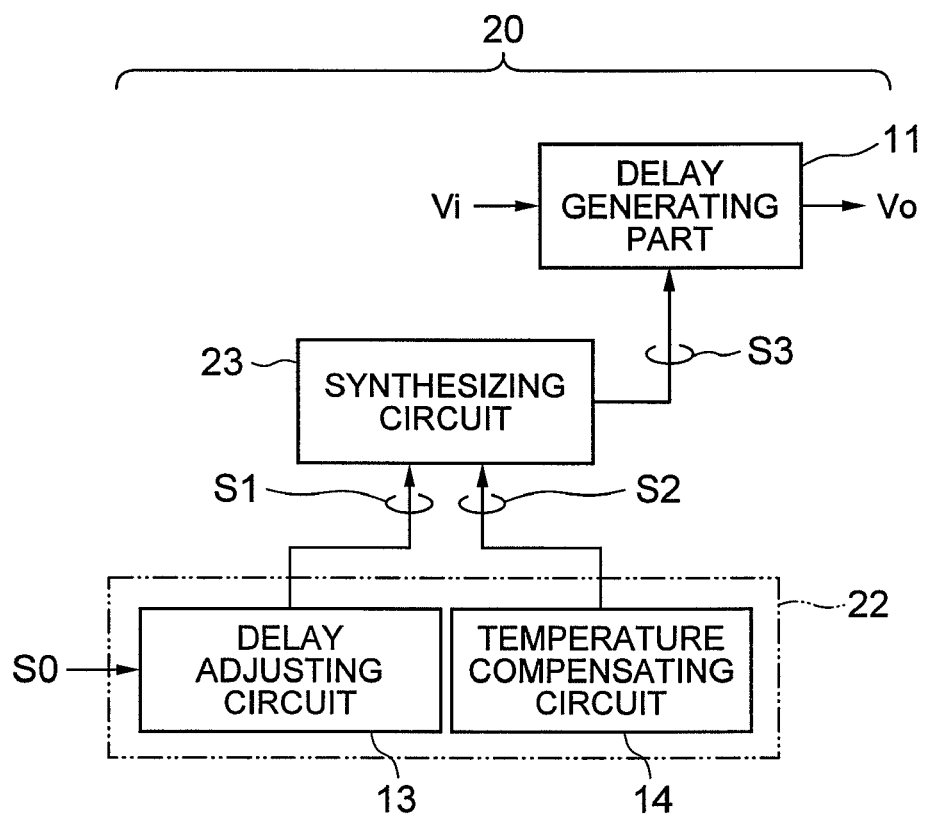
FIG. 10B shows details of the delay element.

FIGS. 10A and 10B show block diagrams of a delay element according to a second exemplary embodiment of the invention, in which FIG. 10A shows a schematic view of the delay element, and FIG. 10B shows details of the delay element. Explanations will be provided hereinafter by referring to the drawings.

A delay element 20 of this exemplary embodiment includes: a delay generating part 11 which adds a delay amount τd to an input signal Vi to generate an output signal; and a delay control part 22 which controls the delay amount τd. The delay control part 22 has a delay adjusting circuit 13 which outputs a control signal S1 as a first control signal for adjusting the delay amount τd, and has a temperature compensating circuit 14 which outputs a control signal S2 as a second control signal for compensating characteristic changes caused due to the temperature. The delay control part 22 outputs a control signal S3 as a third control signal obtained by synthesizing the control signal S1 and the control signal S2 to the delay generating part 11 so as to control the delay amount τd. The delay control part 22 obtains the control signal S3 by having the delay adjusting circuit 13 and the temperature compensating circuit 14 connected in parallel via a synthesizing circuit 23. A control signal S0 corresponds to a prescribed delay amount τd, and it is outputted to the delay adjusting circuit 13 from another circuit that is not shown.

The delay generating part 11, the delay adjusting circuit 13, and the temperature compensating circuit 14 are in the same structures as those of the first exemplary embodiment. Therefore, the structures shown in FIG. 3-FIG. 9 can also be used as the delay generating part 11 of this exemplary embodiment.

That is, the delay control part 22 for controlling the delay is configured by having the delay adjusting circuit 13 and the temperature compensating circuit 14 in a parallel relation connected to the synthesizing circuit 23. This will be described in detail hereinafter.

In addition to having the same delay generating part 11 as that of the delay element 10 shown in FIG. 1, the delay element 20 of this exemplary embodiment is configured with the delay control part 22 including the delay adjusting circuit 13 and the temperature compensating circuit 14, and with the synthesizing circuit 23. The delay adjusting circuit 13 and the temperature compensating circuit 14 are arranged in parallel to each other and connected to the synthesizing circuit 23. The control signal S3 as a delay control signal is outputted to the delay generating part 11 from the synthesizing circuit 23.

The functions of the delay adjusting circuit 13 and the temperature compensating circuit 14 can be synthesized by disposing those circuits in parallel and having those connected to the synthesizing circuit 23. That is, it is possible to generate the control signal S3 in which the function of adjusting the delay and the function of compensating the temperature characteristic are synthesized.

Particularly, when the main part configuring the delay adjusting circuit 13 and the temperature compensating circuit 14 is a voltage-current conversion element, it is possible to form the delay element 20 that can be adjusted with a voltage. The voltage-current conversion element outputs a current in accordance with an inputted voltage. In this exemplary embodiment, the delay adjusting circuit 13 and the temperature compensating circuit 14 are connected in parallel to the synthesizing circuit 23. Thus, the current can be outputted by without having one of the voltage-current conversion elements being affected by the other voltage-current conversion element, and the outputted currents are synthesized at the synthesizing circuit 23.

For example, when an applied voltage of the voltage-current conversion element within the temperature compensating circuit 14 is changed while the applied voltage of the voltage-current conversion element within the delay adjusting circuit 13 is set constant, the current outputted from the voltage-current conversion element within the temperature compensating circuit 14 becomes changed. However, there is no change in the current outputted from the voltage-current conversion element within the delay adjusting circuit 13 connected in parallel. Those two kinds of currents are synthesized at the synthesizing circuit 23. In this manner, the effects of the delay adjusting circuit 13 and the temperature compensating circuit 14 can be synthesized. The synthesized effect, i.e., the output currents from the voltage-current conversion elements, is added directly or indirectly to the delay generating part 11 as the control signal S3, and the delay amount τd is adjusted.

Figure 11:
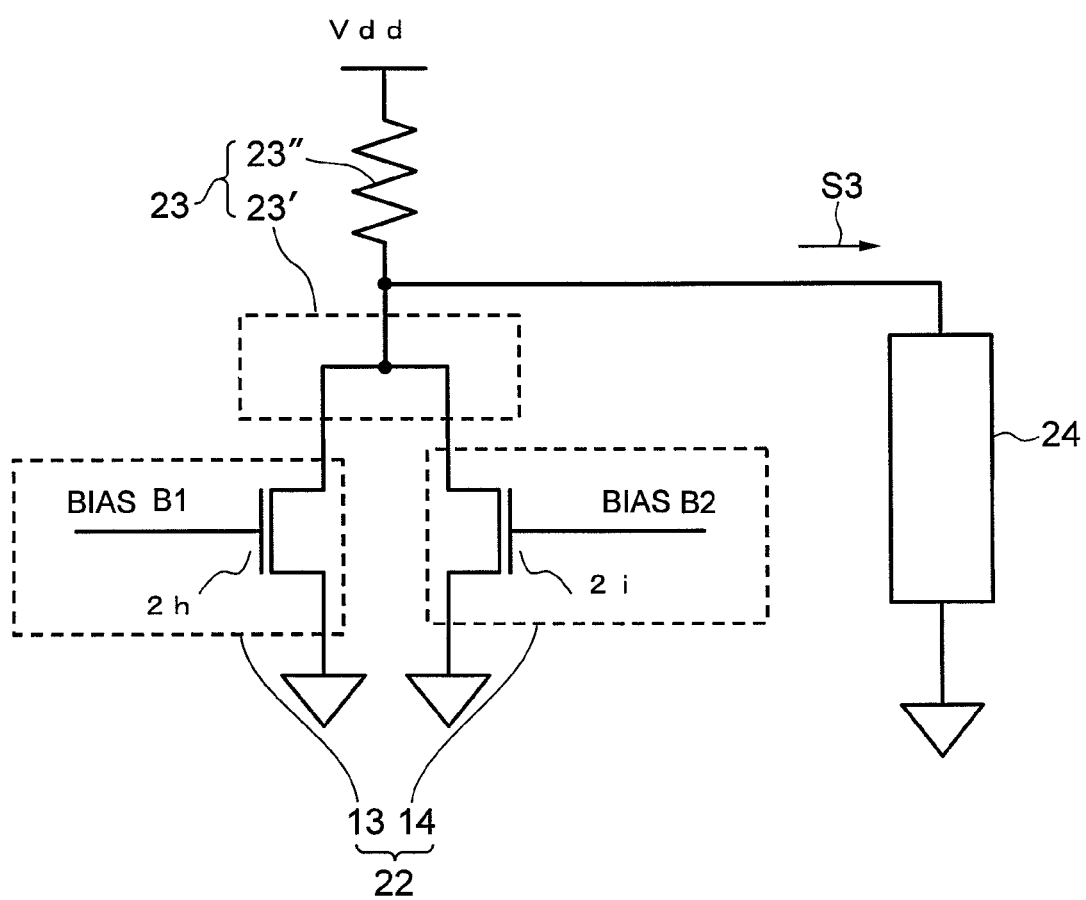
FIG. 11 is a circuit block diagram showing a first example of a delay control part and a synthesizing circuit of the second exemplary embodiment.

For example, the main parts of the delay adjusting circuit 13 and the temperature compensating circuit 14 may be formed including the voltage-current conversion elements, and the outputted current from the synthesizing circuit 23 can be current-voltage converted to be applied to the delay generating part 11 as a voltage bias. FIG. 11 shows an example of the delay control part 22 and the synthesizing circuit 23 in such structure.

FIG. 11 is a circuit block diagram showing a first example of the delay control part according to this exemplary embodiment. Explanations will be provided hereinafter by referring to FIG. 10 and FIG. 11.

The delay control part 22 has the delay adjusting circuit 13 and the temperature compensating circuit 14. The synthesizing circuit 23 has a synthesizing part 23' and a resistance 23". This is an example of an extremely simple circuit structure. In this example, each of the delay adjusting circuit 13 and the temperature compensating circuit 14 contains NMOS transistors 2h, 2i. Further, the synthesizing part 23' is formed with a wiring connected in T-letter shape. Furthermore, the resistance 23" configures a current-voltage conversion part.

With the structure of this example, the output current from the delay adjusting circuit 13 and the output current from the temperature compensating circuit 14 are synthesized at the synthesizing part 23' that is formed with the wiring. The synthesized current flows in the resistance 23" that functions as the current-voltage conversion part, so that the voltage outputted from the resistance 23" is changed. This makes it possible to obtain the voltage (i.e., the control signal S3) which is controlled by the delay adjusting circuit 13 and the temperature compensating circuit 14. The control signal S3 is outputted to another circuit 24 or the like.

The resistance 23" may be changed to a diode-connected transistor, an OP amplifier, or the like. Particularly, it is desired to use an OP amplifier, when the synthesized current value is a low current.

Third Exemplary Embodiment

Figure 12:
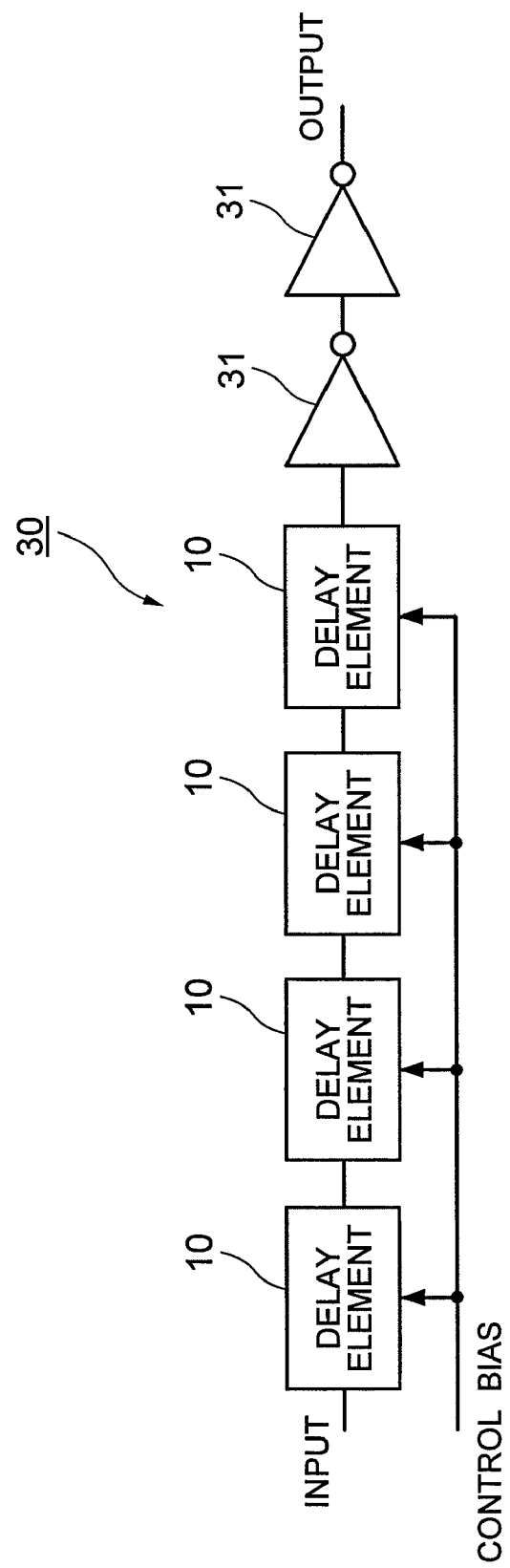
FIG. 12 is a block diagram showing a variable delay array according to a third exemplary embodiment.

FIG. 12 is a block diagram showing a variable delay array according to a third exemplary embodiment of the invention. Explanations will be provided hereinafter by referring to this drawing.

A variable delay array 30 of this exemplary embodiment is configured with a plurality of delay elements 10 of the first exemplary embodiment connected in series. Instead of the delay elements 10, the delay elements 20 (FIG. 10) of the second exemplary embodiment may also be used. Note here that the variable delay array is also called a variable delay line. That is, the third exemplary embodiment of the invention is the variable delay array 30 having the delay elements 10 connected in series. Two inverters 31 connected on the output side are used for shaping rise and fall of the waveform, and it is not essential to provide those inverters. The same control bias (i.e., the control signal S0 of FIG. 1) is applied to each of all the delay elements 10. However, individual control biases may also be applied. Further, while only one control bias is illustrated in the drawing, biases may be applied separately to the delay adjusting circuit 13 and the temperature compensating circuit 14 shown in FIG. 1.

When the delay is controlled by the voltage, the variable delay array 30 may also be called a voltage-controlled type delay line. It is possible to change the delay amount of the output signal with respect to the input signal by changing the voltage used for control. In a case where the output is also taken out from junctions between the plurality of delay elements 10 connected in series, it is possible to obtain a plurality of outputs with different delay amounts. For the plurality of outputs with the different delay amounts, it is possible to change the delay amounts at once by changing the voltage used for control. For example, when the delay amount by the delay element 10 under a certain control voltage is Y, the output after the two connected delay elements 10 is "2Y", and the output after the four connected delay elements 10 is "4Y". In a case where the delay amount becomes "Y+ΔY", the output after the two connected delay elements 10 is "2×(Y+ΔY)", and the output after the four connected delay elements 10 is "4×(Y+ΔY)".

Fourth Exemplary Embodiment

Figure 13:
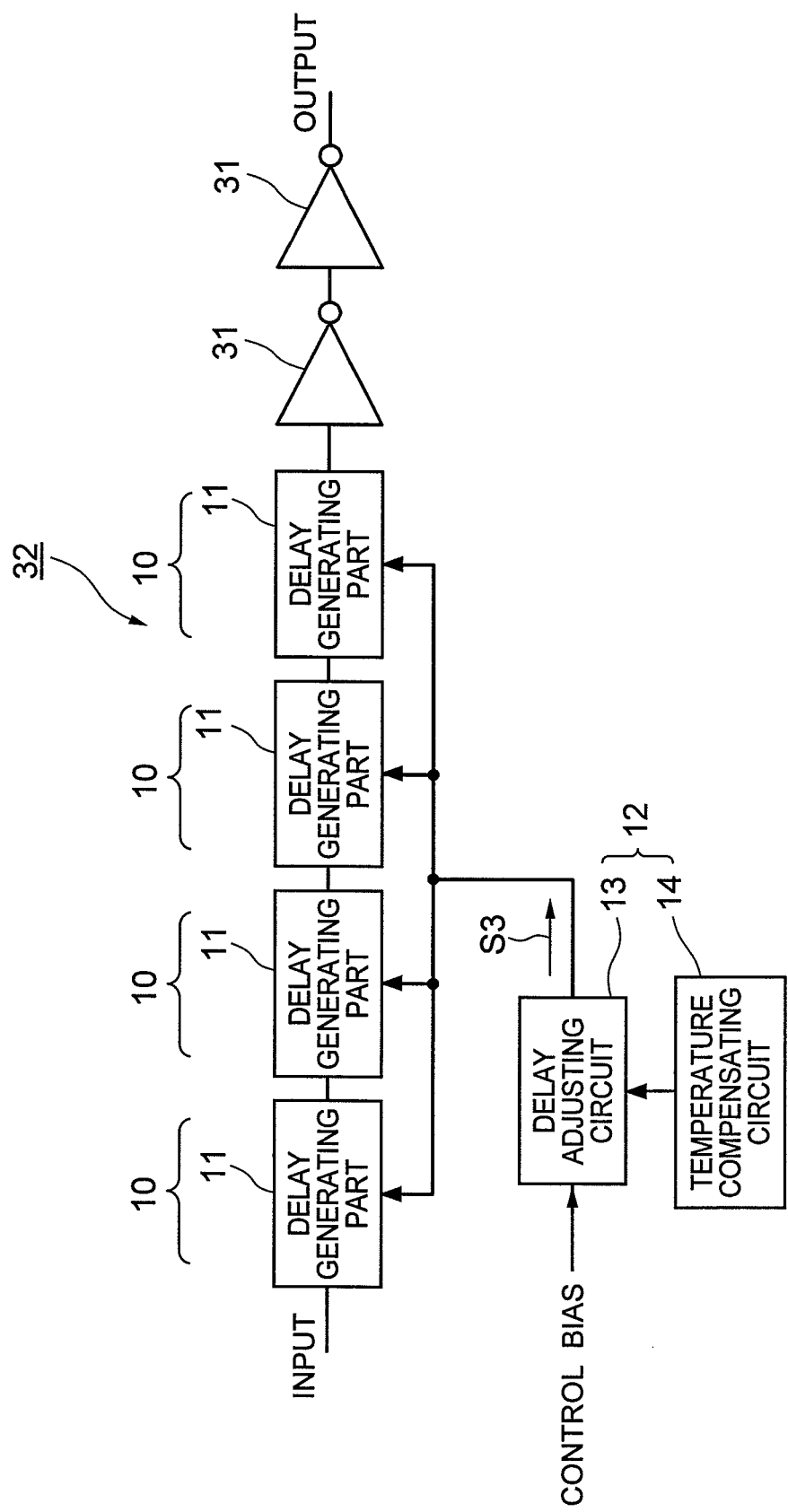
FIG. 13 is a block diagram showing a variable delay array according to a fourth exemplary embodiment.

FIG. 13 is a block diagram showing a variable delay array according to a fourth exemplary embodiment of the invention. Explanations will be provided hereinafter by referring to this drawing.

A variable delay array 32 of this exemplary embodiment is configured with a plurality of delay elements 10 of the first exemplary embodiment connected in series. However, the delay elements 10 include a single delay control part 12 used in common for each of the delay elements 10. The delay control part 12 controls the respective delay amounts by outputting the control signal S3 to each of the delay generating parts 11 provided to the respective delay elements 10. That is, the fourth exemplary embodiment is the variable delay array 32 that is configured by connecting the plurality of delay-controllable delay generating parts 11 in series and by connecting the delay adjusting circuit 13 and the temperature compensating circuit 14 in series for the delay control part 12.

As in the case of the third exemplary embodiment shown in FIG. 12, two inverters 31 connected on the output side are used for shaping rise and fall of the waveform, and it is not essential to provide those inverters. The control signal S3 is applied to each of all the delay generating parts 11 from the circuit in which the delay adjusting circuit 13 and the temperature compensating circuit 14 are connected in series. In other words, in the fourth exemplary embodiment, a plurality of only the delay generating parts 11 of the first exemplary embodiment are connected in series, and the same delay adjusting circuit 13 and the temperature compensating circuit 14 are used in common for all the delay generating parts 11.

Fifth Exemplary Embodiment

Figure 14:
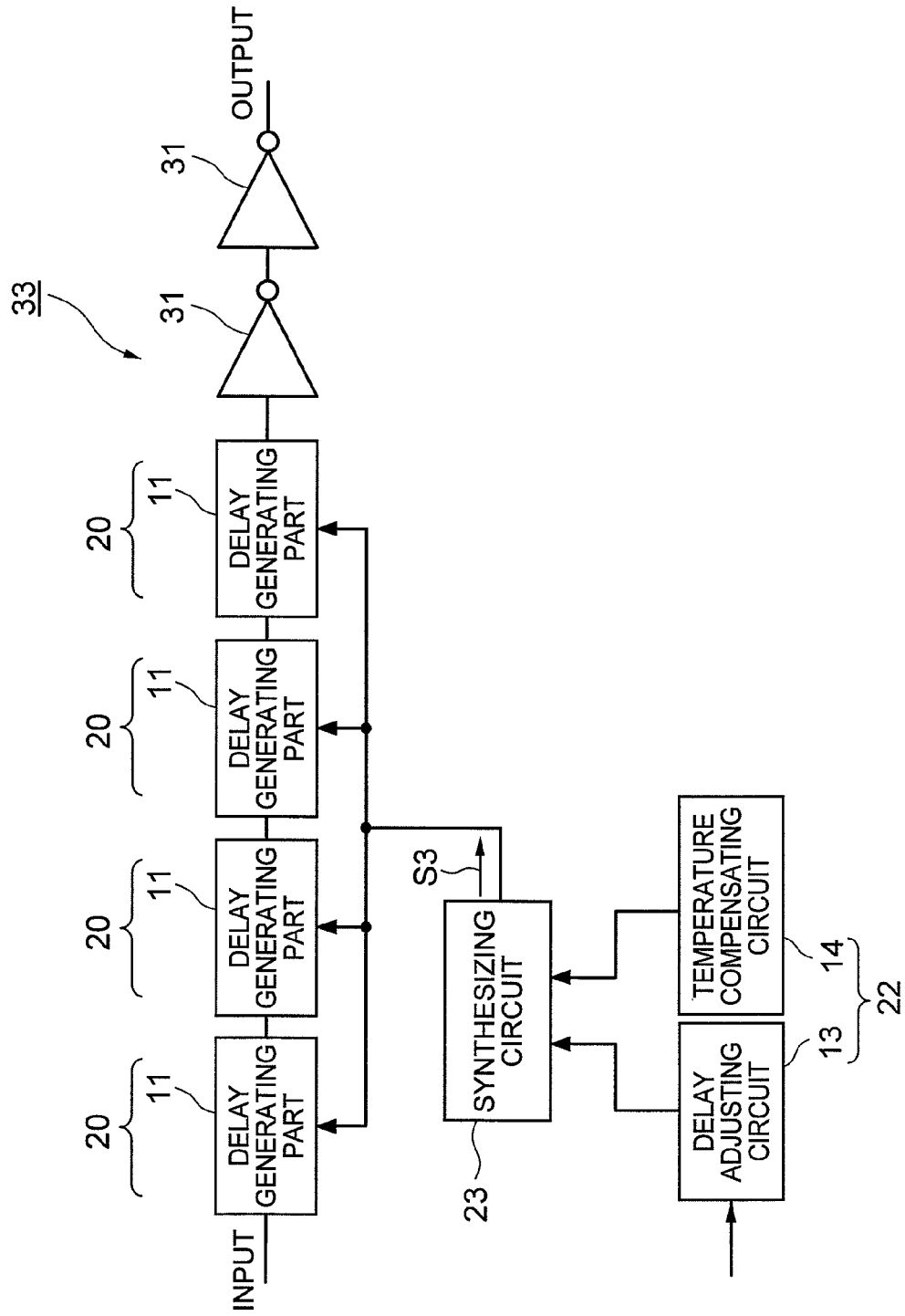
FIG. 14 is a block diagram showing a variable delay array according to a fifth exemplary embodiment.

FIG. 14 is a block diagram showing a variable delay array according to a fifth exemplary embodiment of the invention. Explanations will be provided hereinafter by referring to this drawing.

A variable delay array 33 of this exemplary embodiment is configured with a plurality of delay elements 20 of the second exemplary embodiment connected in series. However, the delay elements 20 include a single delay control part 22 used in common for each of the delay elements 20. The delay control part 22 controls the respective delay amounts by outputting the control signal S3 via the synthesizing circuit 23 to each of the delay generating parts 11 provided to the respective delay elements 20. That is, unlike the case of the fourth exemplary embodiment, the fifth exemplary embodiment is the variable delay array 33 that is configured in such a manner that the delay control part 22 having the delay adjusting circuit 13 and the temperature compensating circuit 14 disposed in parallel is connected to the synthesizing circuit 23.

As in the case of the third exemplary embodiment shown in FIG. 12, two inverters 31 connected on the output side are used for shaping rise and fall of the waveform, and it is not essential to provide those inverters. The control signal S3 is applied to each of all the delay generating part 11 from the synthesizing circuit 23 to which the delay adjusting circuit 13 and the temperature compensating circuit 14 are connected in parallel. In other words, in the fifth exemplary embodiment, a plurality of only the delay generating parts 11 of the second exemplary embodiment are connected in series, and the same delay adjusting circuit 13, the temperature compensating circuit 14, and the synthesizing circuit 23 are used in common for all the delay generating parts 11.

Sixth Exemplary Embodiment

Figure 15:
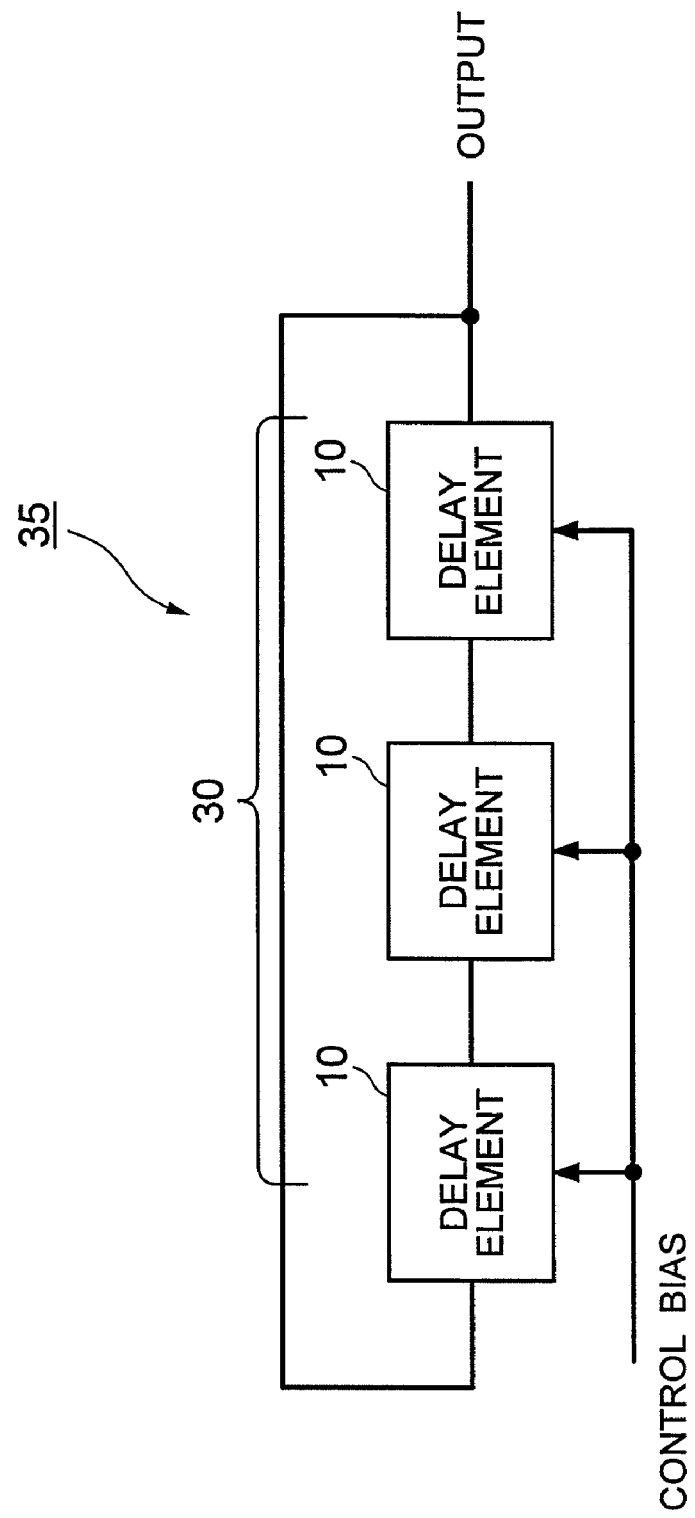
FIG. 15 is a block diagram showing a voltage controlled oscillator according to a sixth exemplary embodiment.
Figure 16:
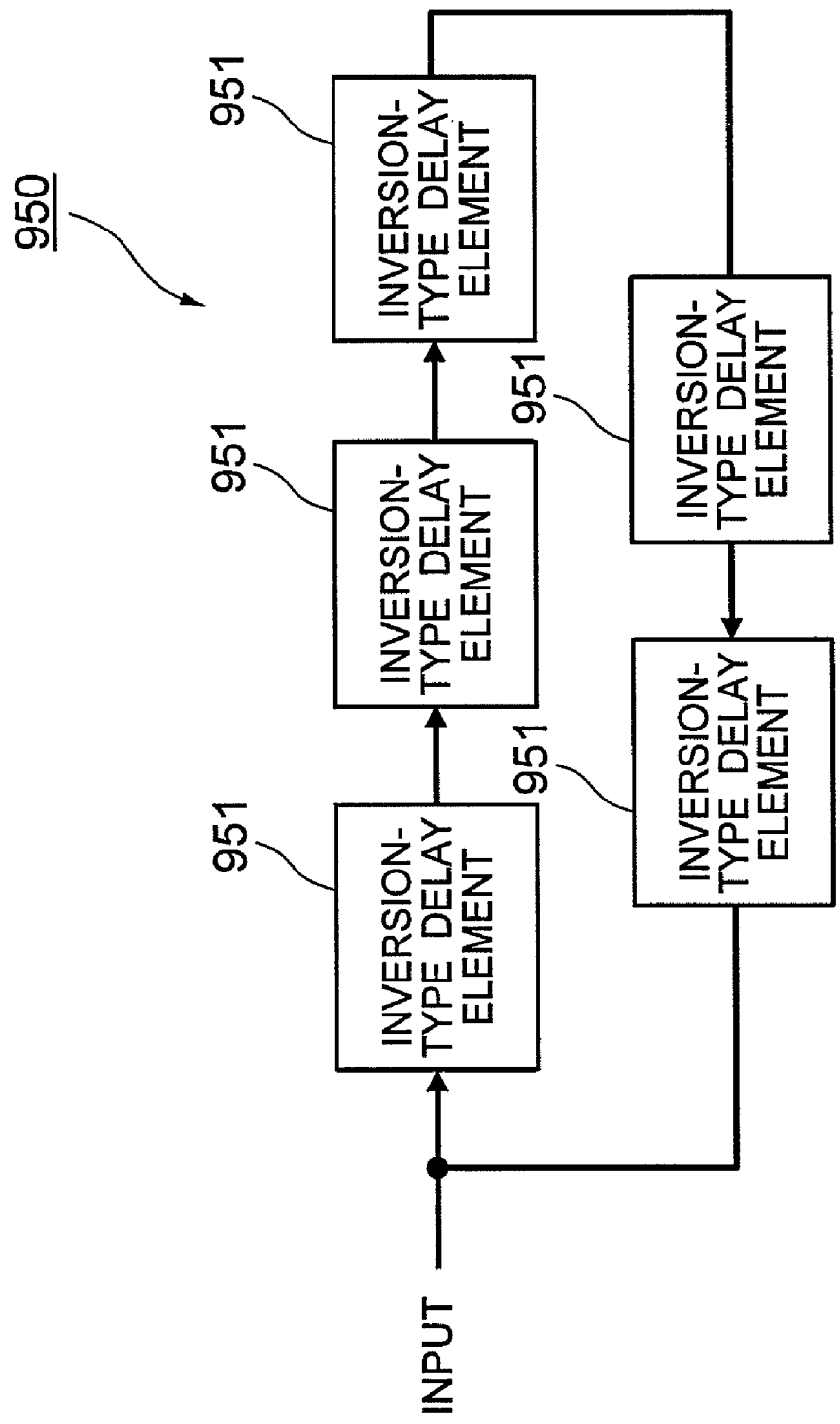
FIG. 16 is a block diagram showing an oscillator related to the sixth exemplary embodiment.

FIG. 15 is a block diagram showing a voltage controlled oscillator (VCO) according to a sixth exemplary embodiment of the invention. FIG. 16 is a block diagram showing an oscillator related to the sixth exemplary embodiment of the invention. Explanations will be provided hereinafter by referring to the drawings.

A voltage controlled oscillator 35 of this exemplary embodiment is configured with the variable delay array 30 of the third exemplary embodiment which includes a closed loop in which the output terminal of one of the plurality of delay elements 10 is connected to the input terminal of one of the delay elements in a latter stage of that delay element. In this exemplary embodiment, the output terminal of the delay element 10 of the last stage among the plurality of delay elements 10 is connected to the input terminal of the delay element 10 of the first stage. Instead of the delay elements 10 of the first exemplary embodiment, it is also possible to use the delay elements 20 of the second exemplary embodiment.

In other words, the sixth exemplary embodiment of the invention is the voltage controlled oscillator 35 in which the plurality of delay elements 10 are connected in series n such a manner to form a closed loop. As shown in FIG. 16, an oscillator 950 can be achieved by forming a closed loop by using an odd-number of inversion-type delay elements 951. Instead of using the inversion-type delay elements 951, the delay elements 10 capable of adjusting the delay amount may be used to achieve the voltage controlled oscillator 35.

In this exemplary embodiment, three delay elements 10 are connected in series in such a manner to form a closed loop. The control bias is supplied to each of the delay elements 10 from outside. It is possible to take out a signal of the frequency corresponding to the structure of the closed loop from the output. The frequency of the output signal can be changed by the control bias.

A method of connections within the closed loop in this exemplary embodiment varies depending on the structure of the delay element to be used, particularly the structure of the delay generating part within the delay element. Some of the cases will be described hereinafter by referring to the drawings.

Figure 17:
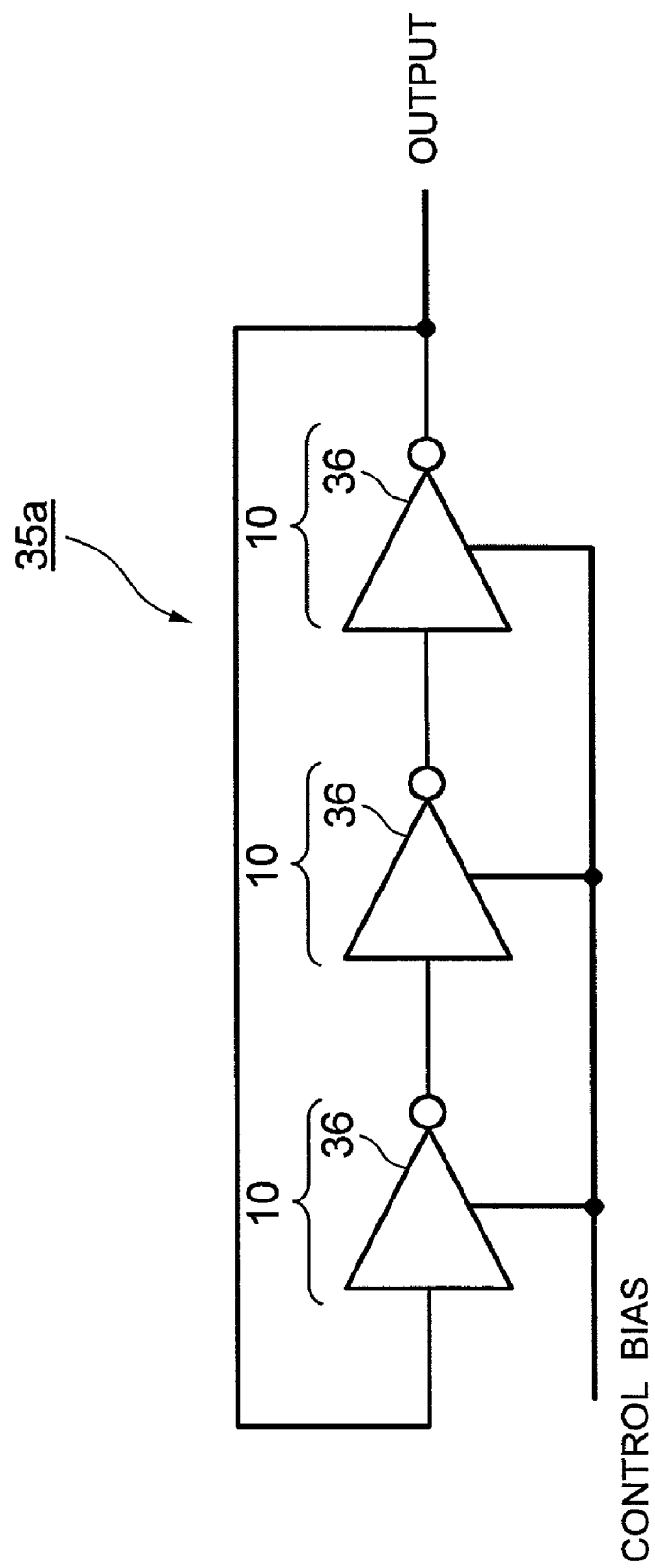
FIG. 17 is a circuit block diagram showing a first example of the voltage controlled oscillator according to the sixth exemplary embodiment.

First, described is a case where the delay generating part uses an inversion element such as an inverter as the basic structure. That is, it is the case of using the delay generating part shown in FIG. 3-FIG. 7. Here, the voltage controlled delay element using the delay generating part that contains those inverter circuits as the basic structure is called a voltage-controlled type inversion element. FIG. 17 is a circuit block diagram showing a first example of the sixth exemplary embodiment according to the invention. Explanations will be provided hereinafter by referring to the drawing.

A voltage controlled oscillator 35a of this example forms the closed loop by using voltage-controlled type inversion elements 36 as the delay elements 10. The voltage-controlled type inversion element 36 is illustrated as an inverter that has one terminal for applying a bias to control the delay amount. In the closed loop using the voltage-controlled type inversion elements 36, both ends of odd-numbered and serially connected voltage-controlled type inversion elements 36 (that is, the delay generating parts) are connected to form the closed loop. The odd-numbered connected voltage-controlled type inversion elements 36 cannot keep the logically stable state, so that those elements oscillate with the frequency depending on the structure and the like of the circuit.

Figure 18:
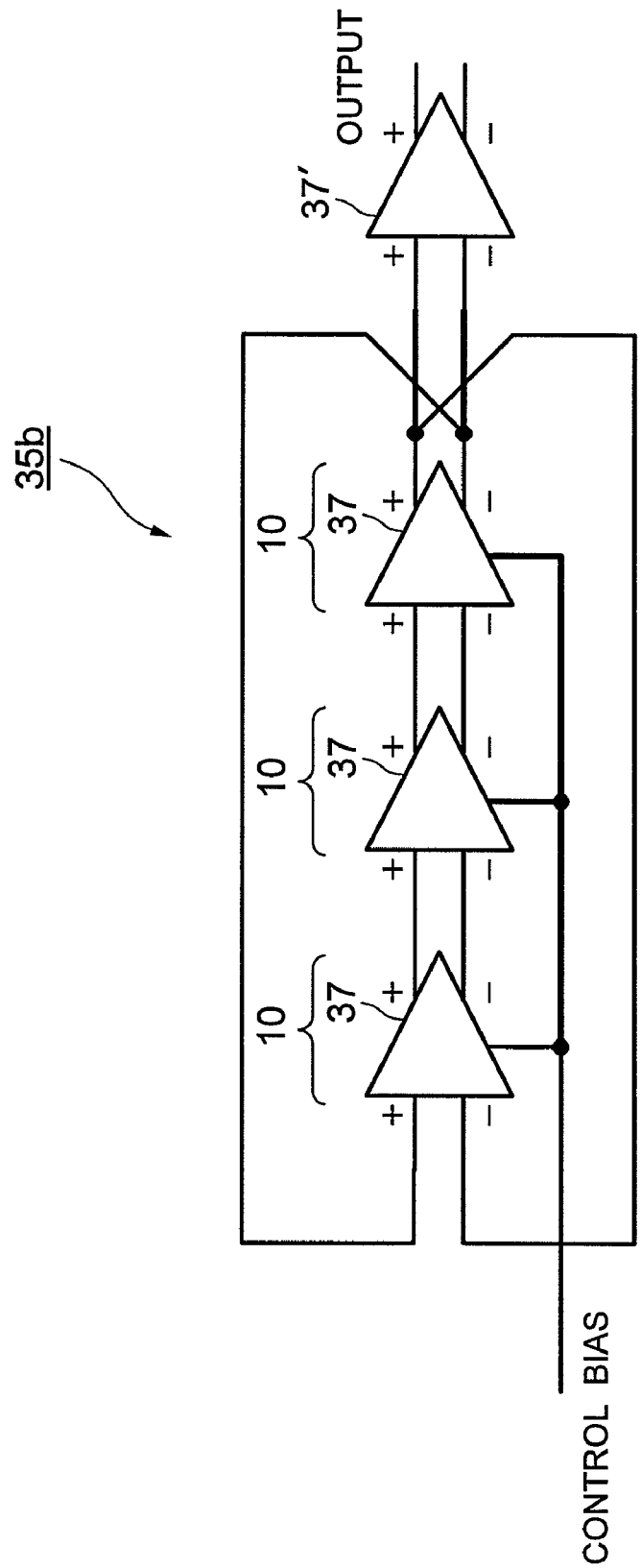
FIG. 18 is a circuit block diagram showing a second example of the voltage controlled oscillator according to the sixth exemplary embodiment.

Next, described is a case where the delay generating part has differential inputs. That is, it is a case where the delay generating part as in FIG. 8 is used. FIG. 18 is a circuit block diagram showing a second example of the sixth exemplary embodiment of the invention. Explanations will be provided hereinafter by referring to the drawing.

A voltage controlled oscillator 35b of this example forms a closed loop by using a differential-input type delay element 37 as the delay element 10. The differential-input type delay element 37 has two inputs (inverted (−) input and non-inverted (+) input) and two outputs (inverted (−) output and non-inverted (+) output). Further, the differential-input type delay element 37 has a delay control part for adjusting the delay amount. In this example, an odd-number of differential-input type delay elements 37 are used to form the closed loop. However, the differential-input type delay element 37 has two terminals (inverted and non-inverted terminals), so that it is possible to achieve the oscillation actions even if there are an even-number of elements through connecting the inverted output of the last stage to the non-inverted input of the first stage and connecting the non-inverted output of the last stage to the inverted input of the first stage. In this example, a differential-input type delay element 37' having no function of adjusting the delay amount is connected at the last stage for taking out the output.

Figure 19:
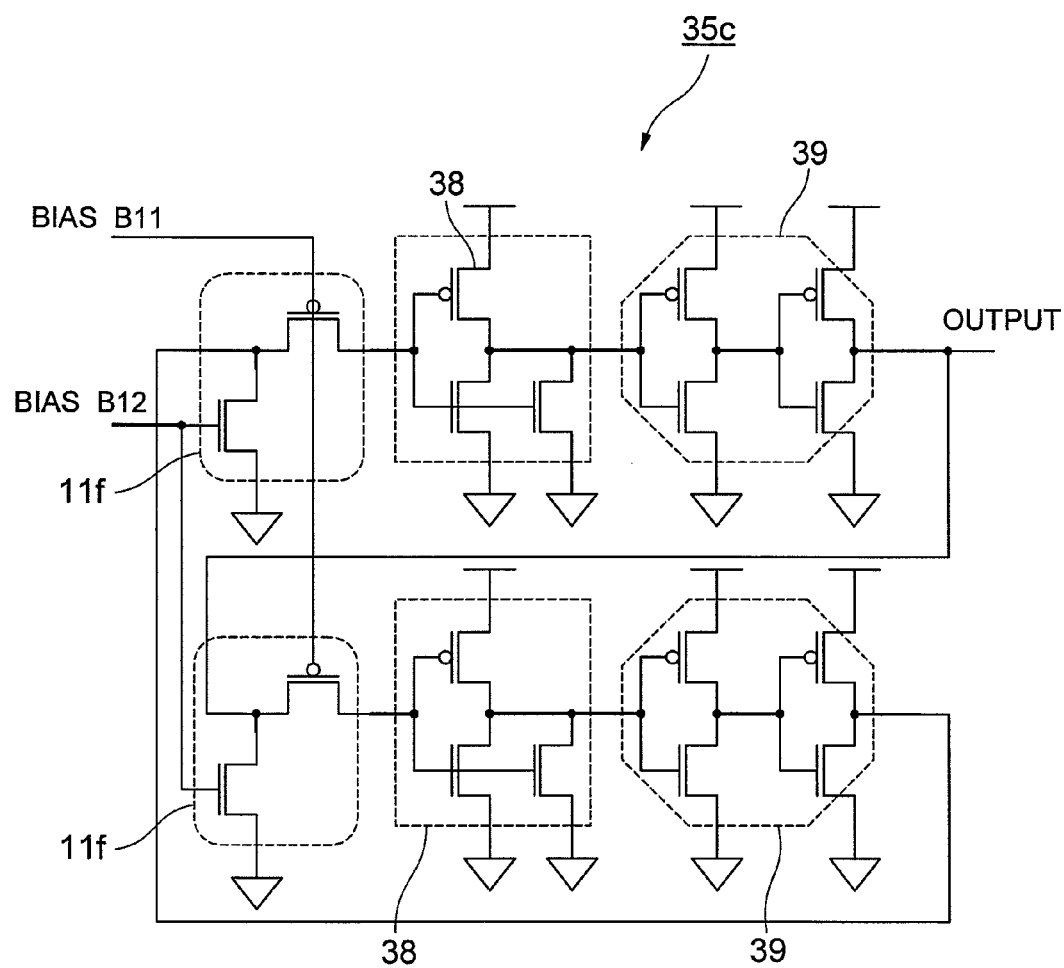
FIG. 19 is a circuit block diagram showing a third example of the voltage controlled oscillator according to the sixth exemplary embodiment.

At last, described is a case where the delay generating part is configured with two transistors as in FIG. 9. In this case, the structure becomes little complicated compared to the cases of FIG. 17 and FIG. 18. FIG. 19 is a circuit block diagram showing a third example of the sixth exemplary embodiment according to the invention. Explanation will be provided hereinafter by referring to the drawing.

A voltage controlled oscillator 35c of this example forms a closed loop by using a delay generating part 11f that is configured with two transistors as in the case of FIG. 9. That is, the voltage controlled oscillator 35c of this example uses two delay elements each having the delay generating part 11f that is configured with the two transistors. Three inverters each are connected to the latter stages of those delay generating parts 11f. The three inverters include a single inverter 38 with a low threshold value and two inverters 39 with a normal threshold value.

The use of the inverter 38 with the low threshold value makes it possible to prevent a rise edge of a signal from being dependent largely upon the bias B11 and the bias B12. The two inverters 39 with the normal threshold value at the latter stage are used for shaping the waveform and for aligning the polarities of the signals.

Such configuration with the delay generating part 11f and the inverters 38, 39 is taken as one unit. The voltage controlled oscillator 35c is formed by using two units. The output of the first unit is inputted to the second unit, and the output of the second unit is inputted to the first unit. This makes it possible to form the voltage controlled oscillator 35c capable of adjusting the delay amount in both directions (rise and fall). That is, with this example, the single delay element has an extremely simple structure. However, it is necessary to provide inverters of different threshold values in the peripheral part.

Seventh Exemplary Embodiment

Figure 20:
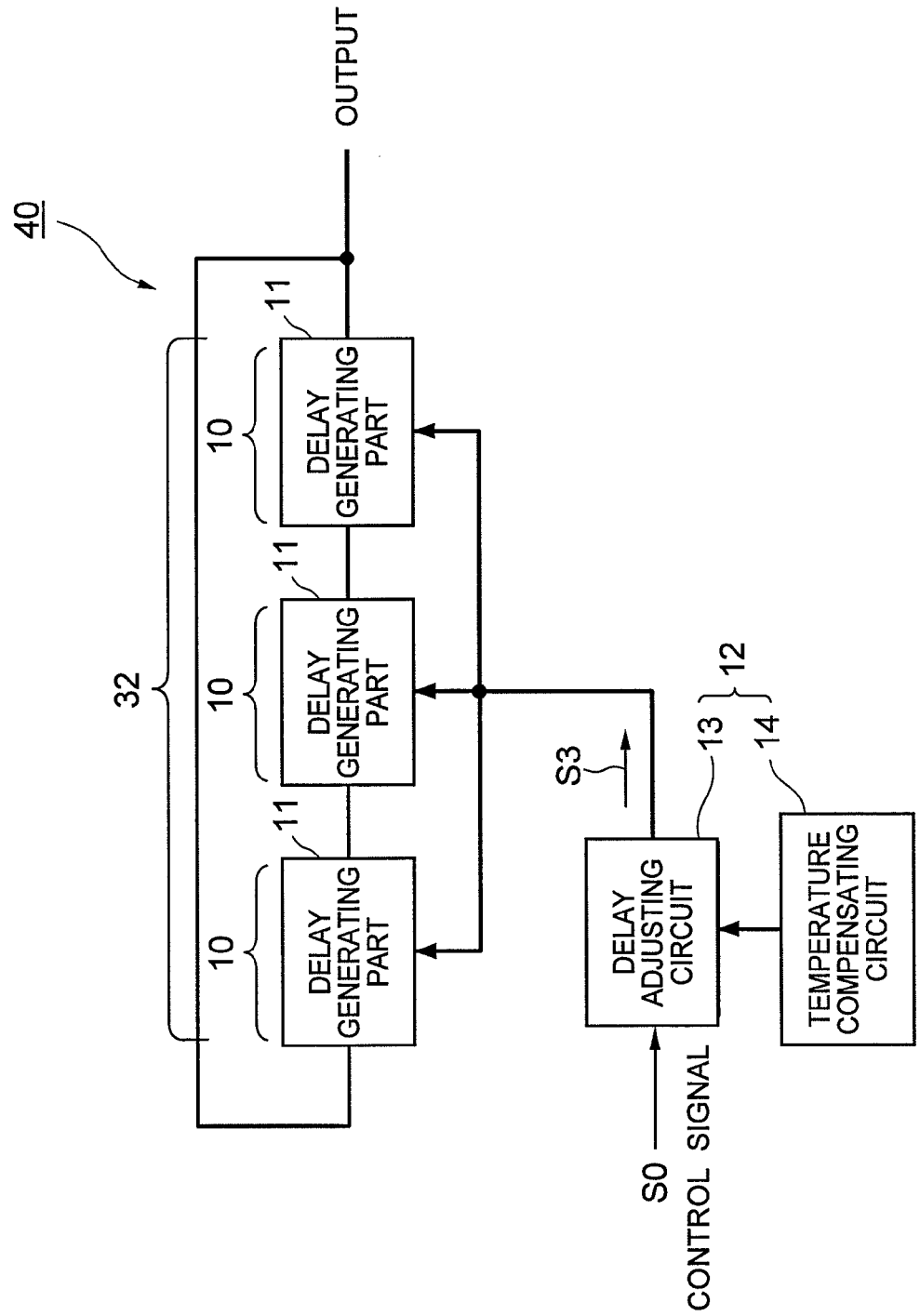
FIG. 20 is a block diagram showing a voltage controlled oscillator according to a seventh exemplary embodiment.

FIG. 20 is a block diagram showing a voltage controlled oscillator according to a seventh exemplary embodiment of the invention. Explanations will be provided hereinafter by referring to this drawing.

A voltage controlled oscillator 40 of this exemplary embodiment is configured with the variable delay array 32 of the fourth exemplary embodiment which includes a closed loop in which the output terminal of one of the plurality of delay elements 10 is connected to the input terminal of one of the delay elements in a latter stage of that delay element. In this exemplary embodiment, the output terminal of the delay element 10 of the last stage among the plurality of delay elements 10 is connected to the input terminal of the delay element 10 of the first stage.

However, the delay elements 10 include a single delay control part 12 used in common for each of the delay elements 10. The delay control part 12 controls the respective delay amounts by outputting the control signal S3 to each of the delay generating parts 11 provided to the respective delay elements 10.

In other words, the seventh exemplary embodiment of the invention is the voltage controlled oscillator 40 in which the plurality of delay elements 10 having the delay generating part 11 and being capable of controlling the delay from outside are connected in series in such a manner to form a closed loop. The voltage controlled oscillator 40 is configured to have the delay control part 12 capable of controlling the delay from outside, which has the delay adjusting circuit 13 and the temperature compensating circuit 14 connected in series. It is a feature of the voltage controlled oscillator 40 to transmit the control signal S3 to all the delay elements 11 from a single control part.

That is, a plurality of delay generating parts 11 are connected in series in such a manner to form a closed loop. The control signal S3 as the control bias is applied to all the delay generating parts 11 from the circuit in which the delay adjusting circuit 13 and the temperature compensating circuit 14 are connected in series. As described, the seventh exemplary embodiment is structured to have a plurality of only the delay generating parts 11 of the first exemplary embodiment connected in series to form the closed loop, and to use the same delay adjusting circuit 13 and the temperature compensating circuit 14 in common for all the delay generating parts 11. With this structure, the circuit in which the delay adjusting circuit 13 and the temperature compensating circuit 14 are connected in series works for all the delay generating parts 11.

Eighth Exemplary Embodiment

Figure 21:
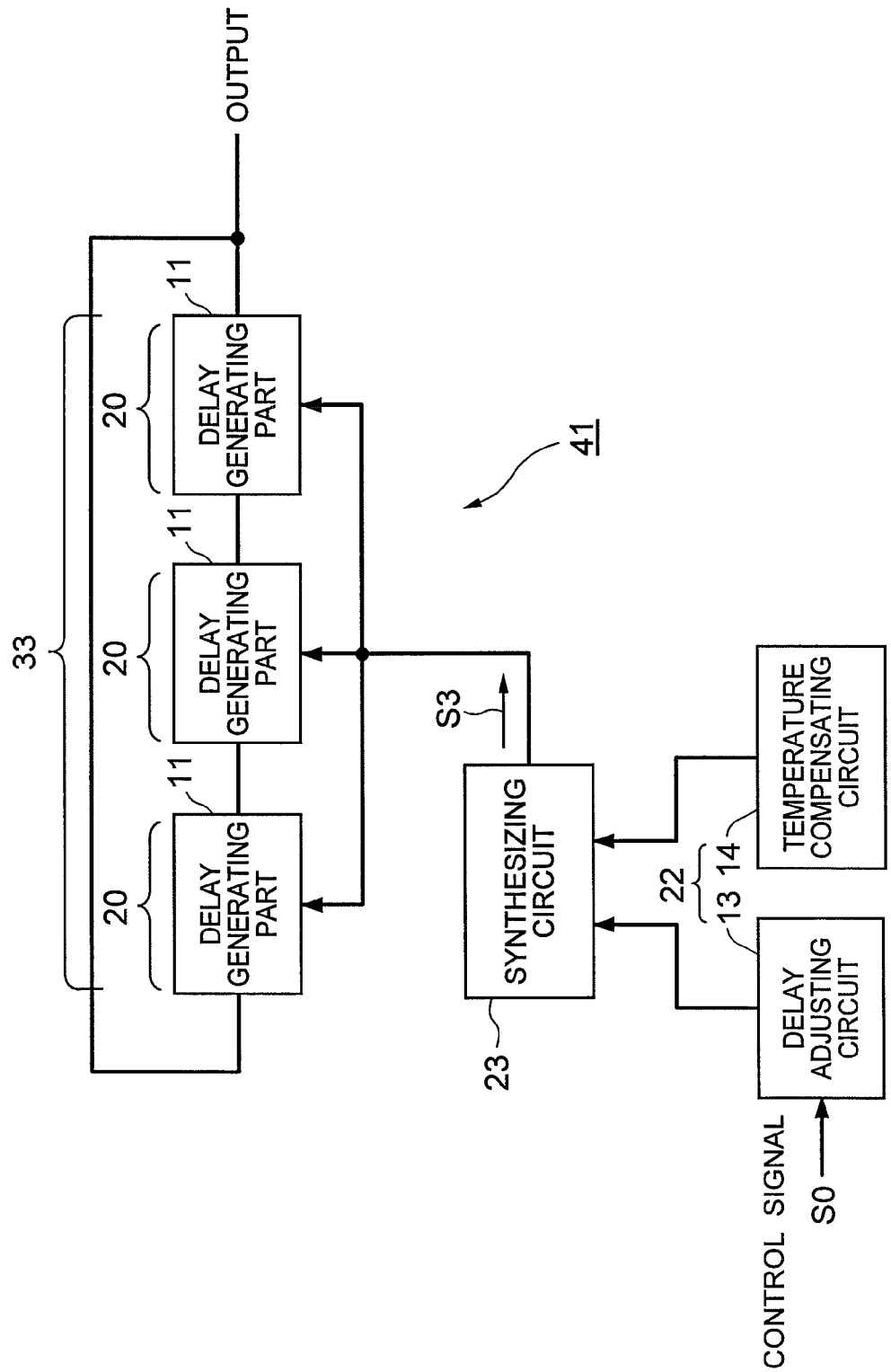
FIG. 21 is a block diagram showing a voltage controlled oscillator according to an eighth exemplary embodiment.

FIG. 21 is a block diagram showing a voltage controlled oscillator according to an eighth exemplary embodiment of the invention. Explanations will be provided hereinafter by referring to this drawing.

A voltage controlled oscillator 41 of this exemplary embodiment is configured with the variable delay array 33 of the fifth exemplary embodiment which includes a closed loop in which the output terminal of one of the plurality of delay elements 20 is connected to the input terminal of one of the delay elements in a latter stage of that delay element. In this exemplary embodiment, the output terminal of the delay element 20 of the last stage among the plurality of delay elements 20 is connected to the input terminal of the delay element 20 of the first stage.

However, the delay elements 20 include a single delay control part 22 used in common for each of the delay elements 20. The delay control part 22 controls the respective delay amounts by outputting the control signal S3 to each of the delay generating parts 11 provided to the respective delay elements 20 via a synthesizing circuit 23.

In other words, the voltage controlled oscillator 41 of the eighth exemplary embodiment of the invention is different from the voltage controlled oscillator 40 (FIG. 20) of the seventh exemplary embodiment in respect that the delay adjusting circuit 13 and the temperature compensating circuit 14 are connected in parallel to the synthesizing circuit 23. In the eighth exemplary embodiment, a plurality of the delay generating parts 11 are connected in series in such a manner to form the closed loop. The control signal S3 as the control bias is applied to each of all the delay generating parts 11 from the synthesizing circuit 23 to which the delay adjusting circuit 13 and the temperature compensating circuit 14 are connected in parallel.

As described, the eighth exemplary embodiment of the invention is structured to have only the delay generating parts 11 of the second exemplary embodiment connected in series to form the closed loop, and to use the same delay adjusting circuit 13, the temperature compensating circuit 14, and the synthesizing circuit 23 in common for all the delay generating parts 11. With this structure, the circuit to which the delay adjusting circuit 13 and the temperature compensating circuit 14 are connected in series works for all the delay generating parts 11.

Figure 22:
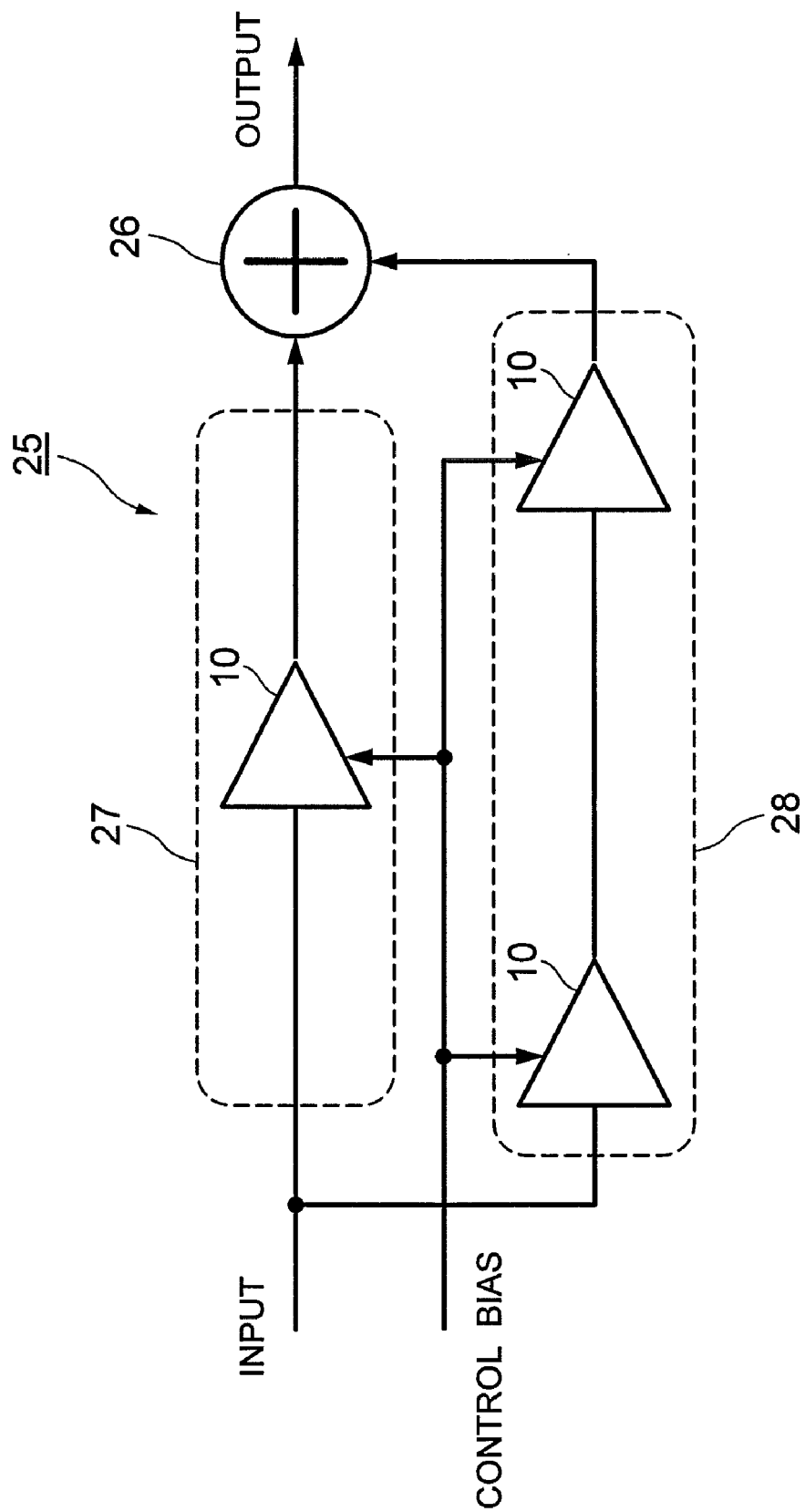
FIG. 22 is a circuit block diagram showing another example of the delay elements according to each of the exemplary embodiments.

In each of the above-described exemplary embodiments, it is also possible to use delay-amount interpolation type delay elements instead of using the delay elements 10 and 20. FIG. 22 is a circuit block diagram showing another example of the delay elements described in each of the exemplary embodiments.

A delay-amount interpolation type delay element 25 of this example includes a plurality of delay elements 10 of the first exemplary embodiment and an adder 26. In this example, two delay paths are formed (i.e., a path 27 with a small delay amount configured with a single delay element 10, and a path 28 of a large delay amount configured with two delay elements 10). The delay amount can be adjusted in a delicate manner through synthesizing the signals of the two paths having different delay amounts by the adder 26, for example, and interpolating the delay amounts with each other. The delay amounts of the delay elements 10 are adjusted by the control bias form the outside, so that the delay amounts can be adjusted delicately over an extremely wide range. It is also possible to use the delay element 20 (FIG. 10) of the second exemplary embodiment instead of using the delay element 10 of the first exemplary embodiment.

Ninth Exemplary Embodiment

In a voltage controlled oscillator according to a ninth exemplary embodiment of the invention, a part of or all the transistors contained at least in the delay adjusting circuit or the temperature compensating circuit of each of the above-described exemplary embodiments is a multi-gate type transistor. That is, this exemplary embodiment uses a multi-gate type transistor having a plurality of gate electrodes. The multi-gate type transistor as a circuit is equivalent to a structure in which a plurality of transistors having a plurality of gates are connected in series, and the gates thereof are connected to each other. With the use of the multi-gate transistors, it is possible to obtain a fine characteristic even when the source-drain voltage is increased.

Figure 23:
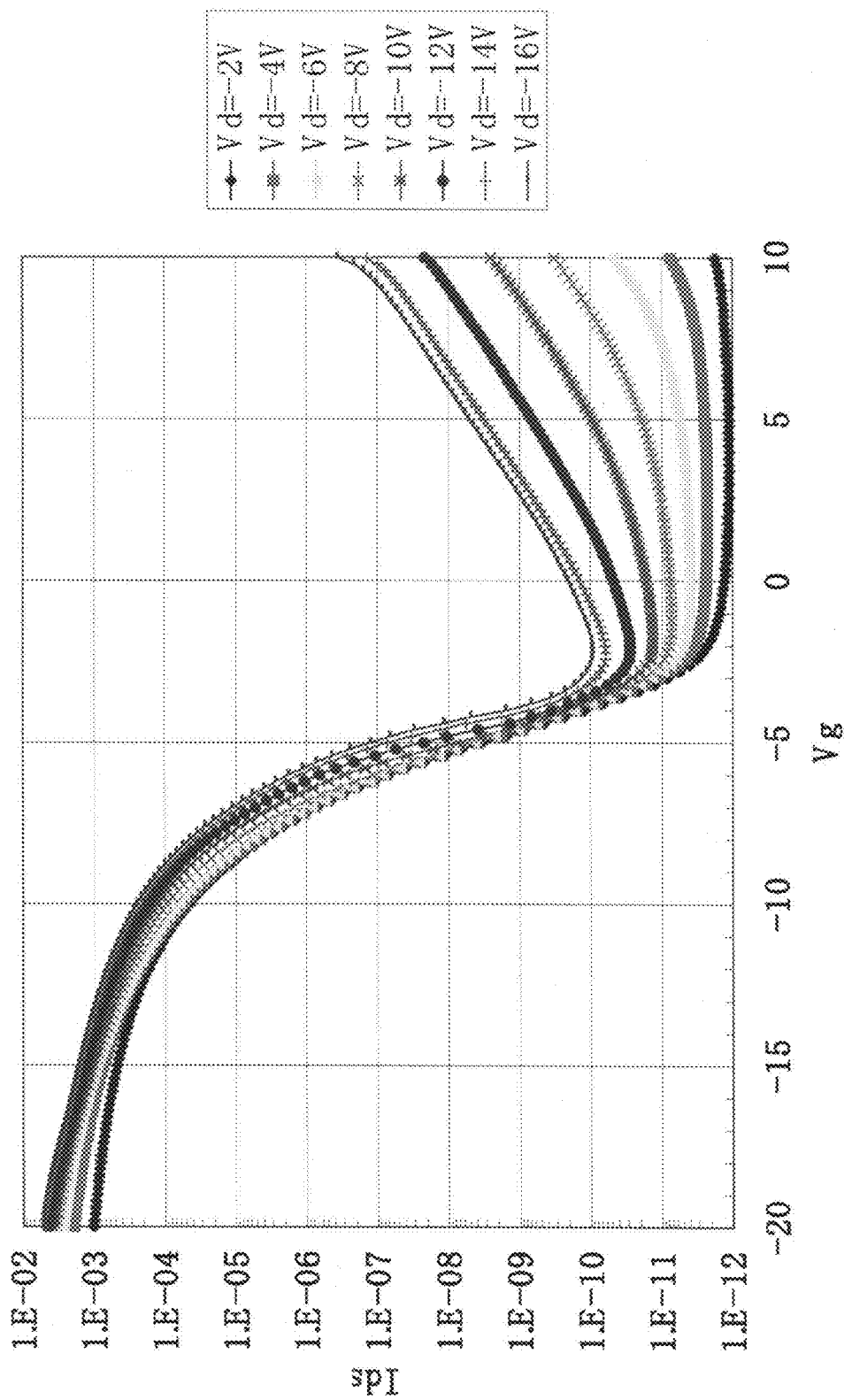
FIG. 23 is a graph showing a relation between a gate voltage and a drain current of a single-gate transistor.
Figure 24:
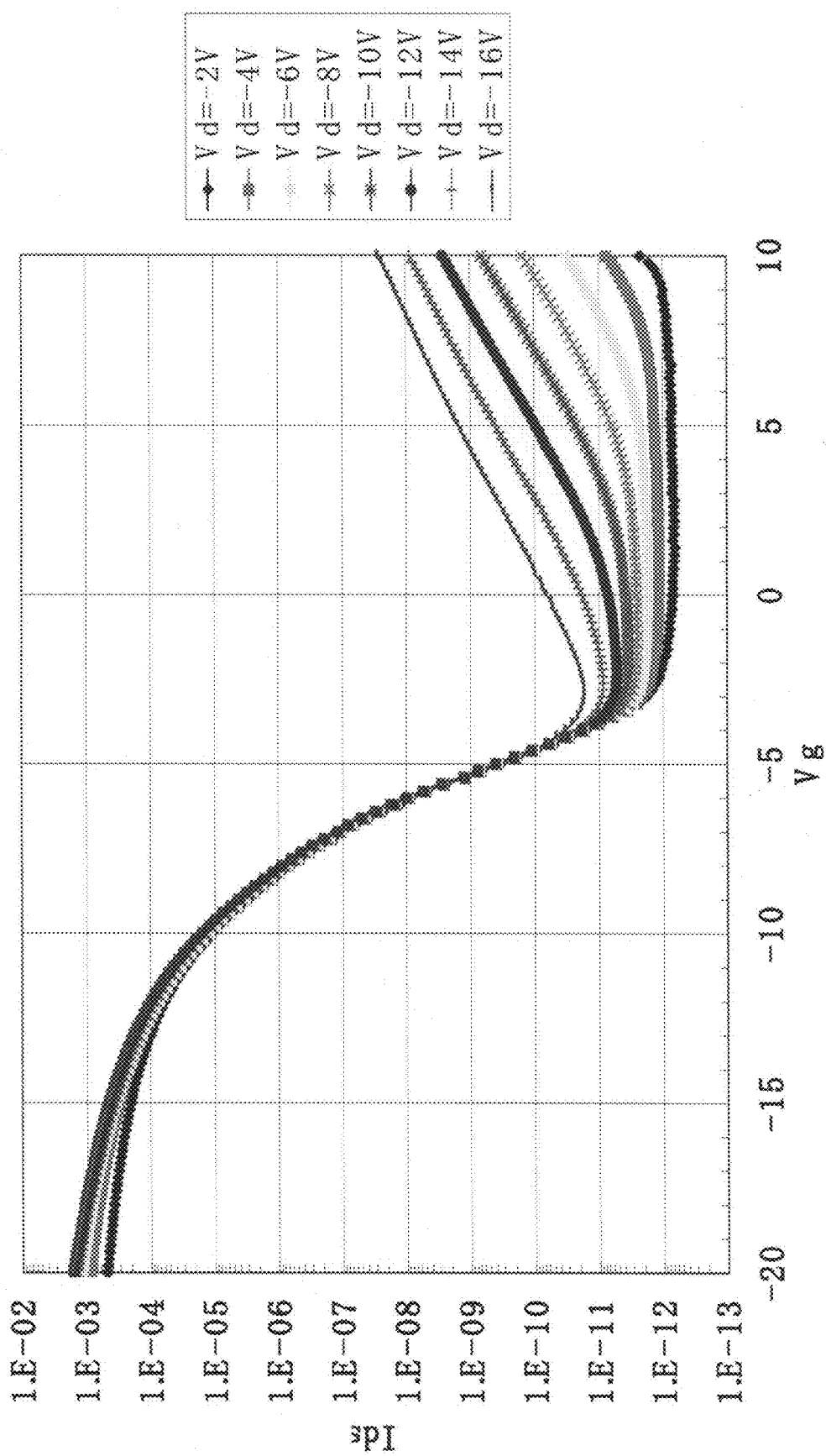
FIG. 24 is a graph showing a relation between a gate voltage and a drain current of a double-gate transistor.

FIG. 23 is a graph showing an example of a relation between a gate voltage and a drain current of a single-gate transistor. FIG. 24 is a graph showing an example of a relation between a gate voltage and a drain current of a multi-gate transistor. Explanations will be provided hereinafter by referring to the graphs. Note here that both graphs in FIG. 23 and FIG. 24 show the characteristics of PMOS transistors, and the drain voltage is also changed in each graph.

With the single-gate transistor, the curves of the gate voltage and the drain current change greatly as the drain voltage increases. When the gate voltage increases from −5 V to −10 V in particular, there is a change in the drain current value in a range of one-digit figure to two-digit figure for the same drain voltage. There is also change in the curve state, so that nonlinearity of the characteristic for the drain voltage is increased.

With the double-gate transistor, such change is suppressed. Thus, the changes can be settled with a range of less than one-digit figure under the same condition. Further, the change in the curve is reduced, so that the nonlinearity of the characteristic for the drain voltage becomes decreased, thereby increasing the linearity. As described, the use of the multi-gate type transistor provides a fine linearity of the drain current when there is a change in the source-drain voltage. Therefore, the controllability of the voltage controlled oscillator itself can be improved.

Further, it is also possible to use the multi-gate type transistor for a part of or all the circuits that connect the bias applying parts and the closed-loop circuits of the voltage controlled oscillator of the present invention. When the linearity of the circuits to be connected is improved by using the multi-gate transistors for the circuits that connect the bias applying part and the closed-loop circuit, the linearity of the entire voltage controlled oscillator is improved. Particularly, a fine characteristic can be obtained when the connecting circuit that mutually converts the voltage and the current is the multi-gate transistor.

Tenth Exemplary Embodiment

In a voltage controlled oscillator according to a tenth exemplary embodiment of the invention, a part of or all the transistors contained at least in the delay adjusting circuit or the temperature compensating circuit of each of the above-described exemplary embodiments is in a structure called a symmetrical load that is configured with two transistors. In the symmetrical load, the sources of the two transistors and the drains thereof are connected to each other to be in parallel, and one of the transistors is diode-connected. This structure is also called Maneatis resistance.

Figure 25:
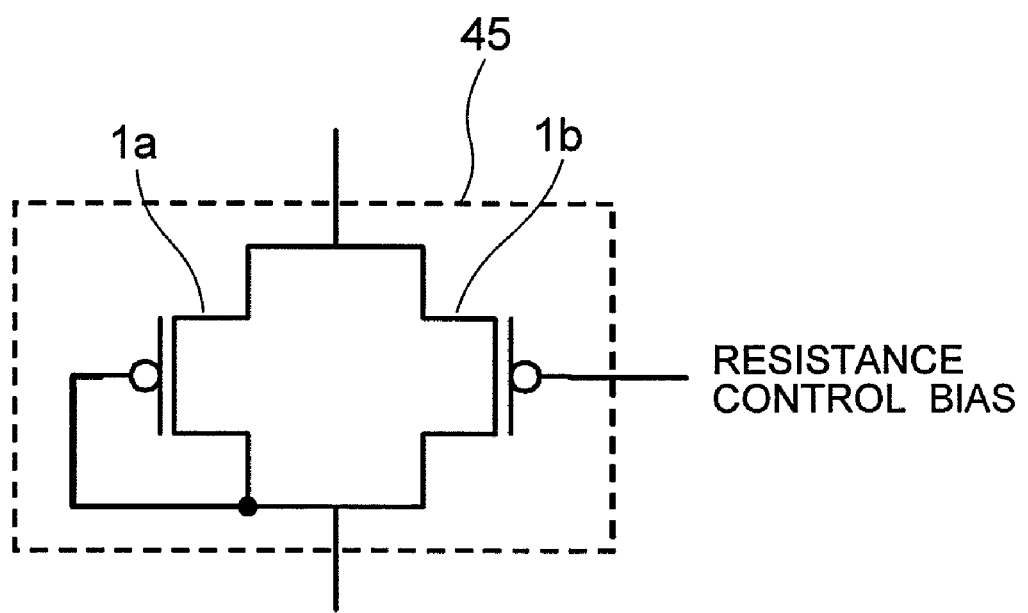
FIG. 25 is a circuit block diagram showing an example of a symmetrical load configured with two transistors.

FIG. 25 is a circuit block diagram showing an example of the symmetrical load that is configured with two transistors. Explanations will be provided hereinafter by referring to the drawing.

In a symmetrical load 45 of this example, sources and drains of two PMOS transistors 1a and 1b are connected to each other to form a parallel structure, and the PMOS transistor 1a is diode-connected. With this, when a resistance control bias applied to the PMOS transistor 1b side is changed, the resistance value between the source and drain comes to have a characteristic with a high linearity that changes almost linearly with respect to the resistance control bias. Thus, it is possible to obtain a characteristic that is close to the linear resistance. When such symmetrical load 45 is used, the resistance that changes almost linearly with respect to the delay adjusting bias and the temperature compensating bias can be used. Therefore, accuracy of controls can be improved, thereby making it possible to obtain the characteristic with high linearity.

Eleventh Exemplary Embodiment

A voltage controlled oscillator according to an eleventh exemplary embodiment of the invention has a structure of the seventh exemplary embodiment where the delay adjusting circuit and the temperature compensating circuit according to each of the above-described embodiments are connected in series and the control signal is transmitted to all the delay elements from a single control part, in which a part of or all the transistors contained in the control part is the symmetrical load that is configured with two transistors.

The eleventh exemplary embodiment uses the symmetrical load for the control part or for the synthesizing circuit. Thus, the linearity of the signals transmitted to the closed loop configured with the delay elements can be improved, which results in improving the linearity of the oscillation frequency. That is, a part of or all the circuits that connect the bias applying parts and the closed loop circuits is structured to have the diode-connected transistor and the transistor whose sources and drains are connected to each other to be in parallel, so that a fine characteristic can be obtained.

Twelfth Exemplary Embodiment

A voltage controlled oscillator according to a twelfth exemplary embodiment of the invention has a structure of the eighth exemplary embodiment where the delay adjusting circuit and the temperature compensating circuit are connected in parallel to the synthesizing circuit, in which a part of or all the transistors contained in the control part is the symmetrical load that is configured with two transistors.

The twelfth exemplary embodiment uses the symmetrical load for the control part or the synthesizing circuit. Thus, the linearity of the signals transmitted to the closed loop configured with the delay elements can be improved, which results in improving the linearity of the oscillation frequency. That is, a part of or all the circuits that connect the bias applying parts and the closed loop circuits is structured to have the diode-connected transistor and the transistor whose sources and drains are connected to each other to be in parallel, so that a fine characteristic can be obtained.

Thirteenth Exemplary Embodiment

A thirteenth exemplary embodiment of the invention is the voltage controlled oscillator according to one of the sixth to twelfth exemplary embodiments described above, and it is the voltage controlled oscillator controlled with analog signals.

Fourteenth Exemplary Embodiment

A fourteenth exemplary embodiment of the invention is the voltage controlled oscillator according to one of the sixth to twelfth exemplary embodiments described above, and it is the voltage controlled oscillator controlled with digital signals.

Fifteenth Exemplary Embodiment

A fifteenth exemplary embodiment of the invention is a display device in which a display unit and a temperature-compensated functional circuit unit using one of the first to fourteenth exemplary embodiments are formed integrally. The functional circuit unit whose temperature characteristic is compensated contains the voltage controlled oscillator, the variable delay line, the delay element, and the like according to one of the first to fourteenth exemplary embodiments. It is also possible to contain other functional circuits whose temperature characteristic is compensated. By integrally forming the display unit and such functional circuit unit whose temperature characteristic is compensated, it is possible to achieve the display device whose temperature characteristic can be compensated. That is, the temperature characteristic of the functional circuit unit is compensated, and the temperature characteristic of the display unit can be compensated by the functional circuit unit when necessary.

Such display device can operate excellently at temperatures of an extremely wide range. A temperature sensor may be formed integrally with the display unit or the functional circuit unit, or may be provided externally. When it is provided integrally in particular, it is desired for the temperature sensor and the circuit unit itself that outputs a temperature compensating bias from the output of the temperature sensor to have a characteristic that is resistant to temperature changes. Alternatively, it may be so structured that the characteristic change caused by the temperature change in the temperature sensor and the structural elements within the circuit that outputs the temperature compensating bias from the output of the temperature sensor triggers supply of the temperature compensating bias automatically.

With the conventional display device in which the functional circuit unit and the display unit are formed integrally, it sometimes happens that various kinds of functional circuit units operate insufficiently or malfunction. One of the reasons is that there are changes in the temperatures of various kinds of functional circuit units. That is, the various kinds of functional circuit units are formed integrally with the display unit, so that the functional circuit units are to be exposed to the temperature changes close to that of the display unit. Further, the temperatures of the various kinds of functional circuit units are changed due to heat generated when the power is consumed in the various kinds of functional circuit units themselves.

To be exposed to the temperature change close to that of the display unit means that it is exposed to the temperature close to that of the outside environment, since the display unit is disposed to be recognized by eyes of human beings. The external environment temperature is a temperature the display device guarantees to be operable. It is a subzero temperature, and it sometimes reaches 60 degrees Celsius or higher. In the meantime, a light source such as a backlight or a front light is provided to the display unit in many cases, so that the functional circuit units are to be exposed to a temperature increase caused due to the heat generated by the light source. The temperature increase by the light source may range from several degrees to several tens of degrees, depending on the structure of the display device.

When a temperature sensor element and a temperature compensating circuit provided outside the display device are used as a measure taken for such temperature changes, it is difficult to perform sufficient temperature compensation since the detected temperature is different from the temperature of the functional circuit unit. The fifteenth exemplary embodiment of the invention can overcome the issues of the display device in which the functional circuit unit and the display nit are formed integrally.

Sixteenth Exemplary Embodiment

A sixteenth exemplary embodiment of the invention is related to various kinds of devices and a system using the display device of the fifteenth exemplary embodiment as one of the structural modules. By using the display device of the fifteenth exemplary embodiment, the various kinds of devices and the system can operate in an excellent manner even if there is a change in the temperature. Thus, it is possible to achieve a device and a system whose display is undisturbed even under a severe external environment or even if there is an increase in the temperature of the device itself, etc. Such system requires no external clock in a normal operation. Usually, an external clock is supplied from a crystal oscillator provided outside. When the external clock element such as the crystal oscillator is used, not only the cost is increased, but also a circuit for decreasing a clock frequency is required because the external clock element operates at a frequency higher than the frequency of an internal circuit of the device. If these circuits are added, the configuration of the device becomes complicated, and at the same time, the power consumption is increased since the circuit operates at high frequency. In this exemplary embodiment, since the external clock element is not required, the cost can be reduced, and the power consumption can be decreased. Further, it is possible to correct the internal oscillation frequency by the external clock, through connecting to the external clock only when calibrating the system. This makes it possible to provide a system that can be stable for a long period. Only when calibrating the system as described, the lower consuming power compared to the traditional case can be realized at the normal operation even if it is configured to use the external clock.

Specific examples of the present invention will be described hereinafter by referring to the drawings.

Example 1

Figure 26:
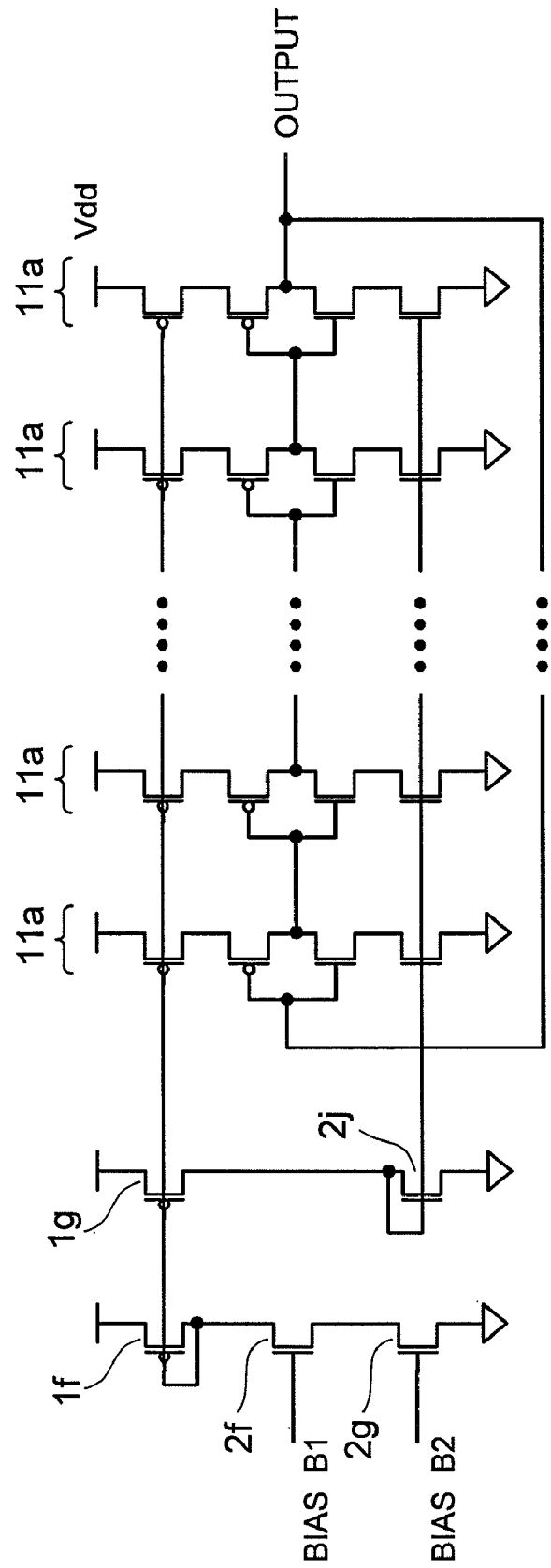
FIG. 26 is a circuit block diagram showing a voltage controlled oscillator according to Example 1.

FIG. 26 is a circuit block diagram showing a voltage controlled oscillator according to Example 1 of the present invention. FIG. 27-FIG. 30 are graphs showing the relation between the control bias and the oscillation frequency in Example 1. Explanations will be provided hereinafter by referring to those drawings.

Example 1 is a more concretive example where the first exemplary embodiment (FIG. 1-FIG. 9), the sixth exemplary embodiment (FIG. 15), the ninth exemplary embodiment (FIG. 24), and the like are embodied. Example 1 uses a current-starved inverter as an inversion-type delay element, i.e., the delay generating part 11a of FIG. 3. An odd-number (for example, thirty-one) delay generating parts 11a form a closed loop. As in the case of FIG. 2, the PMOS transistors 1f and 1g configure a current mirror circuit. Further, the PMOS transistor 1f and the NMOS transistor 2j convert a current to a voltage. The bias B1 as the control bias for adjusting the frequency is applied to the NMOS transistor 2f. The bias B2 for compensating the temperature characteristic is applied to the NMOS transistor 2g. This structure can provide a voltage controllable oscillator that is capable of changing the oscillation frequency through controlling the control voltage to be applied to the current-starved inverter.

Figure 27:
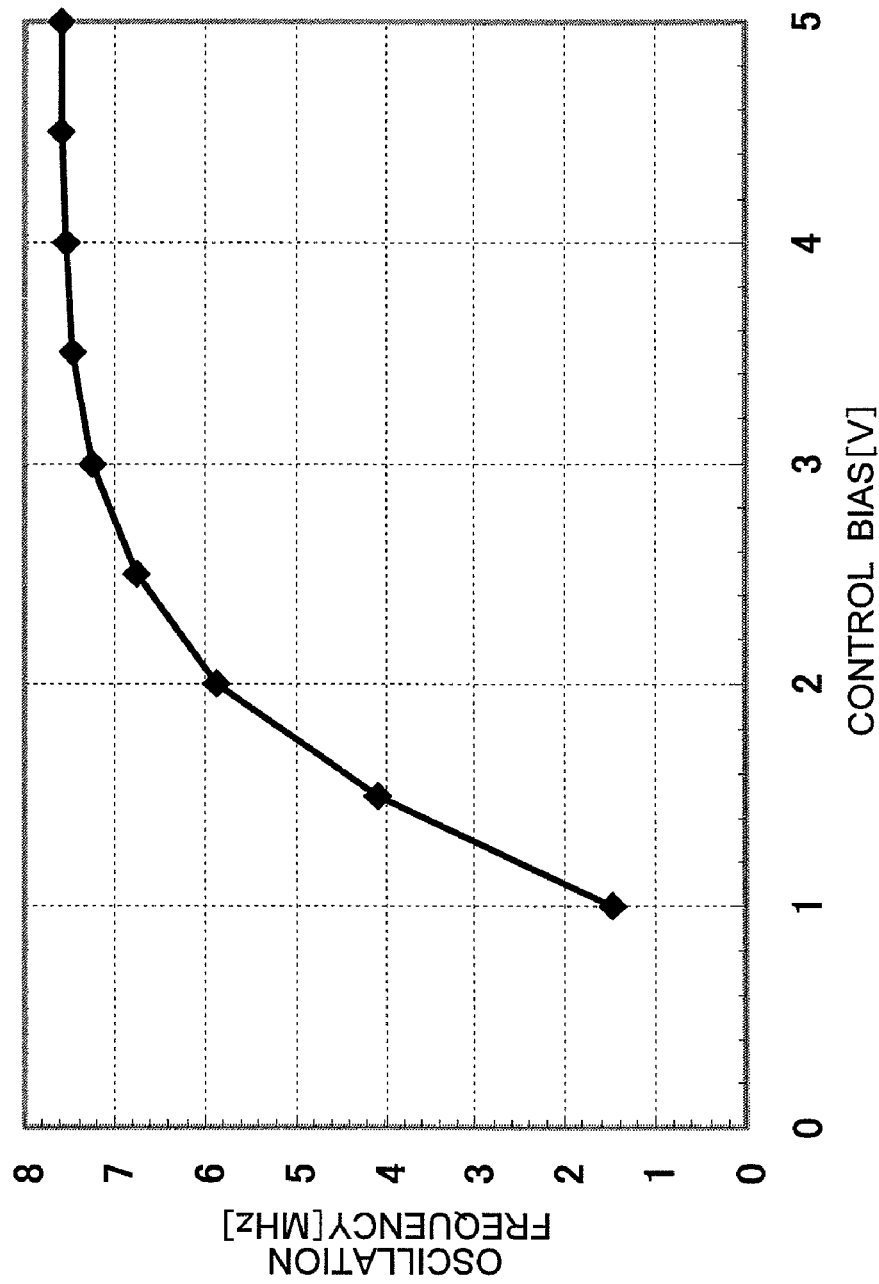
FIG. 27 is a graph showing a relation between a control bias and an oscillation frequency at a room temperature (27 degrees Celsius) regarding the voltage controlled oscillator according to Example 1.

FIG. 27 shows a relation between the control bias (bias B1) and the oscillation frequency of Example 1. Referring to FIG. 27, the oscillation frequency changes largely within a range of 1.5 MHz to 7.5 MHz for the changes in the control bias in a range of 1 V to 3.5 V. There is no oscillation obtained when the control bias is less than 1 V. In the meantime, the oscillation frequency exhibits almost no change even if the control bias is changed when the bias is 3.5 V or higher.

Figure 28:
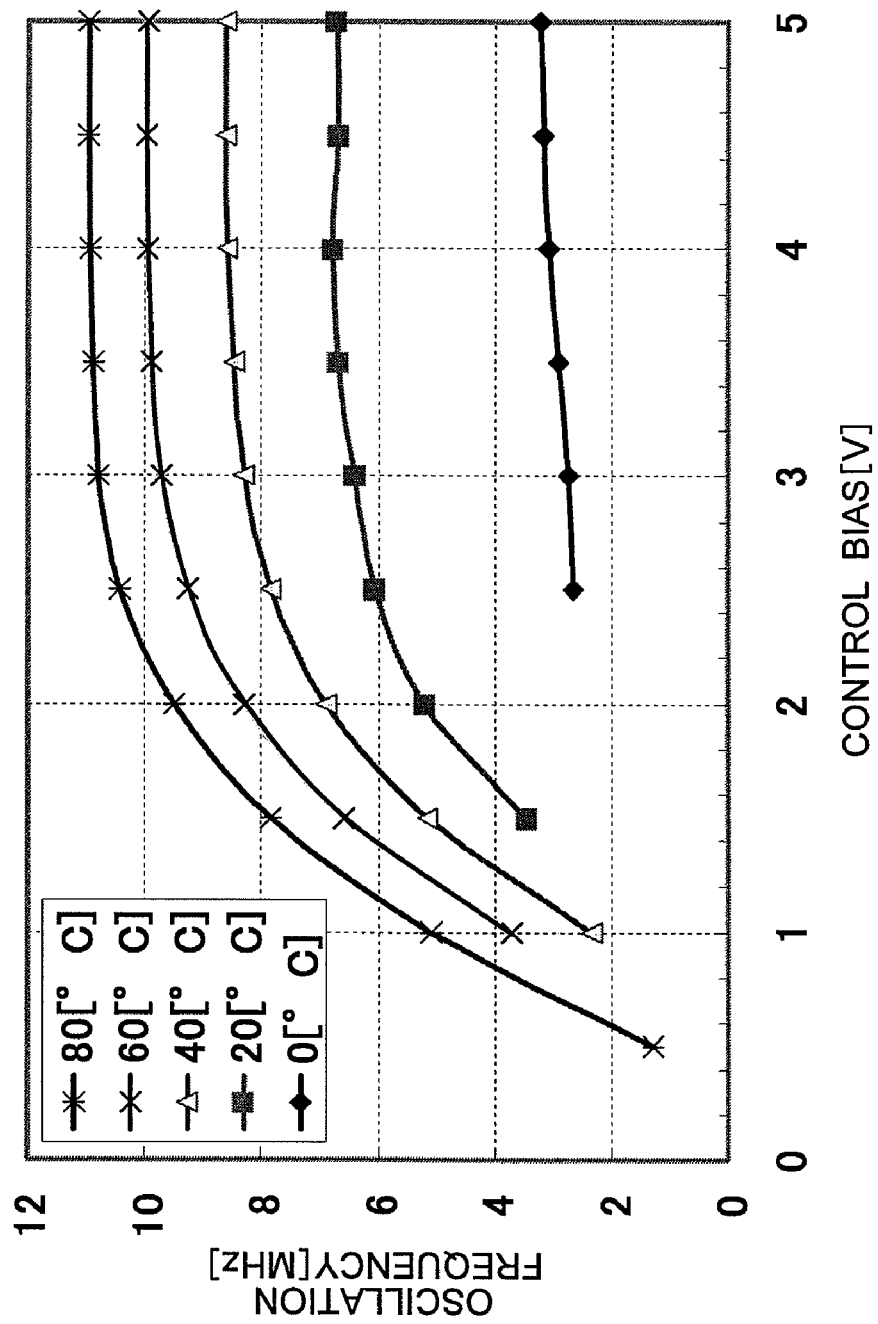
FIG. 28 is a graph showing a relation between the control bias and the oscillation frequency of the voltage controlled oscillator according to Example 1, when the bias for compensating the temperature characteristic is fixed and the temperatures are changed from 0 degrees to 80 degrees at 20-degree interval.

FIG. 27 shows the result obtained at a room temperature (27 degrees C.). Next, changes in the property with respect to the temperatures were investigated. FIG. 28 shows a relation between the control bias (bias B1) and the oscillation frequency of Example 1 when the temperature was changed from 0 degrees C. to 80 degrees C. at 20-degree intervals, while the bias (bias B2) for compensating the temperature characteristic was fixed. As can be seen from FIG. 28, the oscillation frequency changes greatly when the temperature changes. Further, under a small control bias, there may be a case where the oscillation cannot be obtained when the temperature changes to a low-temperature side. As described, under a condition where the temperature compensation is not performed, the oscillation frequency changes greatly when there is a large temperature change. Thus, it becomes difficult to use the oscillator stably.

Figure 29:
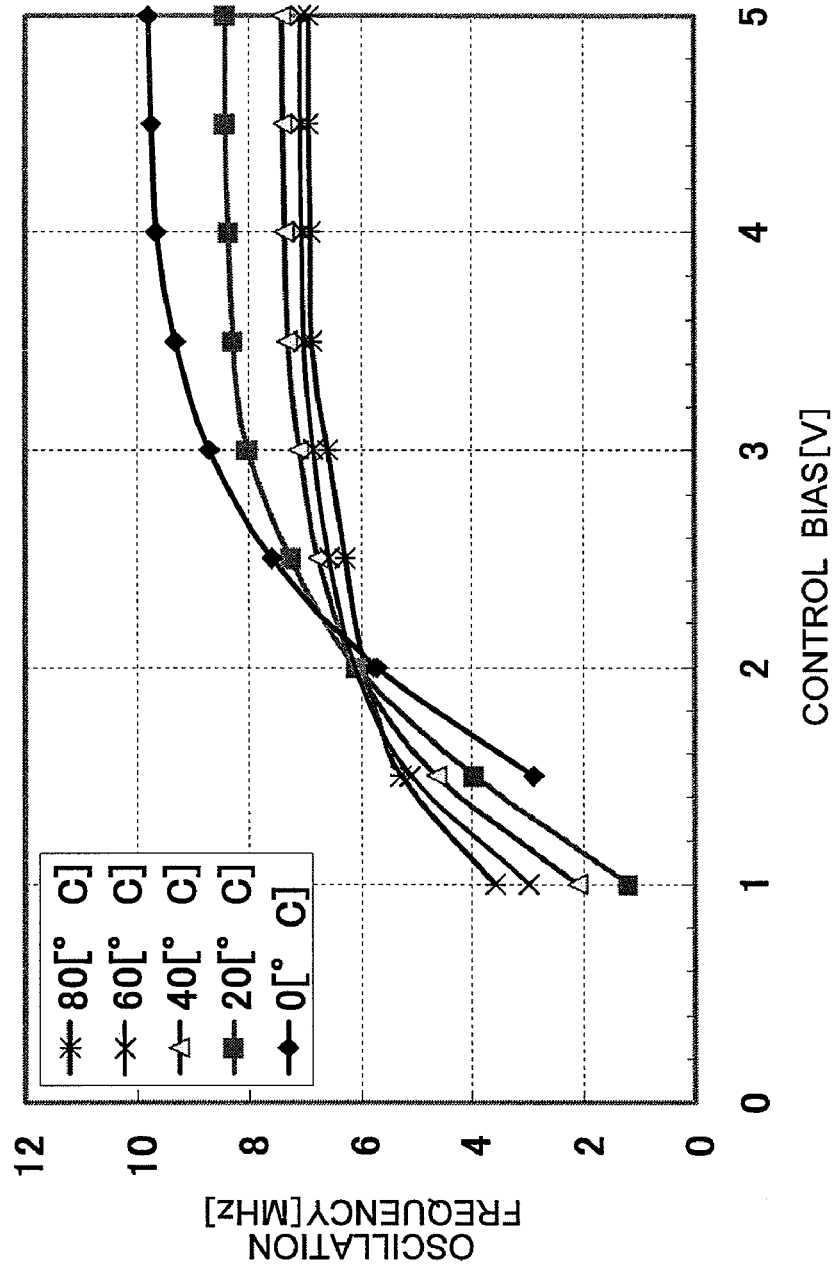
FIG. 29 is a graph showing a relation between the control bias and the oscillation frequency of the voltage controlled oscillator according to Example 1, when the bias for compensating the temperature characteristic is applied while changing the temperatures from 0 degrees to 80 degrees at 20-degree interval.

In order to deal with such temperature changes, the present invention applies the temperature compensating bias. As in the case of FIG. 28, FIG. 29 shows a relation between the control bias (bias B1) and the oscillation frequency when the temperature was changed from 0 degrees C. to 80 degrees C. at 20-degree intervals, when the temperature characteristic was compensated by using the bias (bias B2) that compensates the temperature characteristic. In FIG. 29, applied is the temperature compensating bias that can provide almost a constant oscillation frequency when the control bias is 2 V, even if the temperature changes. As a result, the variation in the oscillation frequency when there is a temperature change becomes dramatically smaller compared to that of FIG. 28.

Figure 30:
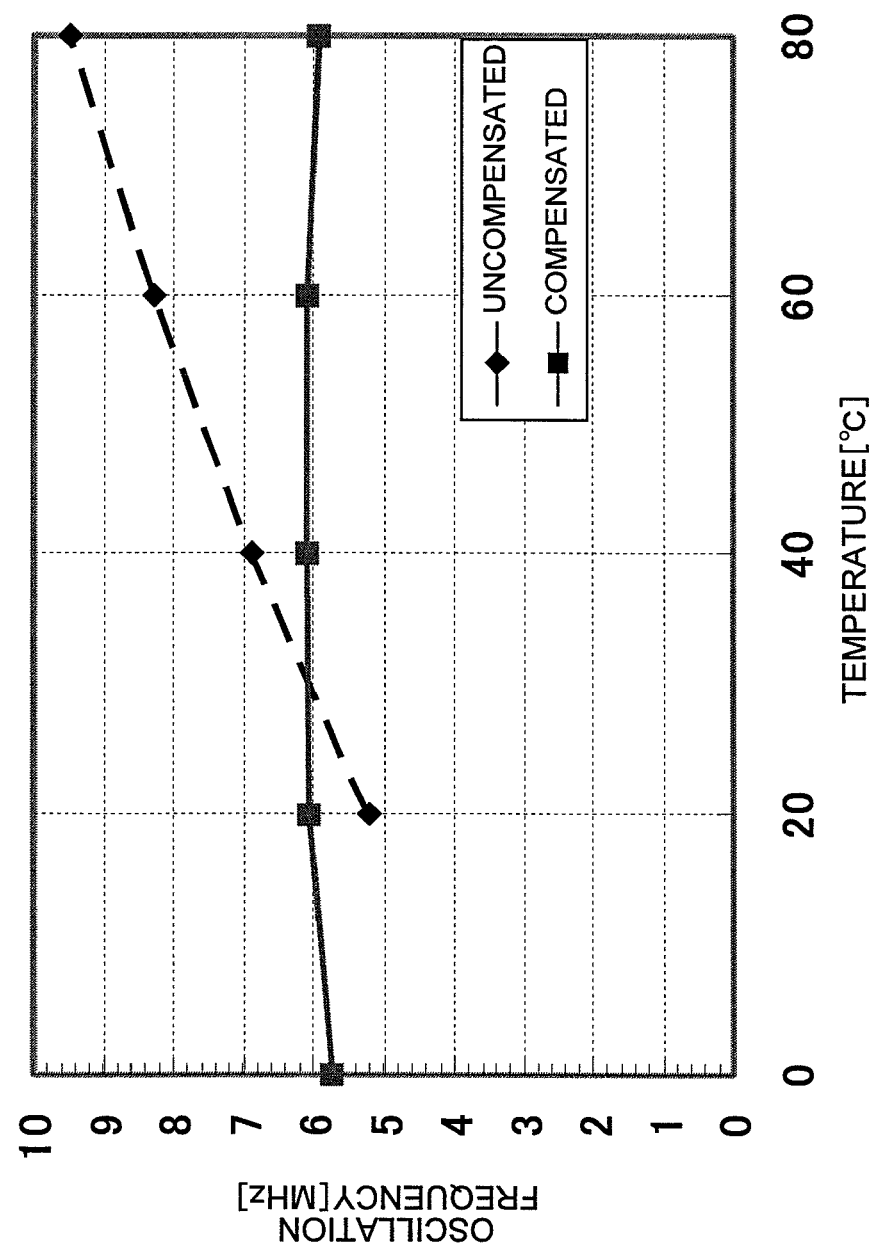
FIG. 30 is a graph showing a relation between the temperature and the frequency of the voltage controlled oscillator according to Example 1 regarding a case that uses the temperature compensating bias and a case that does not use the temperature compensating bias while the control bias is fixed at 2 V.

FIG. 30 shows relations between the temperature and the frequency for cases with and without applying the temperature compensating bias, while the control bias is fixed at 2 V. As can be seen from FIG. 30, the oscillation frequency changes almost by twice with the changes in the temperatures from 20 degrees C. to 80 degrees C. when the temperature compensating bias is not applied, and no oscillation is obtained at 0 degree C. In the meantime, when the temperature compensating bias is applied, the oscillation frequency becomes stable at about 6 MHz, even if there is a change in the temperature.

Comparative Example 1

Figure 31:
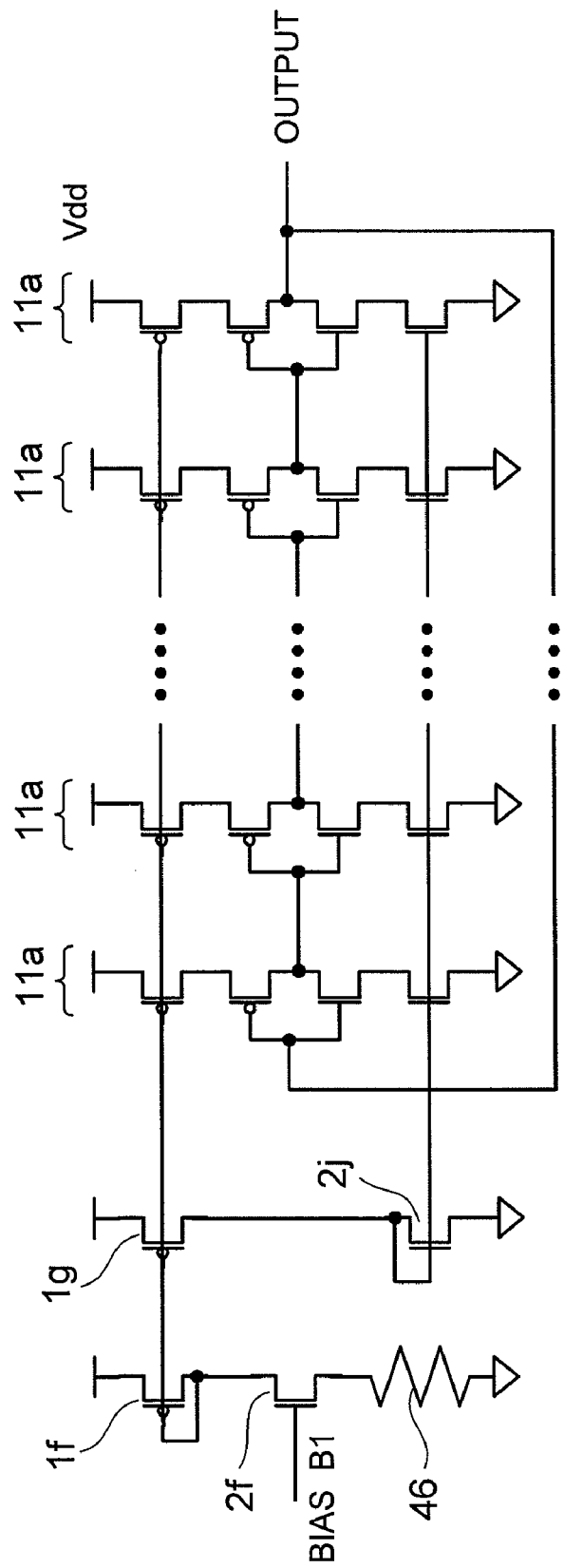
FIG. 31 is a circuit block diagram showing a voltage controlled oscillator according to Comparative Example 1.
Figure 32:
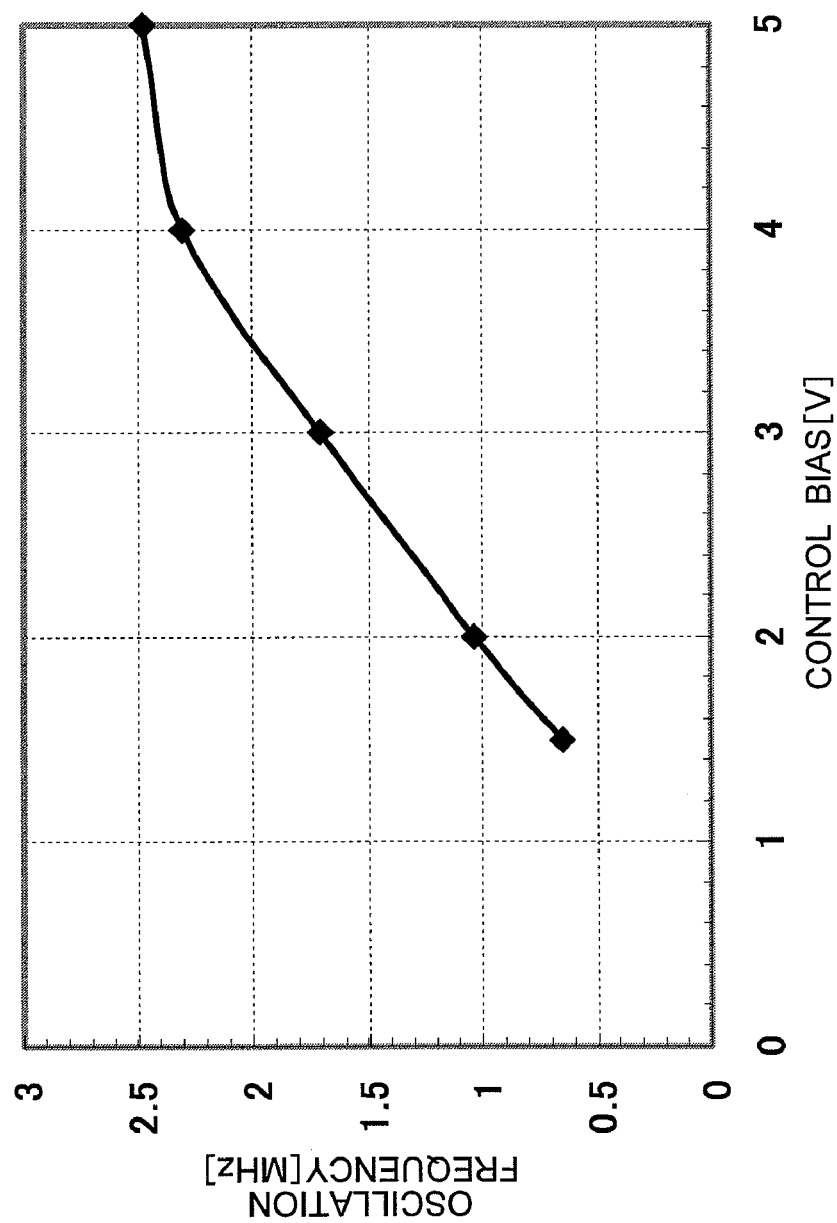
FIG. 32 is a graph showing a relation between a control bias and an oscillation frequency at a room temperature (27 degrees) regarding the voltage controlled oscillator according to Comparative Example 1.
Figure 33:
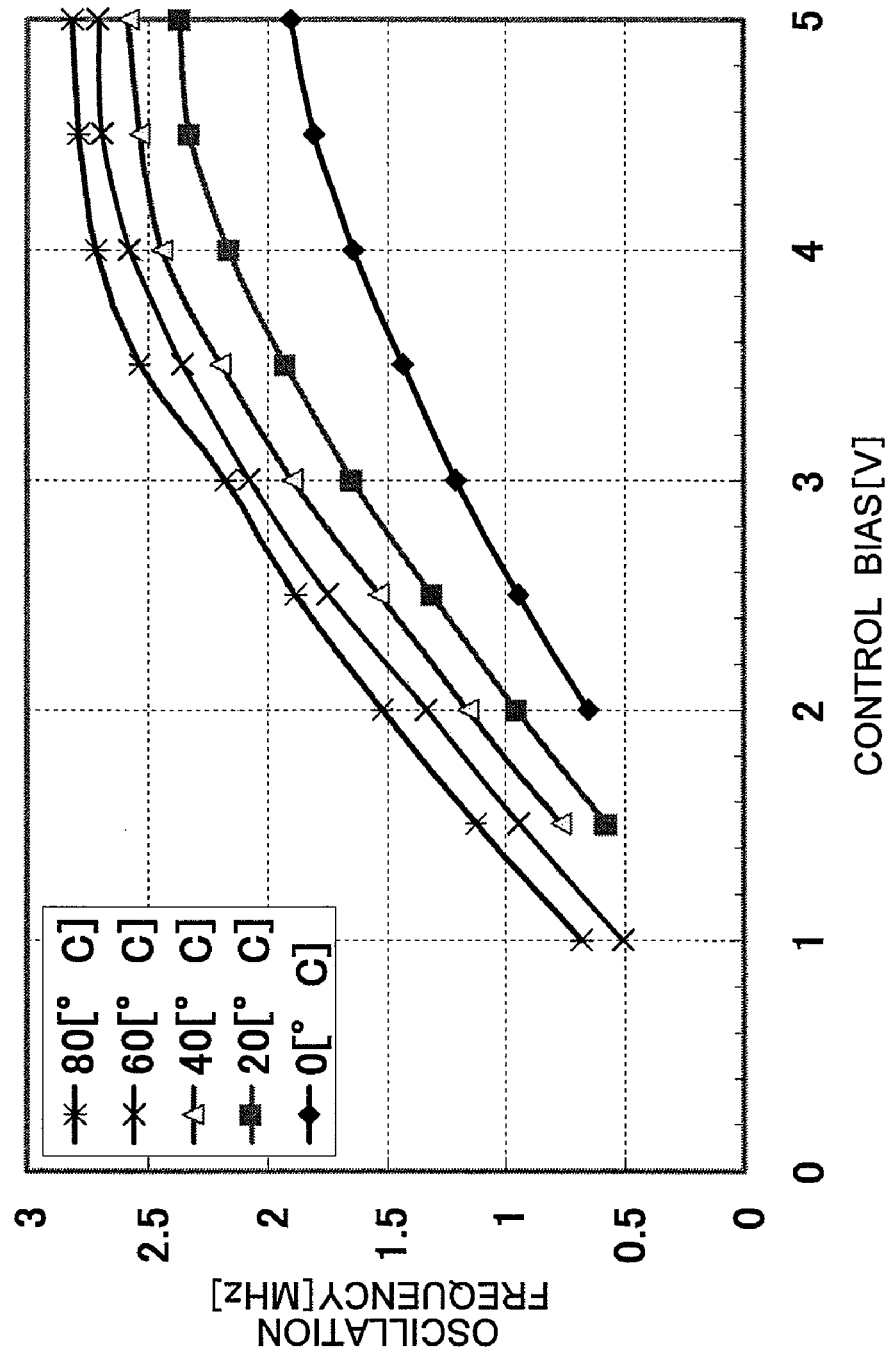
FIG. 33 is a graph showing a relation between the control bias and the oscillation frequency of the voltage controlled oscillator according to Comparative Example 1, when the bias for compensating the temperature characteristic is fixed and the temperatures are changed from 0 degrees to 80 degrees at 20-degree interval.

FIG. 31 is a circuit block diagram showing a voltage controlled oscillator according to Comparative Example 1. FIG. 32 and FIG. 33 are graphs showing relations between the control bias and the oscillation frequency of Comparative Example 1. Explanations will be provided hereinafter by referring to the drawings.

The structure of Comparative Example 1 is the same as that of Example 1, except for the point that the NMOS transistor 2g (FIG. 26) of Example 1 is replaced with a resistance 46. Comparative Example 1 also uses a current-starved inverter as an inversion-type delay element, i.e., the delay generating part 11a pf FIG. 3. An odd-number (for example, thirty-one) delay generating parts 11a form a closed loop. As in the case of FIG. 2, the PMOS transistors 1f and 1g configure a current mirror circuit. Further, the PMOS transistor 1f and the NMOS transistor 2j convert a current to a voltage. The bias B1 as the control bias for adjusting the frequency is applied to the NMOS transistor 2f. However, unlike the case of Example 1, the bias B2 (FIG. 26) for compensating the temperature characteristic is not used. This structure can provide a voltage controllable oscillator that is capable of changing the oscillation frequency through controlling the control voltage to be applied to the current-starved inverter.

FIG. 32 shows a relation between the control bias and the oscillation frequency of Comparative Example 1. Referring to FIG. 32, the oscillation frequency changes almost linearly for the changes in the control bias in a range of 1.5 V to 4 V. FIG. 32 shows the result obtained at a room temperature (27 degrees C.).

Next, FIG. 33 shows a relation between the control bias and the oscillation frequency, when the temperature was changed from 0 degrees C. to 80 degrees C. at 20-degree intervals. When there is a change in the temperature, the oscillation frequency changes greatly. At low temperatures in particular, it often happens that the oscillation cannot be obtained.

Unlike the case of Example 1, Comparative Example 1 cannot apply the temperature compensating bias. Thus, a change in the oscillation frequency caused when there is a change in the temperature cannot be suppressed. It may be possible to employ some kind of measure for compensating the temperature from an external circuit other than those shown in FIG. 31. In that case, however, the circuit becomes more complicated and the circuit scale is increased compared to the case of Example 1. For example, the complicity of the circuit differs greatly between the structure of Patent Document 1 and that of Example 1.

Example 2

Figure 34:
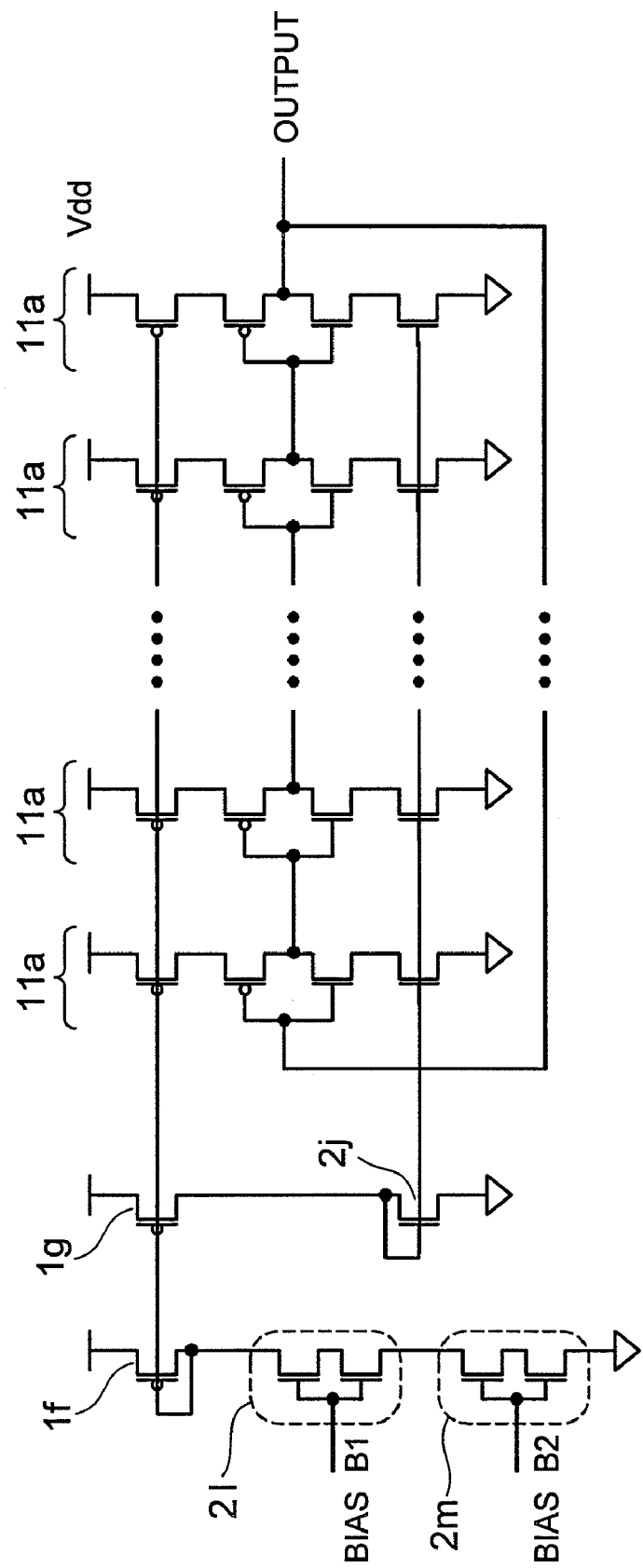
FIG. 34 is a circuit block diagram showing a voltage controlled oscillator according to Example 2.
Figure 35:
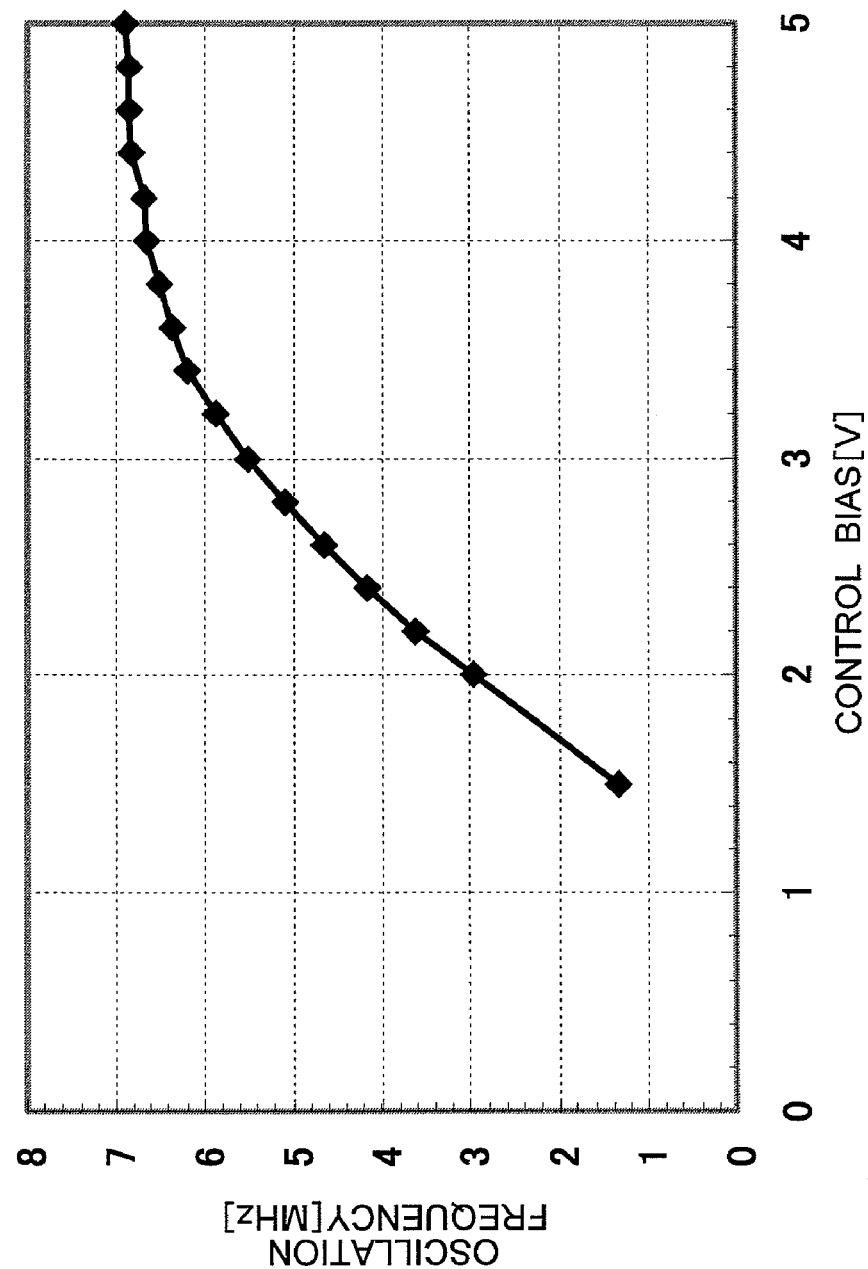
FIG. 35 is a graph showing a relation between a control bias and an oscillation frequency at a room temperature (27 degrees) regarding the voltage controlled oscillator according to Example 2.
Figure 36:
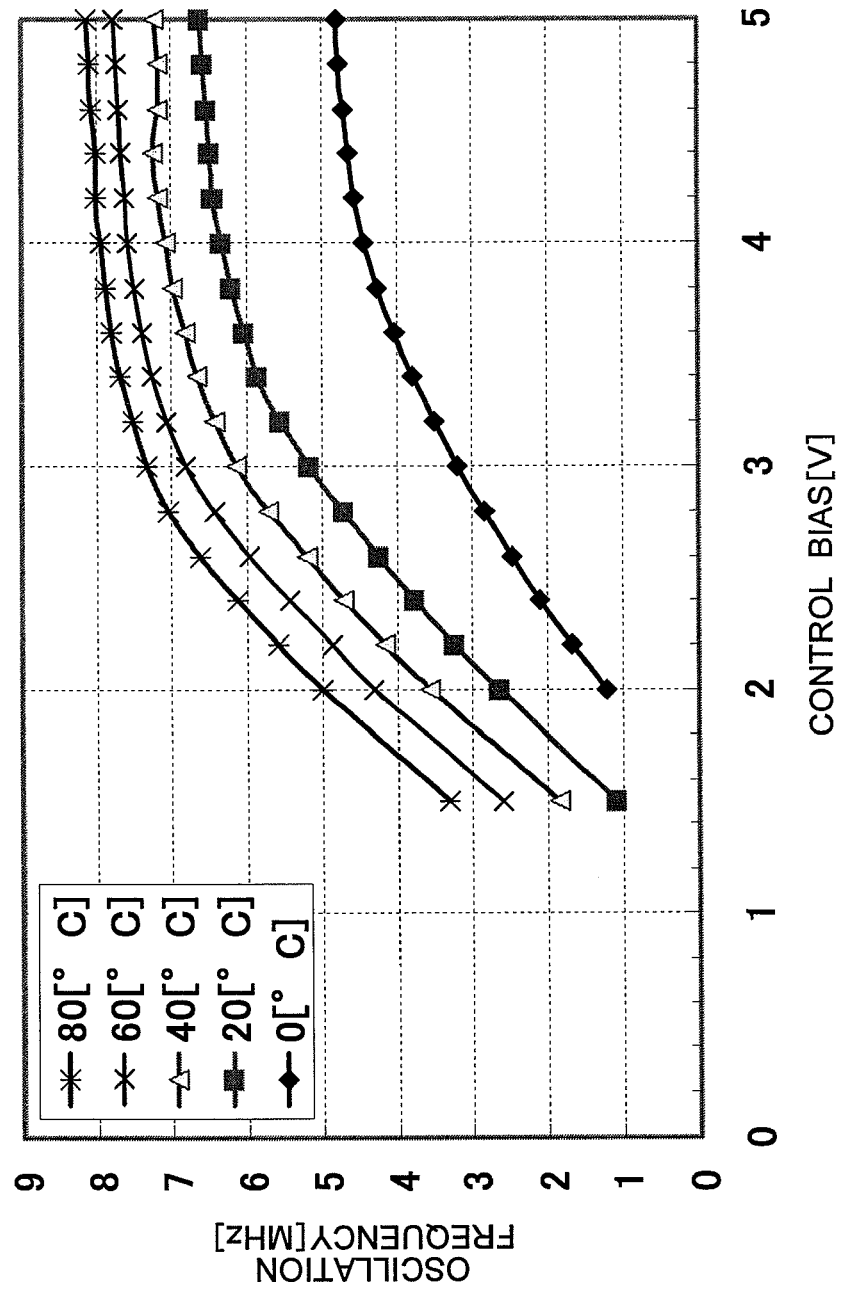
FIG. 36 is a graph showing a relation between the control bias and the oscillation frequency of the voltage controlled oscillator according to Example 2, when the bias for compensating the temperature characteristic is fixed and the temperatures are changed from 0 degrees to 80 degrees at 20-degree interval.
Figure 37:
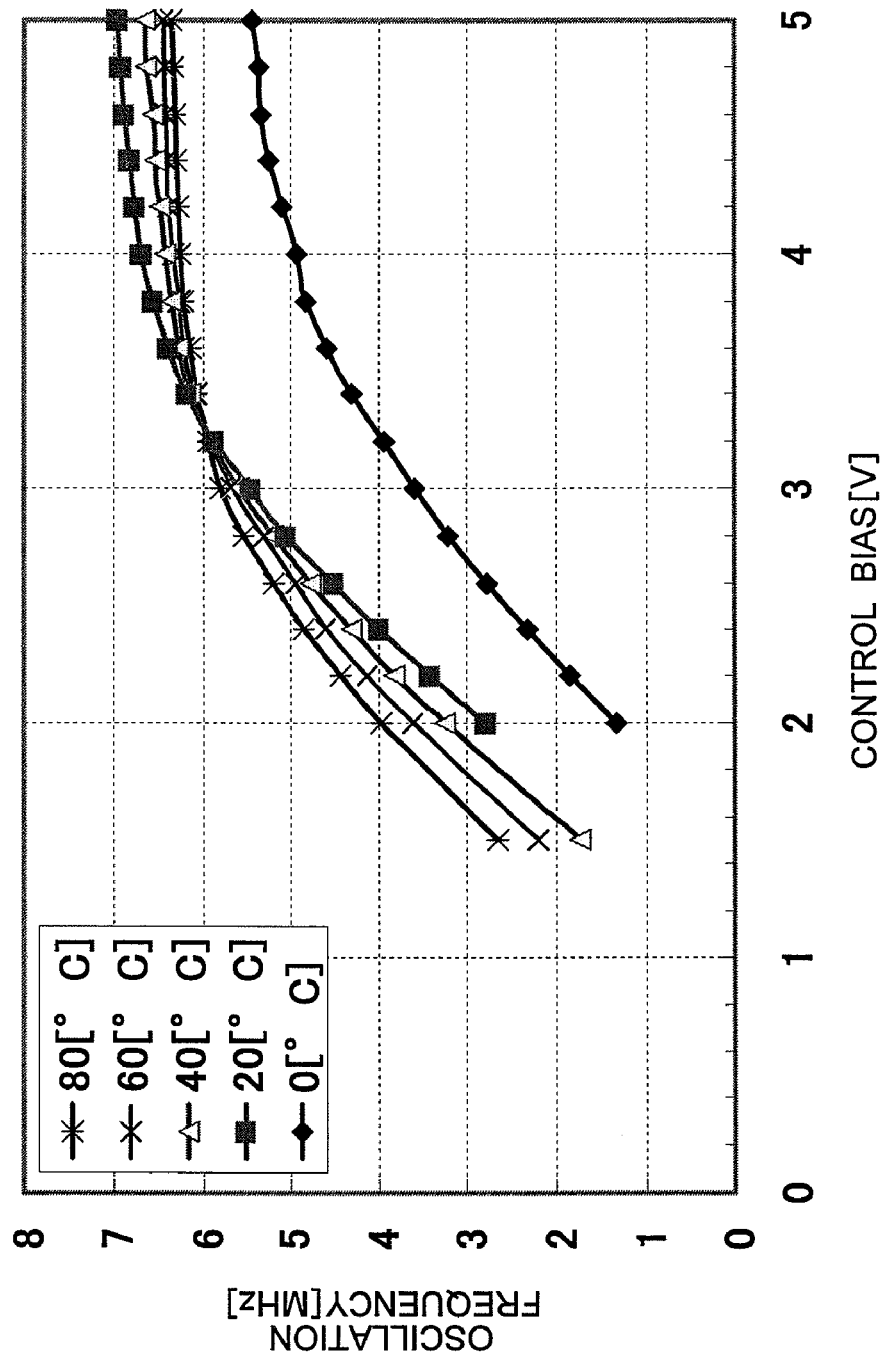
FIG. 37 is a graph showing a relation between the control bias and the oscillation frequency of the voltage controlled oscillator according to Example 2, when the bias for compensating the temperature characteristic is applied while changing the temperatures from 0 degrees to 80 degrees at 20-degree interval.

FIG. 34 is a circuit block diagram showing a voltage controlled oscillator according to Example 2 of the present invention. FIG. 35-FIG. 37 are graphs showing the relation between the control bias and the oscillation frequency in Example 2. Explanations will be provided hereinafter by referring to those drawings.

The structure of Example 2 is the same as that of Example 1, except for the point that the NMOS transistors 2f, 2g (FIG. 26) of Example 1 are replaced with NMOS transistors 2l, 2m which are double-gate transistors. Example 2 also uses a current-starved inverter as an inversion-type delay element, i.e., the delay generating part 11a of FIG. 3. An odd-number (for example, thirty-one) delay generating parts 11a form a closed loop. As in the case of FIG. 2, the PMOS transistors 1f and 1g configures a current mirror circuit. Further, the PMOS transistor 1f and the NMOS transistor 2j convert a current to a voltage. The bias B1 as the control bias for adjusting the frequency is applied to the NMOS transistor 2l. The bias B2 for compensating the temperature characteristic is applied to the NMOS transistor 2m. This structure can provide a voltage controllable oscillator that is capable of changing the oscillation frequency through controlling the control voltage to be applied to the current-starved inverter.

FIG. 35 shows a relation between the control bias and the oscillation frequency of Example 2. Referring to FIG. 35, the oscillation frequency changes largely within a range of little higher than 1 MHz to little smaller than 7 MHz for the changes in the control bias in a range of 1.5 V to 4 V. There is no oscillation when the control bias is less than 1.5 V, while the oscillation frequency exhibits almost no change even if the control bias is changed when the bias is 4 V or higher.

FIG. 35 shows the result obtained at a room temperature (27 degrees C.). Next, changes in the property with respect to the temperatures were investigated. FIG. 36 shows a relation between the control bias and the oscillation frequency of Example 2 when the temperature was changed from 0 degrees C. to 80 degrees C. at 20-degree intervals, while the bias (bias B2) for compensating the temperature characteristic was fixed. As can be seen from FIG. 36, the oscillation frequency changes greatly when the temperature changes. Further, under a small control bias, there may be a case where the oscillation cannot be obtained when the temperature changes to a low-temperature side. As described, under a condition where the temperature compensation is not performed, the oscillation frequency changes greatly when there is a large temperature change. Thus, it becomes difficult to use the oscillator stably.

However, compared to Example 1 shown in FIG. 28, the temperature dependency in FIG. 36 is lightened. This is because the double-gate transistor that is the multi-gate type transistor is used for the bias applying part. That is, improvement in the linearity of the drain current achieved by the use of the multi-gate type transistor works to obtain a fine result for the current change caused due to the temperature dependency.

In order to deal with such temperature changes, the present invention applies the temperature compensating bias. As in the case of FIG. 36, FIG. 37 shows a relation between the control bias and the oscillation frequency when the temperature was changed from 0 degrees C. to 80 degrees C. at 20-degree intervals, when the temperature characteristic was compensated by using the bias (bias B2) that compensates the temperature characteristic. In FIG. 37, applied is the temperature compensating bias that can provide almost a constant oscillation frequency when the control bias is 3.3 V, even if the temperature changes. As a result, the variation in the oscillation frequency when there is a temperature change becomes dramatically smaller compared to that of FIG. 36.

When the case of Example 1 shown in FIG. 29 where the temperature compensation is performed is compared to the case of Example 2 shown in FIG. 37 where the temperature compensation is performed, it can be seen that change in the oscillation frequencies at 20 degrees C. and 80 degrees C. when the control bias takes a value different from a prescribed value is smaller with Example 2. That is, when the control bias is higher than the prescribed value, there is only about 10% difference between the oscillation frequencies between the temperatures at 20 degrees C. and 80 degrees C. with Example 2, whereas there is about 20% difference with Example 1. This is also an effect obtained by using the multi-gate type transistor. Since there is only a small change in the oscillation frequency, it is easy to settle the frequency at a desired frequency. Thus, Example 2 can provide better frequency stability than that of Example 1.

Example 3

Figure 38:
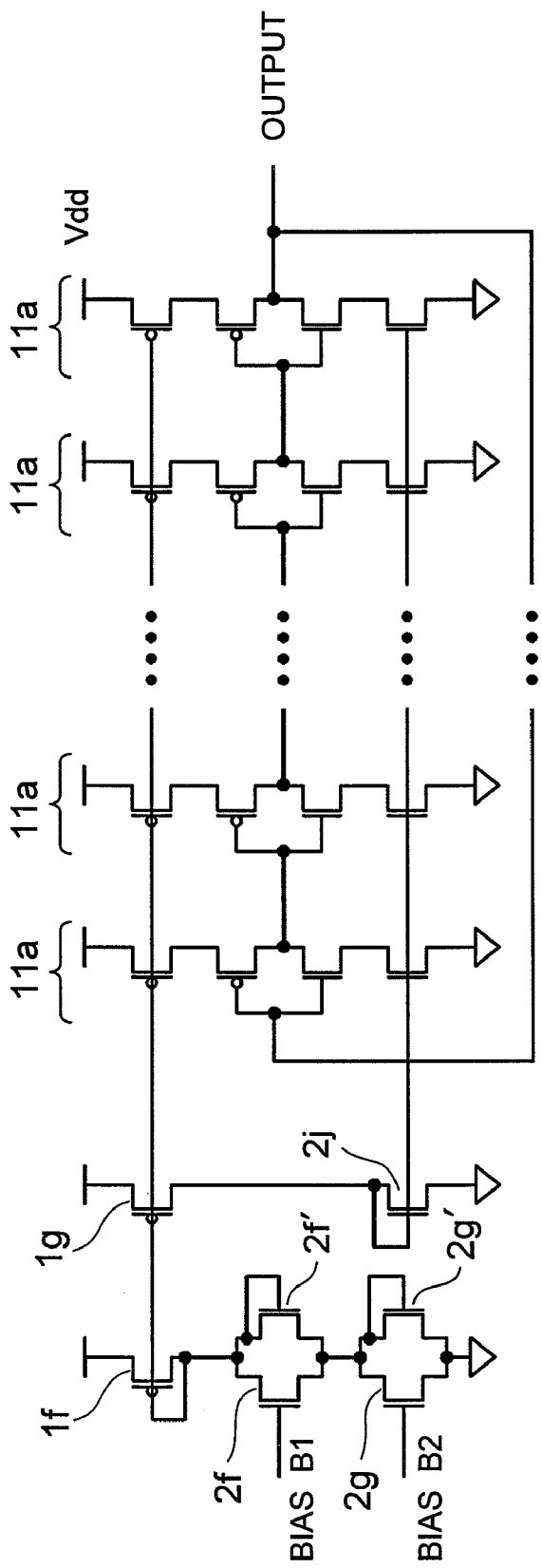
FIG. 38 is a circuit block diagram showing a voltage controlled oscillator according to Example 3.
Figure 39:
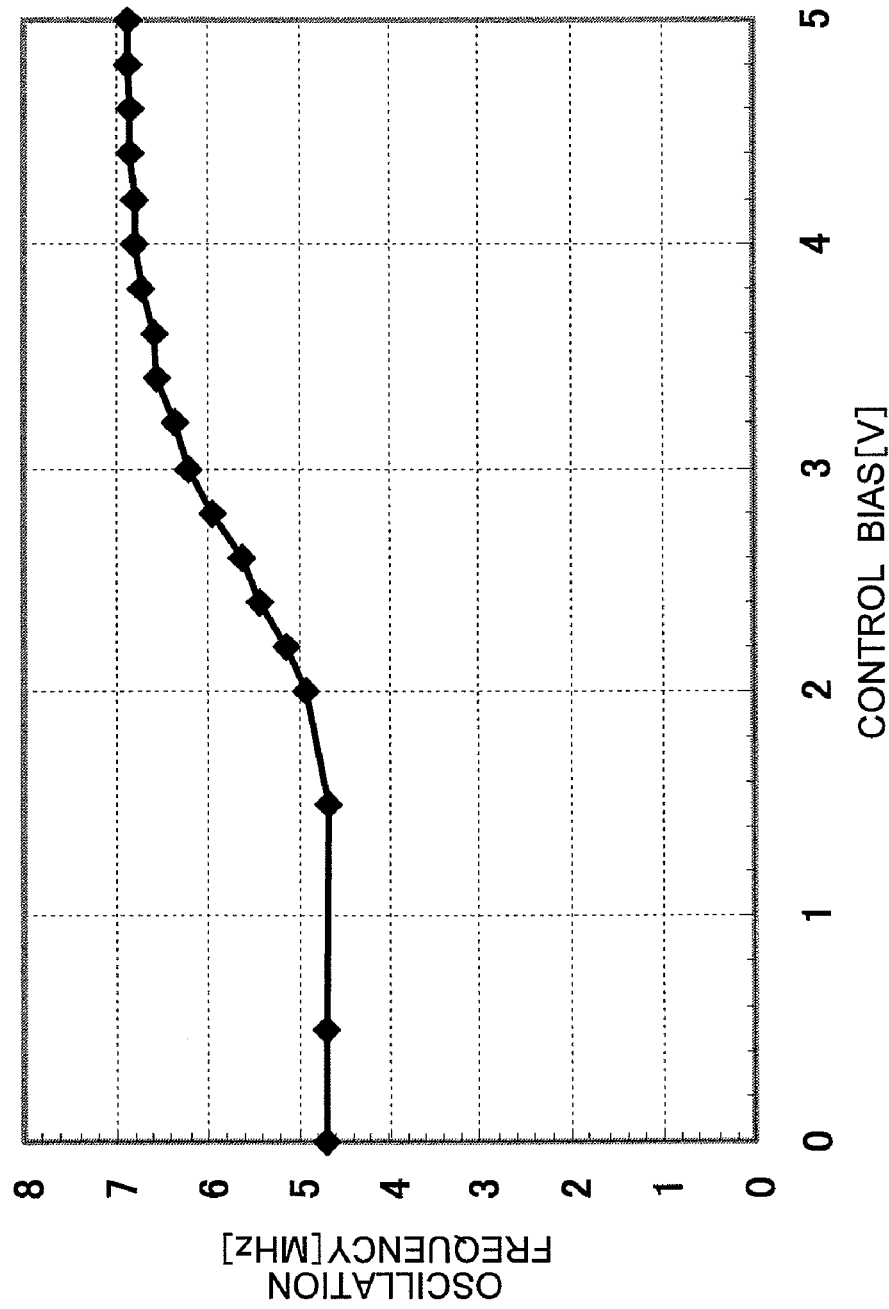
FIG. 39 is a graph showing a relation between a control bias and an oscillation frequency at a room temperature (27 degrees) regarding the voltage controlled oscillator according to Example 3.
Figure 40:
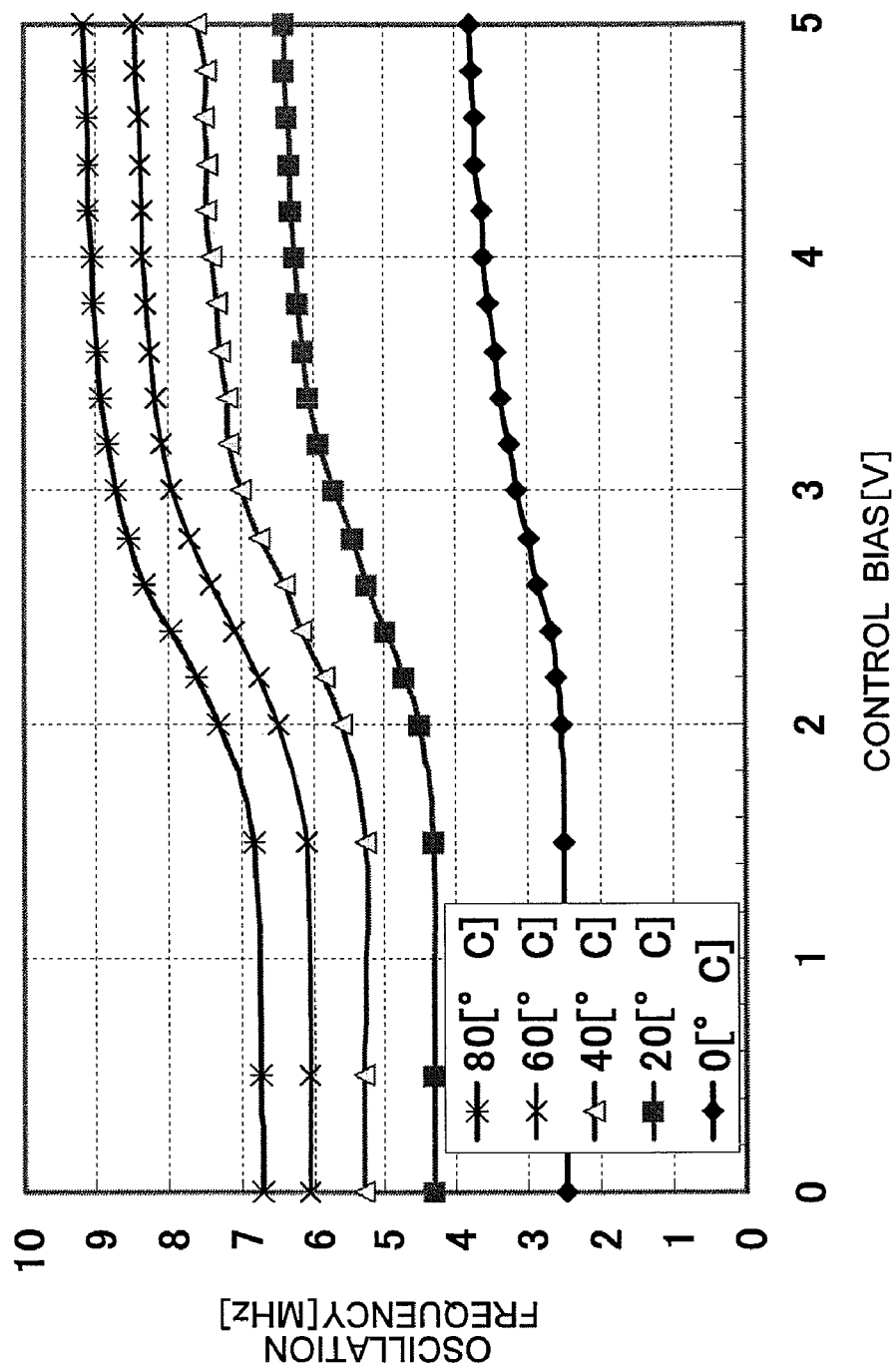
FIG. 40 is a graph showing a relation between the control bias and the oscillation frequency of the voltage controlled oscillator according to Example 3, when the bias for compensating the temperature characteristic is fixed and the temperatures are changed from 0 degrees to 80 degrees at 20-degree interval.
Figure 41:
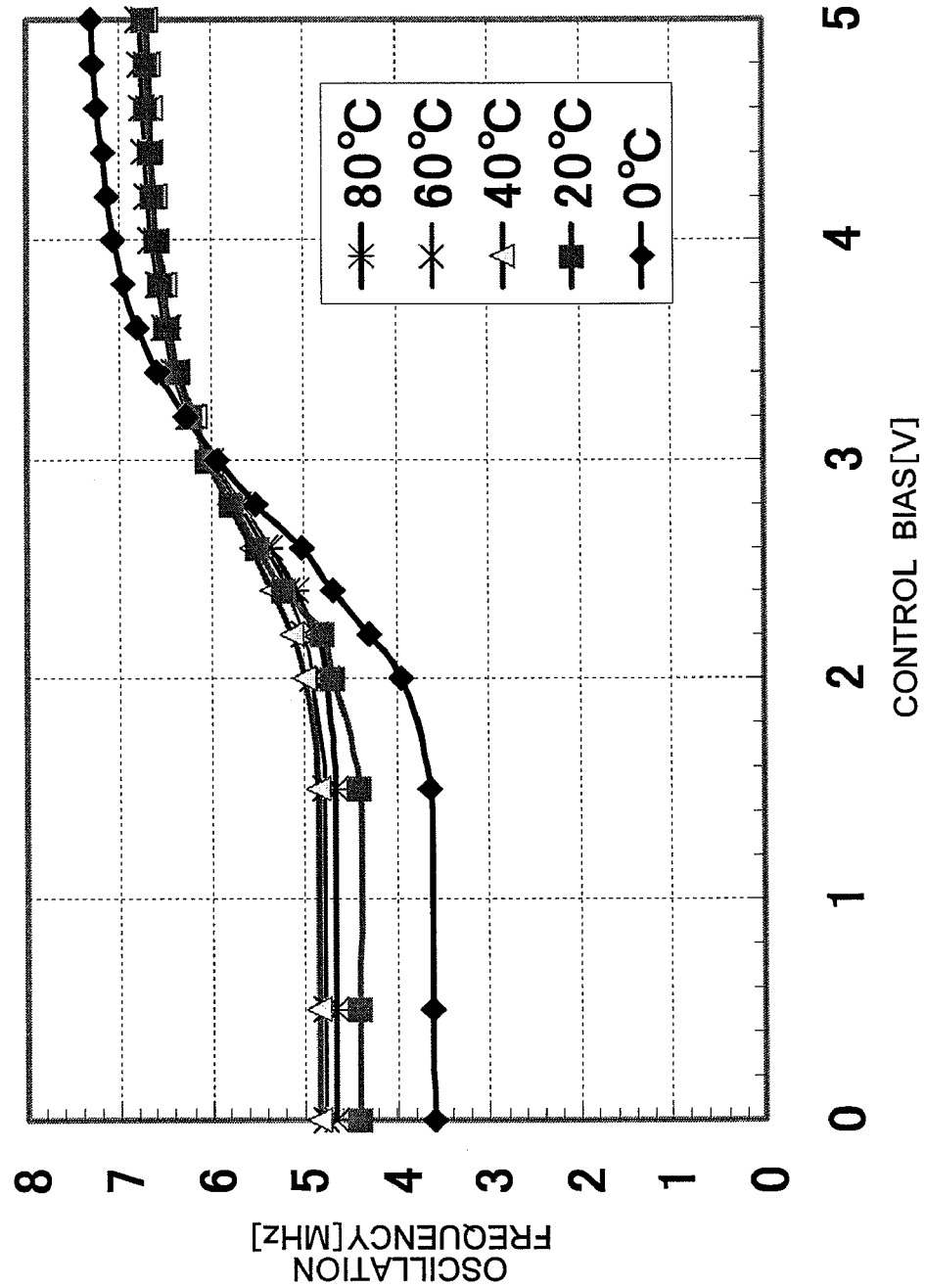
FIG. 41 is a graph showing a relation between the control bias and the oscillation frequency of the voltage controlled oscillator according to Example 3, when the bias for compensating the temperature characteristic is applied while changing the temperatures from 0 degrees to 80 degrees at 20-degree interval.

FIG. 38 is a circuit block diagram showing a voltage controlled oscillator according to Example 3 of the present invention. FIG. 39-FIG. 41 are graphs showing the relation between the control bias and the oscillation frequency in Example 3. Explanations will be provided hereinafter by referring to those drawings.

The structure of Example 3 is the same as that of Example 1, except for the point that the NMOS transistor 2f (FIG. 26) of Example 1 is replaced with a symmetrical load that is configured with NMOS transistors 2f, 2f', and the NMOS transistor 2g (FIG. 26) is replaced with a symmetrical load that is configured with NMOS transistors 2g, 2g'. Example 3 also uses a current-starved inverter as an inversion-type delay element, i.e., the delay generating part 11a of FIG. 3. An odd-number (for example, thirty-one) delay generating parts 11a form a closed loop. As in the case of FIG. 2, the PMOS transistors 1f and 1g configure a current mirror circuit. Further, the PMOS transistor 1f and the NMOS transistor 2j convert a current to a voltage. The bias B1 as the control bias for adjusting the frequency is applied to the NMOS transistor 2f. The bias B2 for compensating the temperature characteristic is applied to the NMOS transistor 2g. This structure can provide a voltage controllable oscillator that is capable of changing the oscillation frequency through controlling the control voltage to be applied to the current-starved inverter.

In Example 3, the NMOS transistors 2f' and 2g' are added in a form of diode-connection to configure the symmetrical loads together with the NMOS transistors 2f and 2g. The NMOS transistors 2f' and 2g' are added in order to obtain a property with which the current changes almost linearly with respect to the applied bias.

FIG. 39 shows a relation between the control bias and the oscillation frequency of Example 3. Referring to FIG. 39, the oscillation frequency changes almost linearly for the changes in the control bias in a range of 1.5 V to 4 V. There is almost no change in the oscillation frequency even if the control bias is changed when the control bias is less than 1.5 V, or 4 V or larger. Compared to Example 1 and Example 2, Example 3 is largely different in respect that the oscillation can be obtained even when the control bias is small.

In Example 3, there are some feature points that are largely different from Example 1 and the like. The first feature point to be mentioned specifically is that it is possible to obtain oscillation signals regardless of the value of the control bias. That is, oscillation can be obtained even if the control bias becomes small. Therefore, the oscillation signals can be obtained regardless of the value of the control bias, so that a stable operation can be performed. With the methods according to Example 1, Comparative Example 1, and Example 2, oscillation signals cannot be obtained when the control bias becomes smaller than a certain value. Therefore, when the control bias is shifted from a desired value for some reasons, the voltage controlled oscillator looses its function. In the meantime, it is possible with Example 3 to obtain the oscillation signal even when the control bias is shifted from a desired value, so that the voltage controlled oscillator can carry out its function.

The second feature point to be mentioned specifically is that the change in the oscillation frequency with respect to the change in the control bias is close to a linear form. That is, the oscillation frequency changes almost linearly when the control bias is in a range of 1.5 V to 4 V, so that it is extremely easy to control the oscillation frequency with the external bias. In other words, it is easy to control the oscillation frequency linearly. In a case where the oscillation frequency exhibits complicated changes for the control bias, it is necessary to keep the relation between the control bias and the oscillation frequency in a reference table (lookup table: LUT) or the like. In the meantime, when the oscillation frequency changes close to a linear form as in Example 3, no LUT or the like is required as long as a coefficient of the linear form is known.

The third feature point to be mentioned specifically is that the gain of the change in the oscillation frequency with respect to the change in the control bias is small. That is, the change in the oscillation frequency caused by the control bias is little less than ±20% with respect to the center frequency (for example, 6.1 MHz). This is extremely effective to be used for making adjustment without having a dramatic change in the oscillation frequency. Practically, the voltage controlled oscillator is used more often for a case where the oscillation frequency is changed by less than several times, e.g., within a range of several tens of percent to several percent, than a case where the oscillation frequency is changed by ten times.

FIG. 27 shows the result obtained at a room temperature (27 degrees C.). Next, changes in the property with respect to the temperatures were investigated. FIG. 40 shows a relation between the control bias (bias B1) and the oscillation frequency of Example 3 when the temperature was changed from 0 degrees C. to 80 degrees C. at 20-degree intervals, while the bias (bias B2) for compensating the temperature characteristic was fixed. As can be seen from FIG. 40, the oscillation frequency changes greatly between 2.5 MHz and 9.5 MHz, when the temperature changes. However, unlike the case of Example 1, oscillation can be still obtained under a small control bias (i.e., the first feature point mentioned above can be secured even if there is a change in the temperature). As described, under a condition where the temperature compensation is not performed, the oscillation frequency changes greatly when there is a large temperature change. Thus, it becomes difficult to use the oscillator stably.

In order to deal with such temperature changes, the present invention applies the temperature compensating bias. As in the case of FIG. 40, FIG. 41 shows a relation between the control bias (bias B1) and the oscillation frequency when the temperature was changed from 0 degrees C. to 80 degrees C. at 20-degree intervals, when the temperature characteristic was compensated by using the bias (bias B2) that compensates the temperature characteristic. In FIG. 41, applied is the temperature compensating bias that can provide almost a constant oscillation frequency when the control bias is 3 V, even if the temperature changes. As a result, the variation in the oscillation frequency when there is a temperature change becomes dramatically smaller compared to that of FIG. 40. Particularly, when Example 1 shown in FIG. 29 is compared with Example 3 shown in FIG. 41, variation in the tendency of the oscillation frequency with respect to the control bias at each temperature is smaller in FIG. 41. All the frequencies mostly fall within a range of 4.5 MHZ to 7.5 MHz, except for the area at 0 degree C. where the control bias is small. That is, it is possible with Example 3 to achieve the voltage controlled oscillator that can be used by paying almost no attention to the changes in the temperature.

Example 4

Figure 42:
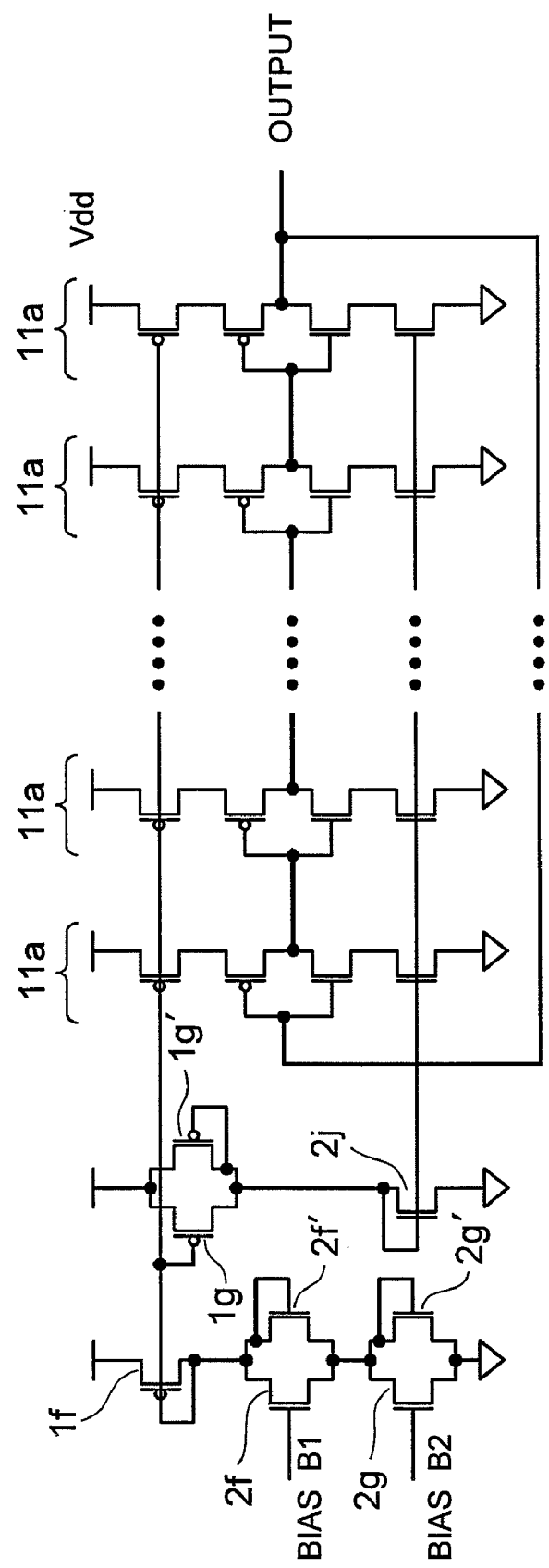
FIG. 42 is a circuit block diagram showing a voltage controlled oscillator according to Example 4.

FIG. 42 is a circuit block diagram showing a voltage controlled oscillator according to Example 4 of the present invention. FIG. 43-FIG. 46 are graphs showing the relation between the control bias and the oscillation frequency in Example 4. Explanations will be provided hereinafter by referring to those drawings.

The structure of Example 4 is the same as that of Example 1, except for the point that the NMOS transistor $2f$ (FIG. 26) of Example 1 is replaced with a symmetrical load that is configured with NMOS transistors $2f$, $2f'$, the NMOS transistor $2g$ (FIG. 26) is replaced with a symmetrical load that is configured with NMOS transistors $2g$, $2g'$, and the PMOS transistor $1g$ (FIG. 26) is replaced with a symmetrical load that is configured with PMOS transistors $1g$, $1g'$. Example 4 also uses a current-starved inverter as an inversion-type delay element, i.e., the delay generating part $11a$ of FIG. 3. An odd-number (for example, thirty-one) delay generating parts $11a$ form a closed loop. As in the case of FIG. 2, the PMOS transistors $1f$ and $1g$ configure a current mirror circuit. Further, the PMOS transistor $1f$ and the NMOS transistor $2j$ convert a current to a voltage. The bias B1 as the control bias for adjusting the frequency is applied to the NMOS transistor $2f$. The bias B2 for compensating the temperature characteristic is applied to the NMOS transistor $2g$. This structure can provide a voltage controllable oscillator that is capable of changing the oscillation frequency through controlling the control voltage to be applied to the current-starved inverter.

In Example 4, the NMOS transistors $2f'$ and $2g'$ are added in a form of diode-connection to configure the symmetrical loads together with the NMOS transistors $2f$ and $2g$, and the PMOS transistor $1g'$ is added in a form of diode-connection to configure the symmetrical load together with the PMOS transistor $1g$. The NMOS transistors $2f'$, $2g'$ and the PMOS transistor $1g$ are added in order to obtain a property with which the current changes almost linearly with respect to the applied bias. Particularly, when the PMOS transistor $1g'$ is added, the linearity of the junction part between the closed loop and the bias applying part (NMOS transistors $2f$, $2g$) can be improved as well.

Figure 43:
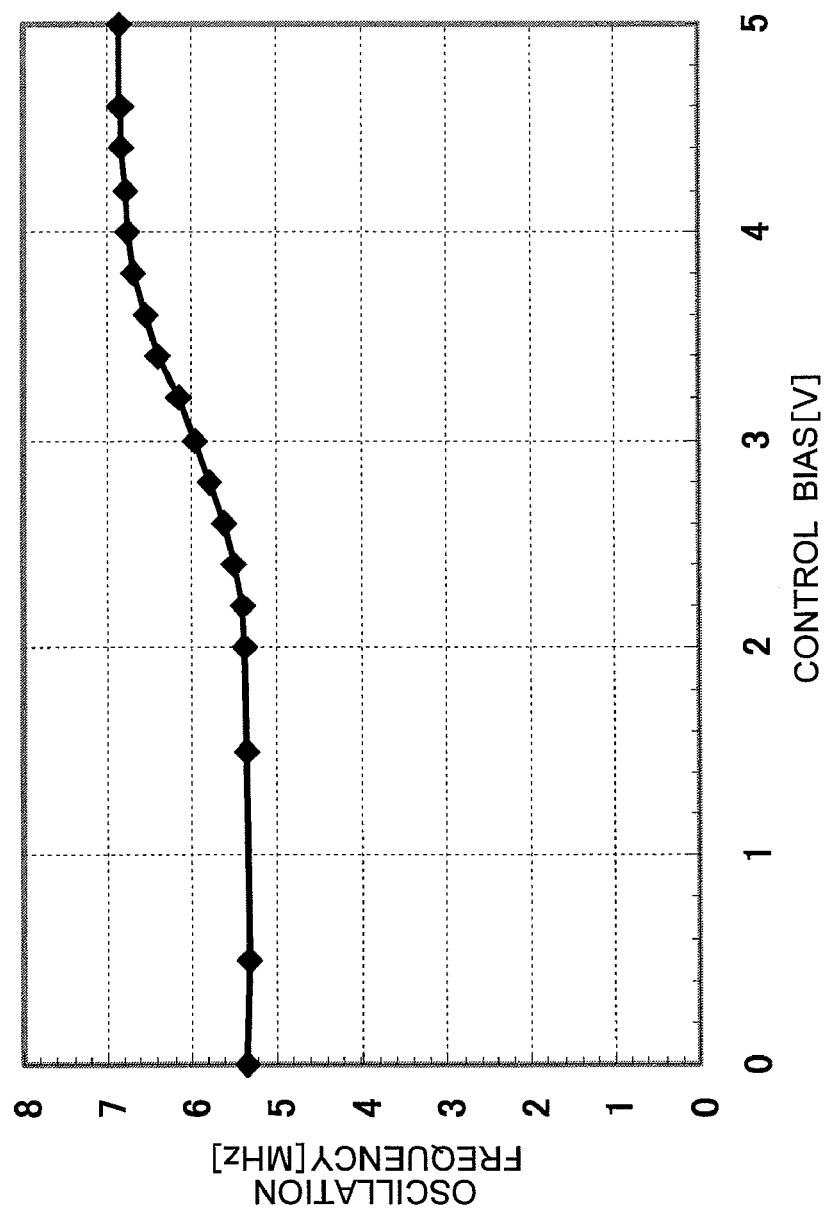
FIG. 43 is a graph showing a relation between a control bias and an oscillation frequency at a room temperature (27 degrees) regarding the voltage controlled oscillator according to Example 4.

FIG. 43 shows a relation between the control bias and the oscillation frequency of Example 4. Referring to FIG. 43, the oscillation frequency changes almost linearly in a range of 5.4 MHz to 6.8 MHz for the changes in the control bias in a range of 2 V to 4 V. There is almost no change in the oscillation frequency even if the control bias is changed when the control bias is less than 2 V, or 4 V or larger. Unlike the cases of Example 1 and Example 2, it is possible to obtain the oscillation even when the control bias is small.

As in Example 3, Example 4 has some feature points that are largely different from Example 1 and the like. The first feature point to be mentioned specifically is that it is possible to obtain oscillation signals regardless of the value of the control bias.

The second feature point to be mentioned specifically is that the change in the oscillation frequency with respect to the change in the control bias is close to a linear form. That is, the oscillation frequency changes almost linearly when the control bias is in a range of 2 V to 4 V, so that it is extremely easy to control the oscillation frequency with the external bias. In other words, it is easy to control the oscillation frequency linearly. Particularly, as can be seen from FIG. 43, the linearity is improved compared to that of Example 3.

The third feature point to be mentioned specifically is that the gain of the change in the oscillation frequency with respect to the change in the control bias is small. That is, the change in the oscillation frequency caused by the control bias is about ±10% with respect to the center frequency (for example, 6.1 MHz), which is a still smaller range. This is extremely effective to be used for making adjustment without having a dramatic change in the oscillation frequency.

Figure 44:
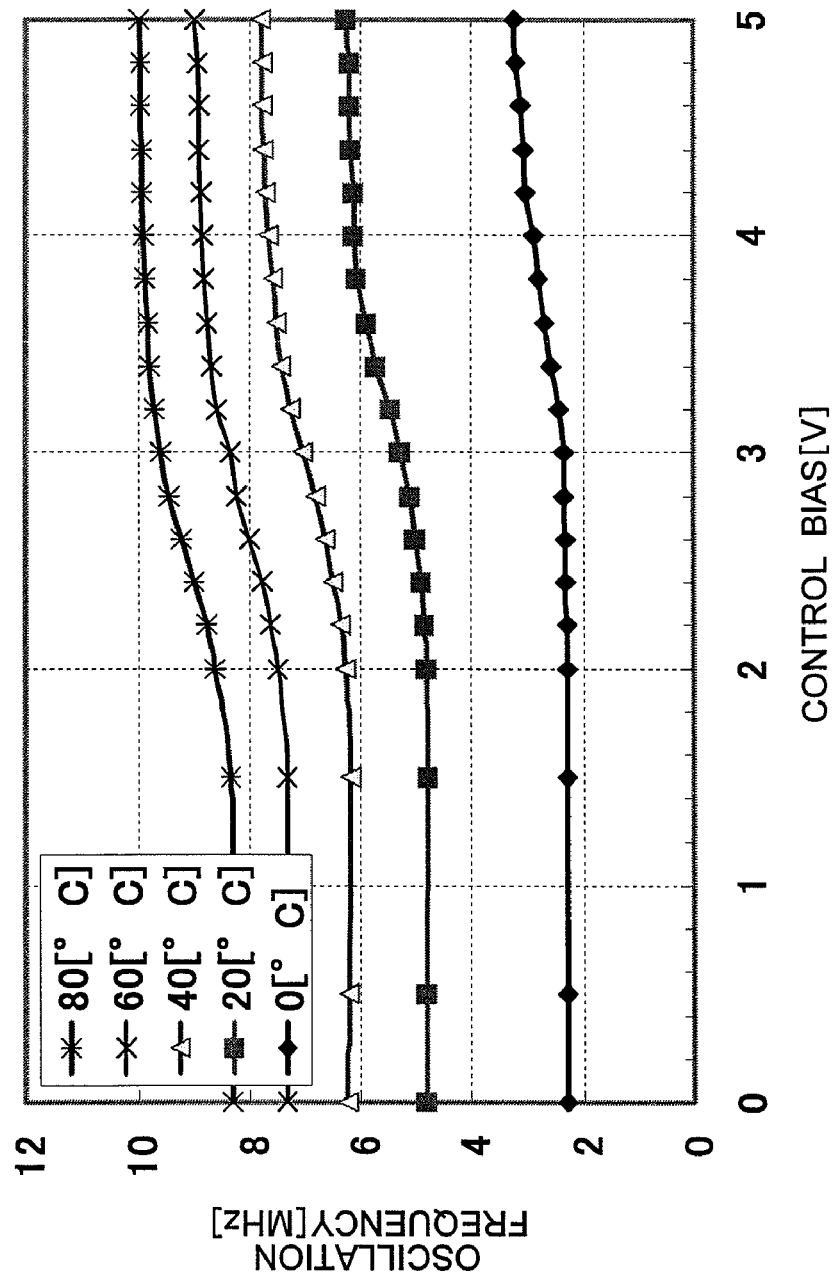
FIG. 44 is a graph showing a relation between the control bias and the oscillation frequency of the voltage controlled oscillator according to Example 4, when the bias for compensating the temperature characteristic is fixed and the temperatures are changed from 0 degrees to 80 degrees at 20-degree interval.

FIG. 43 shows the result obtained at a room temperature (27 degrees C.). Next, changes in the property with respect to the temperatures were investigated. FIG. 44 shows a relation between the control bias (bias B1) and the oscillation frequency of Example 4 when the temperature was changed from 0 degrees C. to 80 degrees C. at 20-degree intervals, while the bias (bias B2) for compensating the temperature characteristic was fixed. As can be seen from FIG. 44, the oscillation frequency changes greatly between 2 MHz and 10 MHz, when the temperature changes. As in the case of Example 3, oscillation can be still obtained under a small control bias (i.e., the first feature point mentioned above can be secured even if there is a change in the temperature). As described, under a condition where the temperature compensation is not performed, the oscillation frequency changes greatly when there is a large temperature change. Thus, it becomes difficult to use the oscillator stably.

Figure 45:
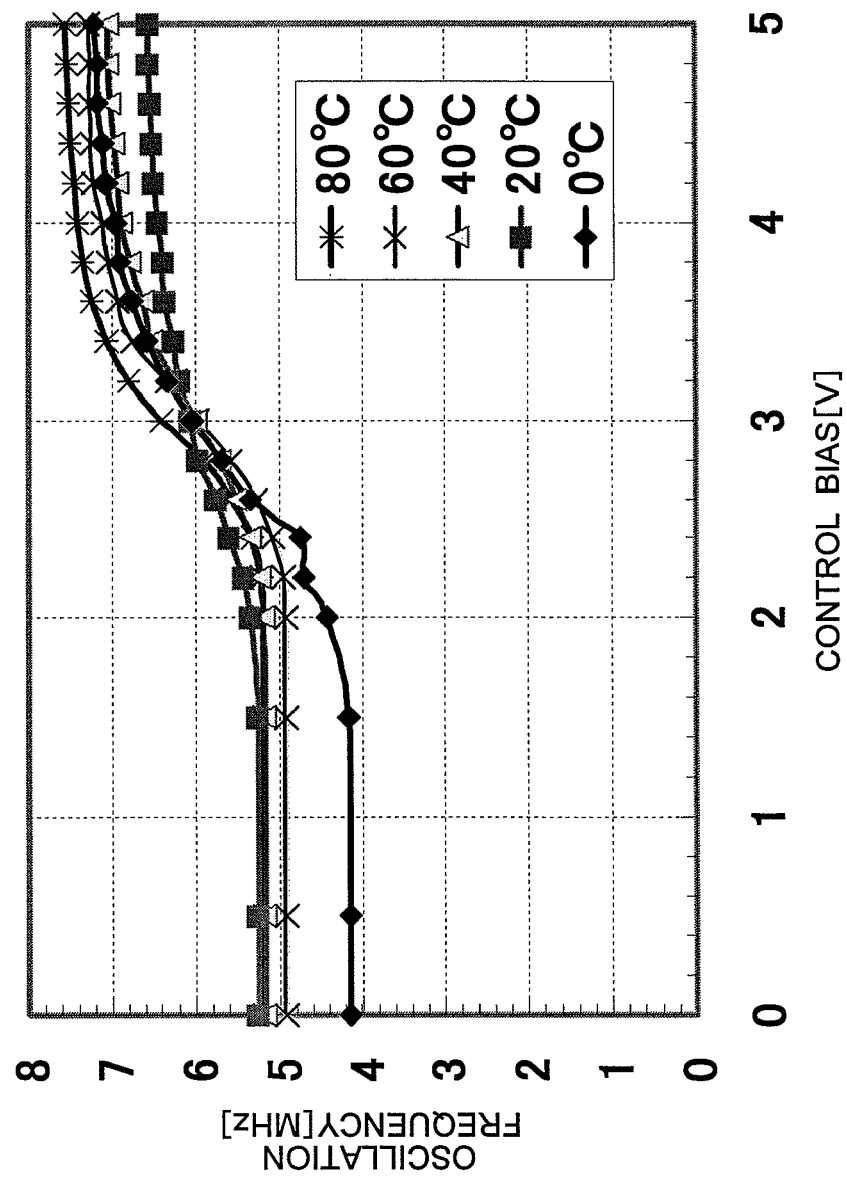
FIG. 45 is a graph showing a relation between the control bias and the oscillation frequency of the voltage controlled oscillator according to Example 4, when the bias for compensating the temperature characteristic is applied while changing the temperatures from 0 degrees to 80 degrees at 20-degree interval.

In order to deal with such temperature changes, the present invention applies the temperature compensating bias. As in the case of FIG. 44, FIG. 45 shows a relation between the control bias (bias B1) and the oscillation frequency when the temperature was changed from 0 degrees C. to 80 degrees C. at 20-degree intervals, when the temperature characteristic was compensated by using the bias (bias B2) that compensates the temperature characteristic. In FIG. 45, applied is the temperature compensating bias that can provide almost a constant oscillation frequency when the control bias is 3 V, even if the temperature changes. As a result, the variation in the oscillation frequency when there is a temperature change becomes dramatically smaller compared to that of FIG. 44. Particularly, when Example 1 shown in FIG. 29 is compared with Example 4 shown in FIG. 45, variation in the tendency of the oscillation frequency with respect to the control bias at each temperature is smaller in FIG. 45. All the frequencies mostly fall within a range of 5 MHZ to 7.5 MHz, except for the area at 0 degree C. where the control bias is small. That is, it is possible with Example 4 to achieve the voltage controlled oscillator that can be used by paying almost no attention to the changes in the temperature.

Figure 46:
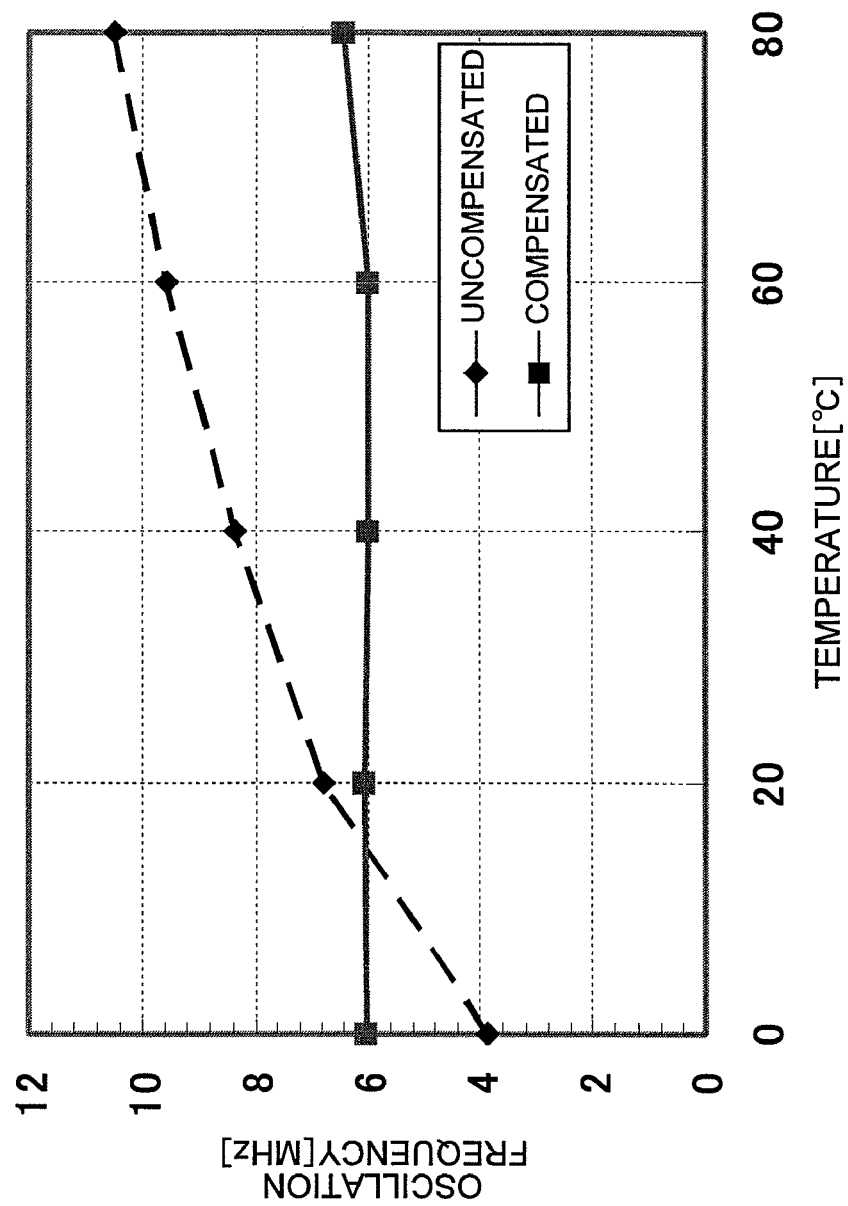
FIG. 46 is a graph showing a relation between the temperature and the frequency of the voltage controlled oscillator according to Example 4 regarding a case that uses the temperature compensating bias and a case that does not use the temperature compensating bias while the control bias is fixed at 2 V.

FIG. 46 shows relations between the temperature and the frequency for cases with and without applying the temperature compensating bias, while the control bias is fixed at 3 V. As can be seen from FIG. 46, the oscillation frequency changes almost by 2.5 times with the changes in the temperatures from 0 degree C. to 80 degrees C. when the temperature compensating bias is not applied, and no oscillation is obtained at 0 degree C. In the meantime, when the temperature compensating bias is applied, the oscillation frequency becomes stable at about 6 MHz, even if there is a change in the temperature.

Example 5

Figure 47:
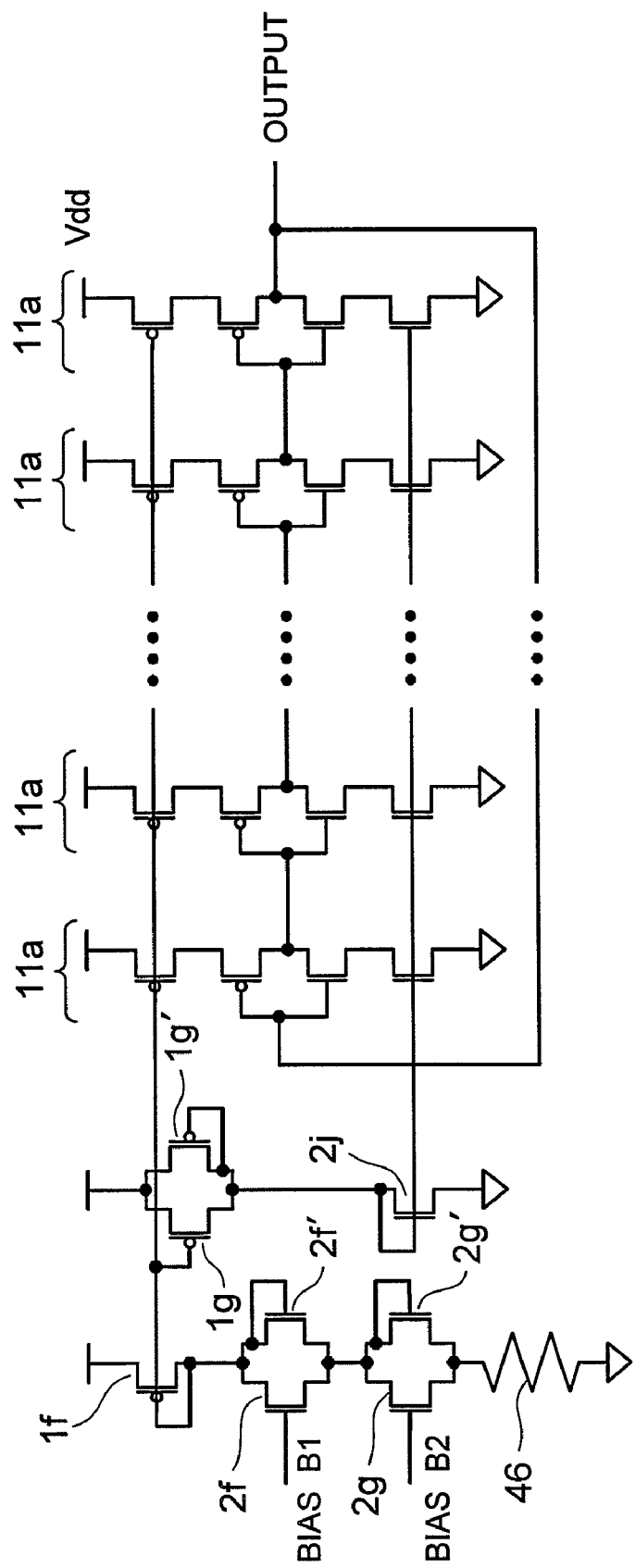
FIG. 47 is a circuit block diagram showing a voltage controlled oscillator according Example 5.
Figure 48:
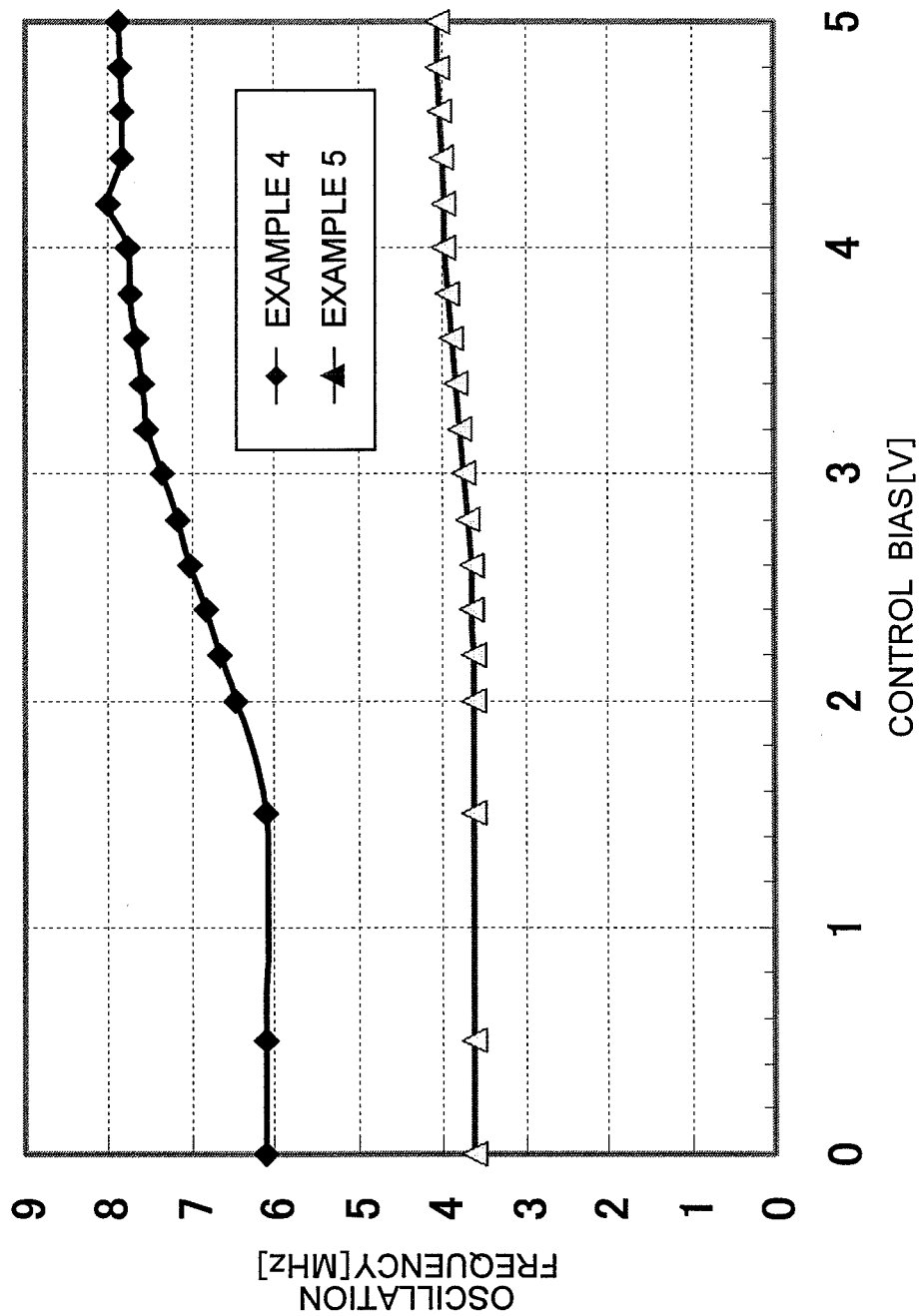
FIG. 48 is a graph showing a relation between a control bias and an oscillation frequency at a room temperature (27 degrees) regarding the voltage controlled oscillators according to Example 4 and Example 5.
Figure 49:
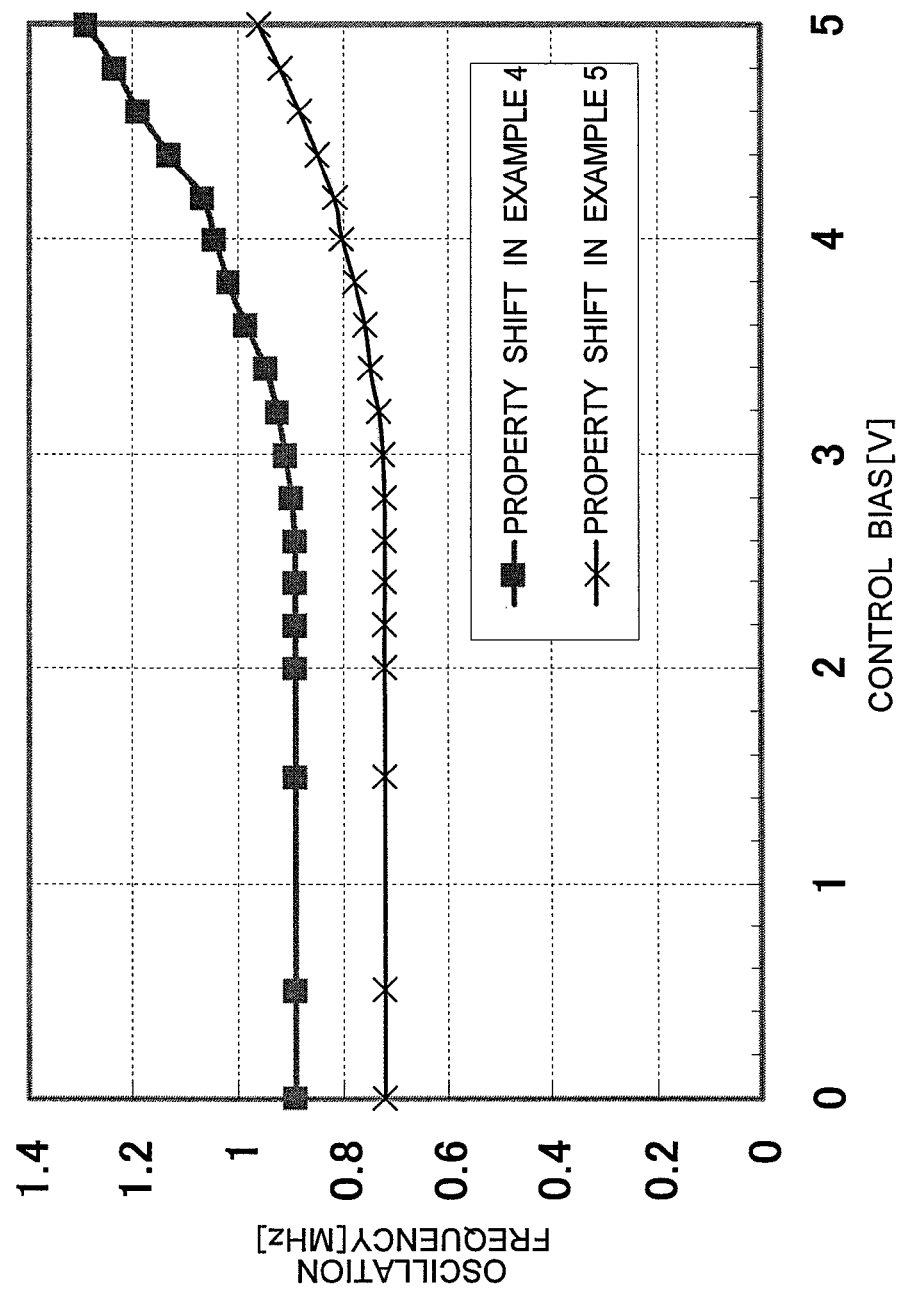
FIG. 49 is a graph showing a relation between the control bias and the oscillation frequency regarding the voltage controlled oscillators according to Example 4 and Example 5, when the transistors are deteriorated.

FIG. 47 is a circuit block diagram showing a voltage controlled oscillator according to Example 5. FIG. 48 and FIG. 49 are graphs showing relations between the control bias and the oscillation frequency of Example 5. Explanations will be provided hereinafter by referring to the drawings.

As described above, it is possible with the methods of Examples 1-4 to obtain extremely fine characteristics with respect to the case of Comparative Example 1. However, when the characteristic of the fabricated transistor is different from how it is designed (e.g., when there is a change in the characteristic due to manufacture variation or the like), the characteristic of the oscillation frequency comes to be largely different.

Example 5 can provide the voltage controlled oscillation that is also resistant to manufacture variations. According to the Inventors' evaluations, Comparative Example 1 is more resistant to the manufacture variations than Example 1. The reason for this may be considered as follows. That is, it is because the resistance used in Comparative Example 1 is likely to have smaller manufacture variations than the transistor used in Example 1. This is a difference generated due to manufacturing conditions.

That is, polysilicon to which carriers are doped with high concentration is normally used for the resistance element. In the meantime, carriers are doped within the channel of the transistor with a lower concentration than that of the resistance element. As a result, variations regarding the doped concentrations are relatively larger for the channel of the transistor than the resistance element. This relative difference is accelerated also by carrier activating processing, so that it is considered that the variation becomes more significant for the transistor than the resistance element.

Thus, Example 5 is designed to increase the resistibility for the manufacture variations by adding the resistance to Examples 1-4. FIG. 47 shows an example of a circuit obtained by adding the resistance 46 to the structure (FIG. 47) of Example 4. Here, added is the resistance 46 with a resistance value with which the oscillation frequency of Example 4 under a condition where the temperature compensating bias is 3 V and the control bias is 3 V becomes a half.

FIG. 48 shows a relation between the control bias and the oscillation frequency in cases of Example 4 (FIG. 42) and Example 5 (FIG. 47). By adding the resistance 46, the oscillation frequency of Example 5 becomes about a half the oscillation frequency of Example 4. However, the following features to be mentioned specifically that are described in Example 4 are secured: (1) oscillation signals can be obtained regardless of the control bias; (2) the change in the oscillation frequency is in a linear form with respect to the change in the control bias; (3) gain of the change in the oscillation frequency with respect to the change in the control bias is small.

Properties of Example 4 and Example 5 when the characteristics of the transistors are largely deteriorated will be shown in the followings. Deterioration of the transistor shown herein is a larger deterioration than the deterioration normally measured, and it is considered a special case. Through observing the properties under such special deterioration, it is possible to see the resistibility of each circuit for the changes in the transistor characteristics. As the deteriorations in the transistor, a decrease in the threshold value of the PMOS transistor and an increase in the current within the leak area were observed in particular.

After such deteriorations, the properties in FIG. 48 changed to the properties as shown in FIG. 49. FIG. 49 shows the oscillation frequencies obtained after the deteriorations as the shift in the properties. Regarding the case of Example 4, the oscillation frequency after the deteriorations becomes about one seventh of the original oscillation frequency. In the meantime, the oscillation frequency after the deteriorations in the case of Example 5 becomes about one fifth of the original oscillation frequency. As a result, the difference between the frequencies of Example 4 and Example 5 after the deteriorations is extremely small. Specifically, while the ratio of the frequencies under the control bias of 3 V was 2:1 for Example 4 and Example 5, it turned to 1.26:1 after the deteriorations. As described, Example 5 does not face a large property change even when there is a deterioration or variation in the characteristic of the transistor, due to the use of the resistance.

Figure 50:
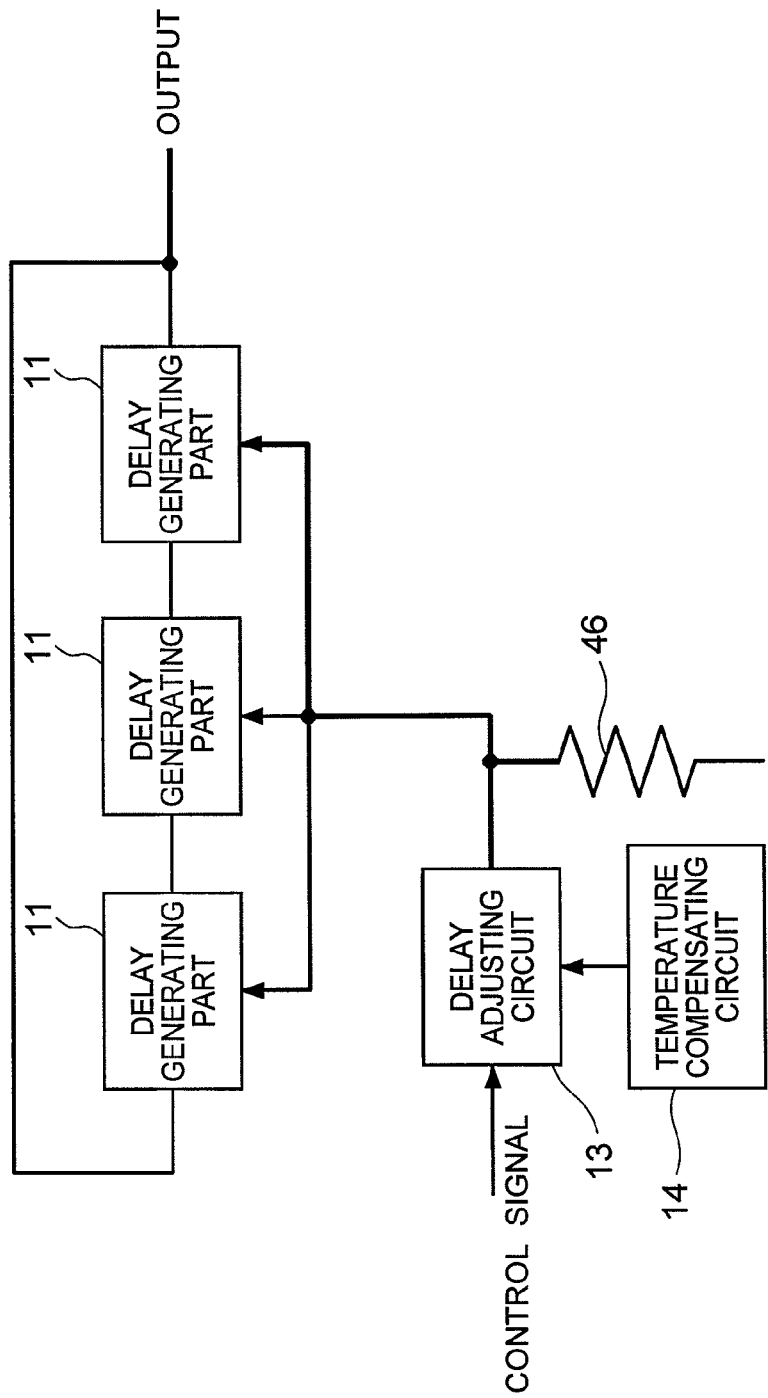
FIG. 50 is a block diagram showing a first example of a resistance adding method according to Example 5.
Figure 51:
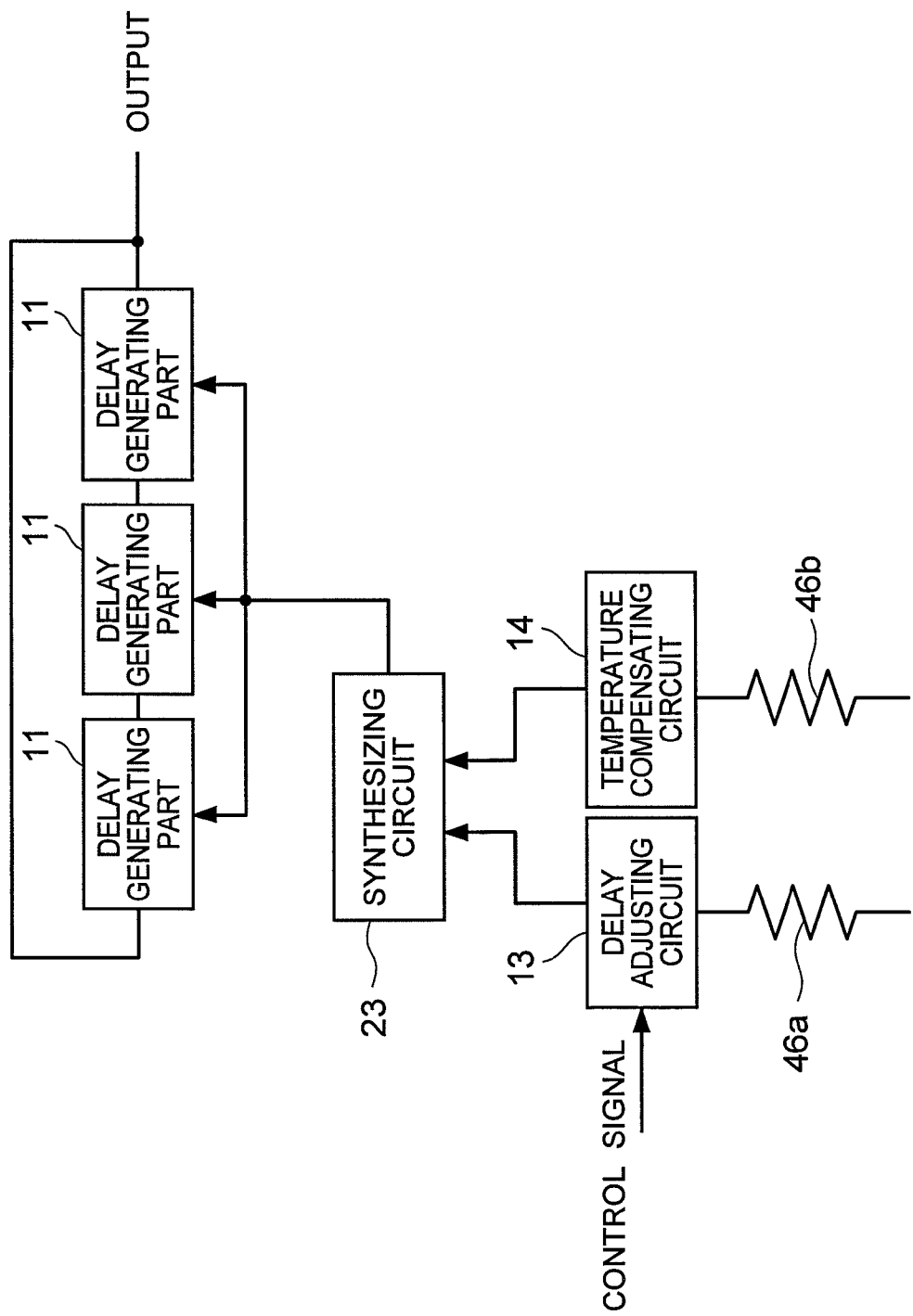
FIG. 51 is a block diagram showing a second example of a resistance adding method according to Example 5.
Figure 52:
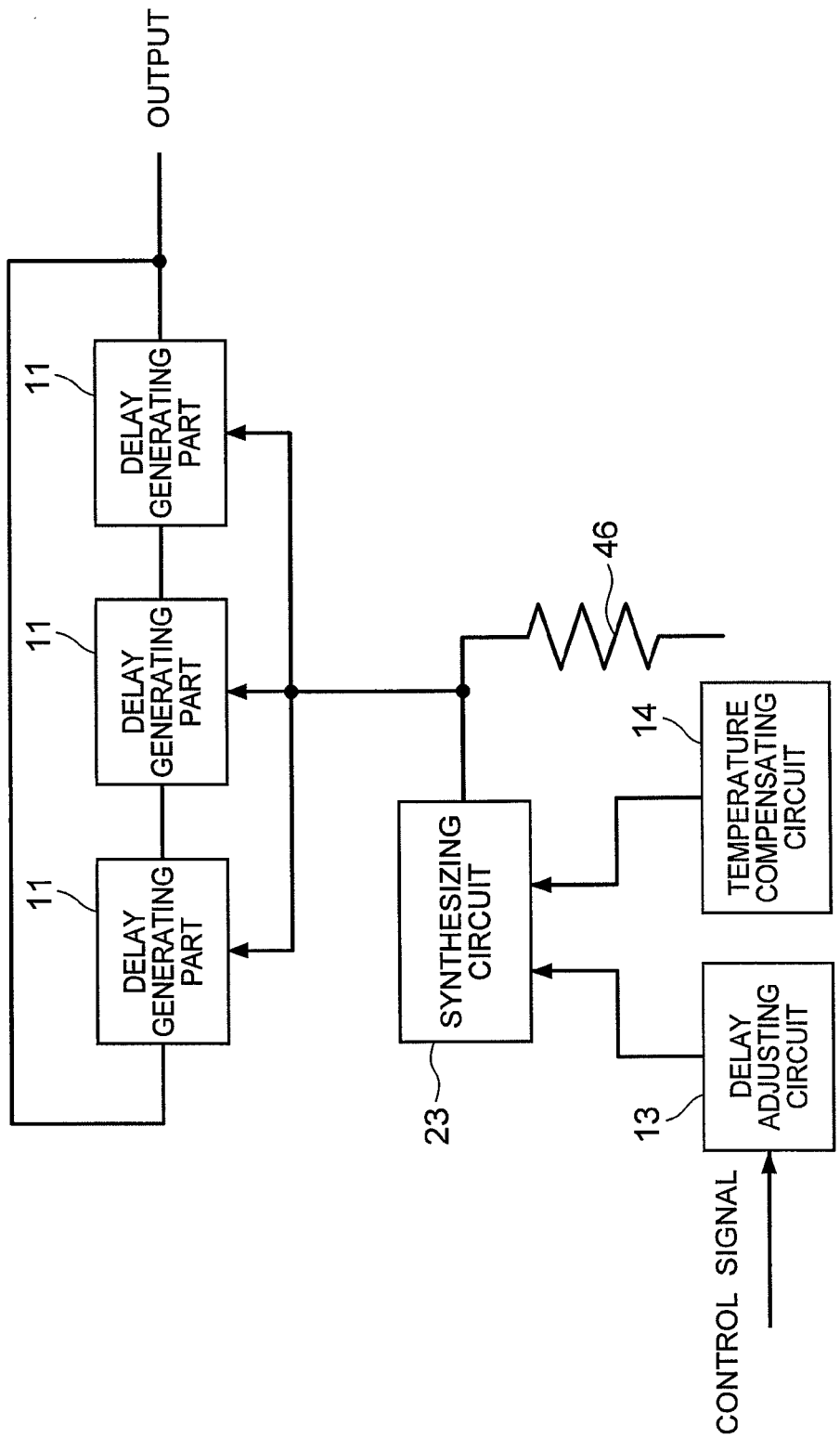
FIG. 52 is a block diagram showing a third example of a resistance adding method according to Example 5.

The resistance connecting method shown in Example 5 is merely an example, and there are other various methods as follows. Note here that the delay adjusting circuit is also called a frequency control circuit. FIG. 50 shows an example where the resistance 46 is connected in parallel to the circuit in which the delay adjusting circuit 13 and the temperature compensating circuit 14 are connected in series. FIG. 51 shows an example where resistances 46a, 46b are connected in series, respectively, to the delay adjusting circuit 13 and the temperature compensating circuit 14 which are connected in parallel as the circuit. The resistances 46a, 46b may also be connected, respectively, between the synthesizing circuit 23 and the delay adjusting circuit 13 and between the synthesizing circuit 23 and the temperature compensating circuit 14. FIG. 52 shows an example where the resistance 46 is connected in parallel to the circuit in which the delay adjusting circuit 13 and the temperature compensating circuit 14 are connected in parallel.

It is also possible to apply Example 2 to the structures of Example 3-Example 5. That is, it is possible to employ a structure that uses the multi-gate transistor, while using the symmetric load. For example, the multi-gate transistor may be used for the transistor within the symmetric load or for the diode-connected transistor. With this, the property can be improved further.

Example 6

Figure 53:
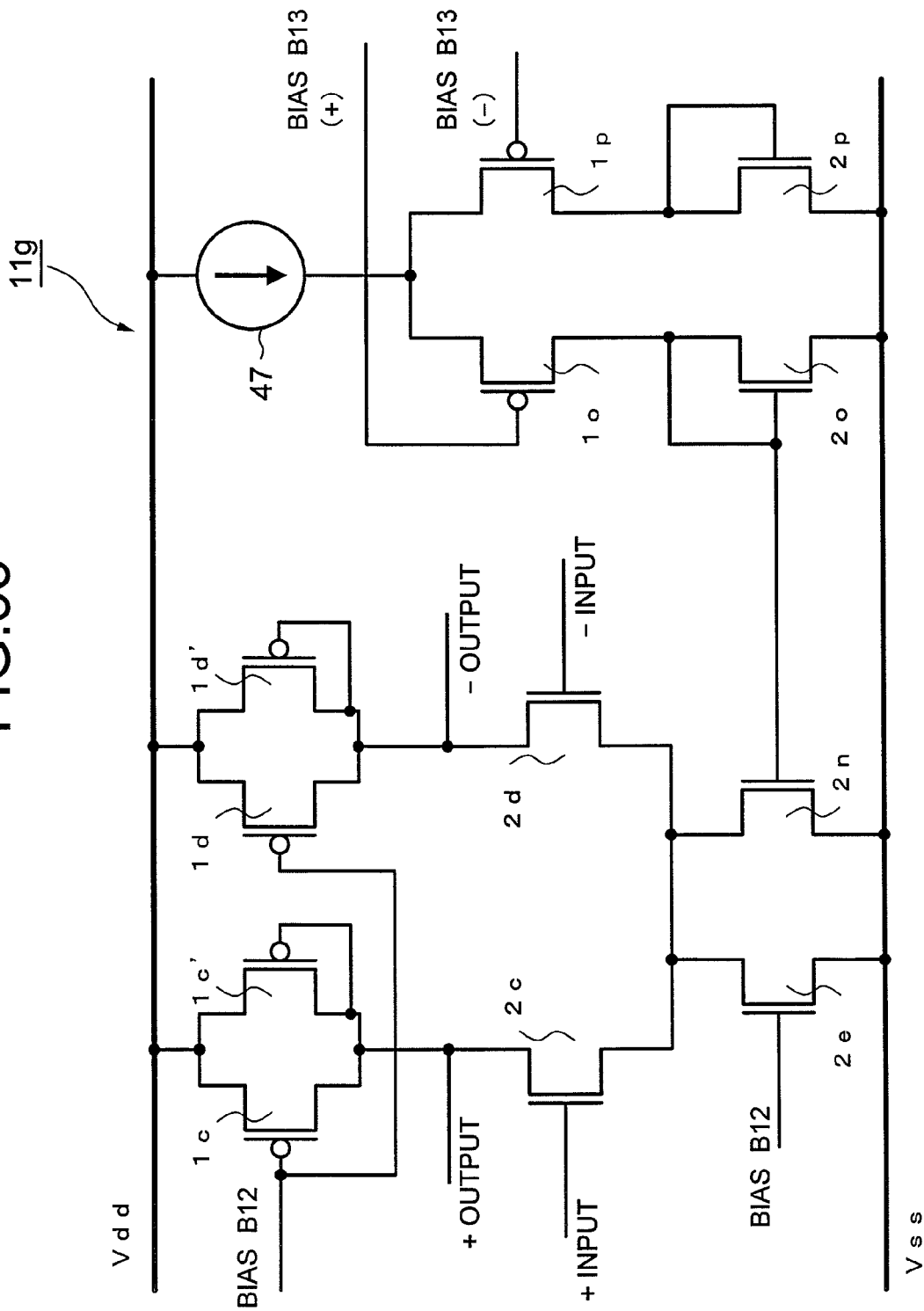
FIG. 53 is a circuit block diagram showing a part of a voltage controlled oscillator according to Example 6.

FIG. 53 is a circuit block diagram showing a part of a voltage controlled oscillator according to Example 6 of the present invention. Explanations will be provided hereinafter by referring to the drawing.

With Example 6, two control biases are used to control the frequency in order to perform frequency control with the control bias by a still smaller unit. In Example 6, the delay generating part 11g having differential inputs is used to form the voltage controlled oscillator in the structure shown in FIG. 18. However, unlike the case of FIG. 18, two kinds of biases B11 and B12 are used as the control biases for controlling the oscillation frequency.

FIG. 53 is an illustration showing the delay generating part 11g that is capable of controlling the frequency by using the two control biases. This circuit is formed between a high-voltage side power supply Vdd and a low-voltage side power supply Vss (may be a ground, for example). The left side of FIG. 53 is the delay generating part having a same differential input part as that of FIG. 8. However, there are differences regarding two points as follows. The first point is that a same symmetrical load as that of FIG. 42 is configured by adding PMOS transistors 1c', 1d' to the PMOS transistors 1c, 1d. The second point is that there is a bias B13 applied as a bias for controlling the frequency via an additional NMOS transistor 2n or the like, in addition to the bias B11 applied to the NMOS transistor 2e.

The bias 13 is applied to PMOS transistors 1o and 1p as a differential signal. The bias to be applied to the NMOS transistor 2n is determined by a constant-current supply 47, the PMOS transistors 1o, 1p, and NMOS transistors 2o, 2p. The NMOS transistors 2o and 2p configure a current mirror circuit. The channel width of the NMOS transistor 2n is larger than the channel width of the NMOS transistor 2o by Xm times, for example. The ratio of current by the current mirror circuit changes depending on the ratio of the sizes. With this structure, the delay amount of the delay generating part 11g can be adjusted more delicately than the amount adjusted with the bias 11. That is, the bias 11 is used for rough adjustment of the frequency, and the bias 13 is used for fine adjustment of the frequency. The bias 12 is used for compensating the temperature.

The structure of Example 6 makes it possible to perform rough adjustment and fine adjustment of the frequency. The adjustment width of the fine adjustment depends on the channel-width ratio Xm, a current Itune flowing in the NMOS transistor, a current Ibias flowing in the constant-current supply, and the linearity of the current-voltage conversion. Normally, for the structure where the frequency range is changed by twice or more with the rough adjustment, the values of Xm and the like are so set that the frequency can be adjusted within a range of ±10% or less with the fine adjustment.

While Example 6 uses the delay generating part 11g having the differential inputs, it is also possible to use a delay generating part of another structure.

Example 7

Figure 54:
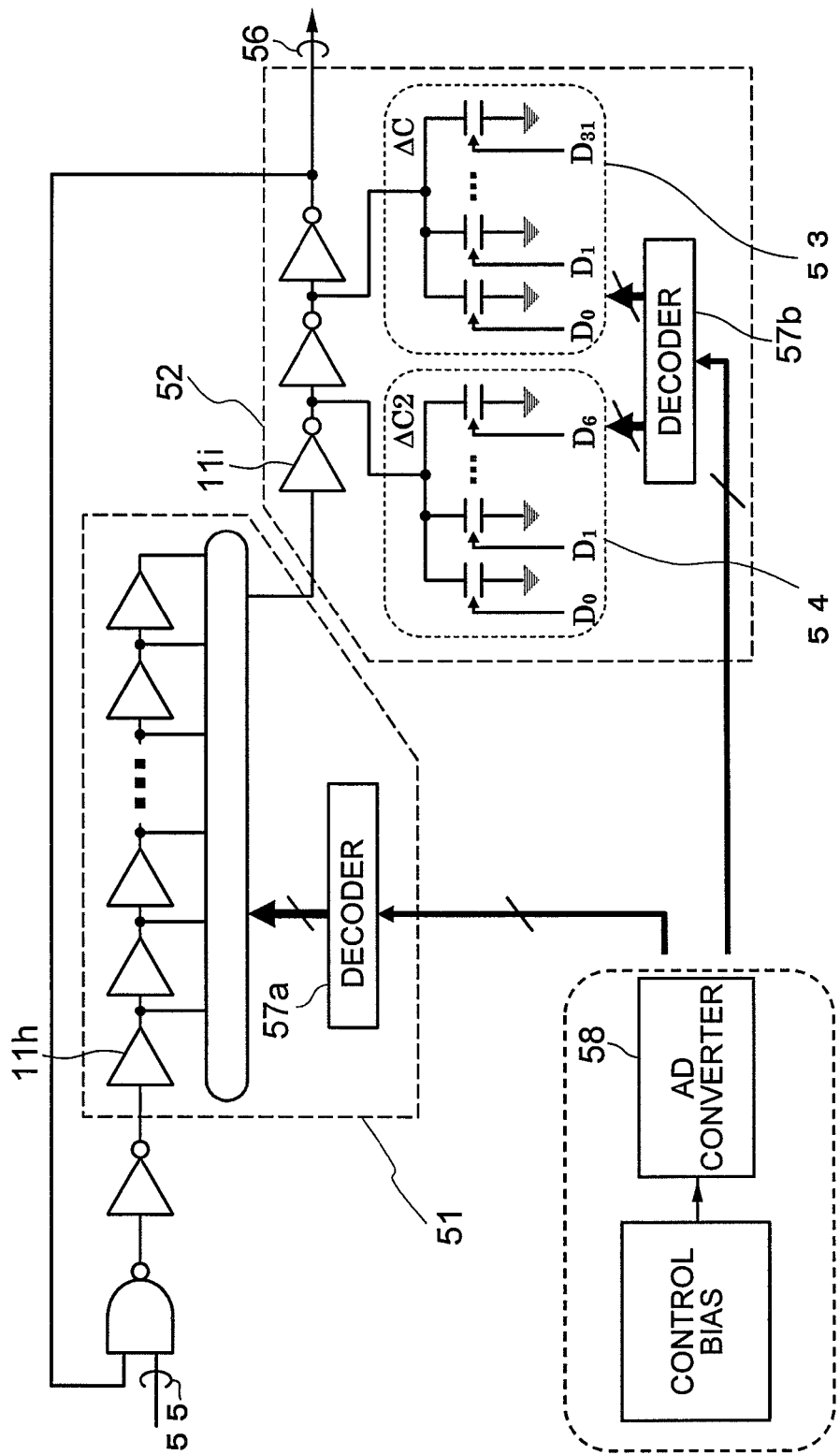
FIG. 54 is a circuit block diagram showing a voltage controlled oscillator according to Example 7.

FIG. 54 is a circuit block diagram showing a voltage controlled oscillator according to Example 7. Explanations will be provided hereinafter by referring to the drawings.

Each of Examples has shown the method for controlling the frequency with the control biases mainly by analog signals. However, Example 7 is a case where the frequency is controlled by digital signals. A voltage controlled oscillator of Example 7 includes a rough adjustment stage 51 and a fine adjustment stage 52. The rough adjustment stage 51 determines the frequency roughly, and the fine adjustment stage 52 determines the frequency in a fine manner. A part of each of those two stages is formed to configure a closed loop, so that an oscillation output can be obtained. Example 7 is configured to form a closed loop when an enable signal 55 is applied. Thus, no oscillation output is obtained while the enable signal 55 is not being applied. That is, there is almost no power consumption during that period. A block shown with a dotted line in the bottom left side of FIG. 54, which is configured with a control bias and an AD converter 58, is a block added when Example 7 is used with analog signals. It is not used when the frequency is controlled with digital signals.

Control with the digital signals is carried out as follows. That is, seven higher-order bits out of a control signal of fifteen bits, for example, are inputted to a decoder 57 of the rough adjustment stage 51. For example, lower-order 8 bits are inputted to a decoder 57 of the fine adjustment stage 52. With this structure, rough adjustment and fine adjustment are carried out.

Paying attention to the rough adjustment stage 51, this part configures a delay line by having a plurality of delay generating parts 11h (illustrated in the drawing as inverters) connected in series. It is structured to take out a necessary delay amount according to the control signal. The higher-bit signal of 7 bits, for example, for the rough adjustment is decompressed to 128 bits in the decoder 57. This can be achieved by connecting a path with a delay amount that corresponds to the control bit by a path selection circuit of 128:1.

The delay amount taken out from the rough adjustment stage 51 receives a small delay amount added at the fine adjustment stage 52. The fine adjustment stage 52 is formed by serially connecting two delay generating parts 11i to which a capacitance load is added (one stage of delay generating parts are connected thereafter). A plurality of capacitances in accordance with the number of bits are arranged in parallel for the capacitance loads, and the extent of the capacitance can be selected by switches. With this, first and second fine adjustment devices 53 and 54 are configured.

The second fine adjustment device 54 in the fine adjustment stage 52 handles the high-order bits, and the first fine adjustment device 53 in the fine adjustment stage 52 handles the low-order bits. That is, the fine adjustment stage is divided into the first fine adjustment device and the second fine adjustment device for making it possible to select the delay amount more delicately. In the second fine adjustment device 54, seven capacitances D0-D6 are provided as the capacitance loads for the high-order 7 bits out of the low-order 8 bits of the control signal, for example. In the meantime, in the first fined adjustment stage 53, thirty-two capacitances D0-D31 are provided as the capacitance loads for the number of bits obtained by dividing the low-order 1 bit out of the low-order 8 bits of the control signal, for example, into 32 bits.

A capacitance value ΔC2 of the capacitance load of the second fine adjustment device 54 is set as thirty-two times as a capacitance value ΔC of the capacitance load of the first fine adjustment device 53, for example. With this structure, it is possible with the first adjustment device 53 to control the delay amount still more delicately. For achieving such operations, the decoder 57 in the fine adjustment stage 52 converts the inputted 8-bit signal to a signal of high-order 7 bits and a signal of 32 bits obtained by dividing the low-order 1 bit into 32 bits.

Such delay devices configured in this manner are connected to form a closed loop with the enable signal 55 so as to output an oscillator output 56 as the voltage controlled oscillator. Even though it is not so illustrated to avoid complication, a temperature compensating bias can be added according to each of the exemplary embodiments and Examples described above. With this, temperature compensation can be carried out as well. With the structure described above, it is possible to adjust the oscillation frequency in an extremely fine manner as in the case of using the analog signals, even when the oscillation frequency is controlled with the digital signals that are easily generated than the analog signals.

Example 8

Figure 55:
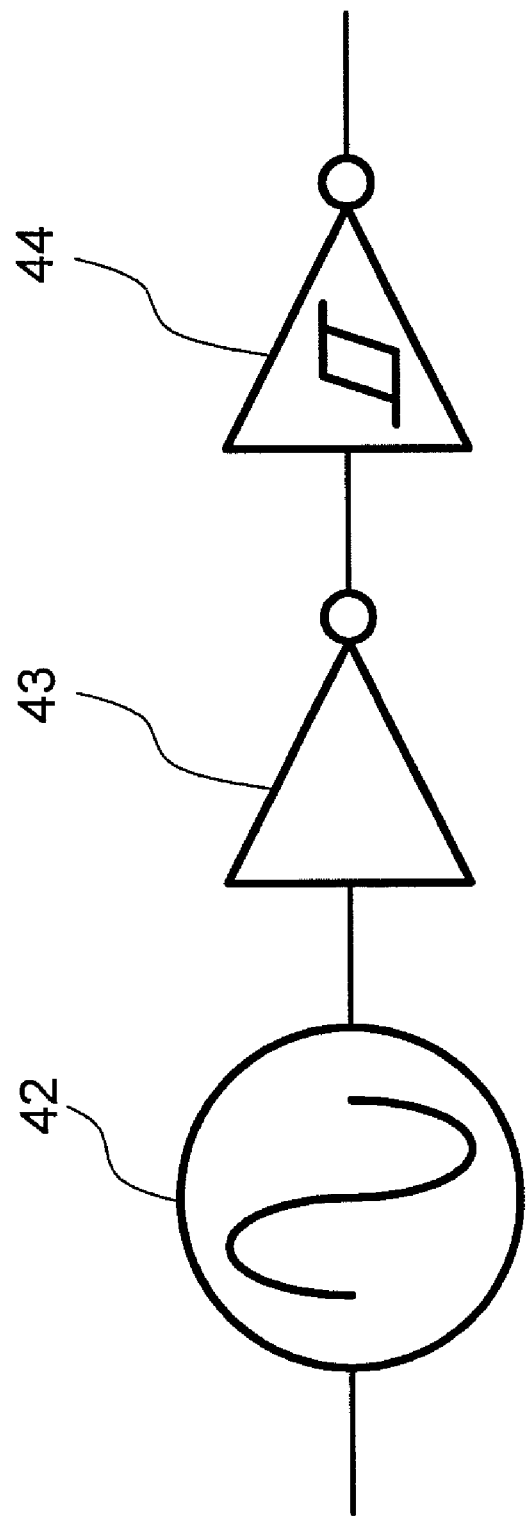
FIG. 55 is a circuit block diagram showing a voltage controlled oscillator according to Example 8.

FIG. 55 is a circuit block diagram showing a voltage controlled oscillator according to Example 8. Explanations will be provided hereinafter by referring to the drawings.

The voltage controlled oscillator of Example 8 has an inverter 43 and a Schmitt trigger 44 connected on the output side of a voltage controlled oscillator 42 according to one of the exemplary embodiments and Examples described above. The waveform of the output from the voltage controlled oscillator 42 may not be shaped sufficiently sometimes. Thus, the output of the voltage controlled oscillator 42 is connected to the inverter 43 and the Schmitt trigger 44 for shaping the waveform. The Schmitt trigger 44 exhibits a response having a hysteresis characteristic. Thus, with the circuit structure of Example 8, the waveform of the output from the voltage controlled oscillator 42 can be shaped into a clock signal of 50% duty, etc. Further, the duty ratio of the output signal can be changed freely by adjusting the hysteresis characteristic of the Schmitt trigger 44.

Example 9

Figure 57:
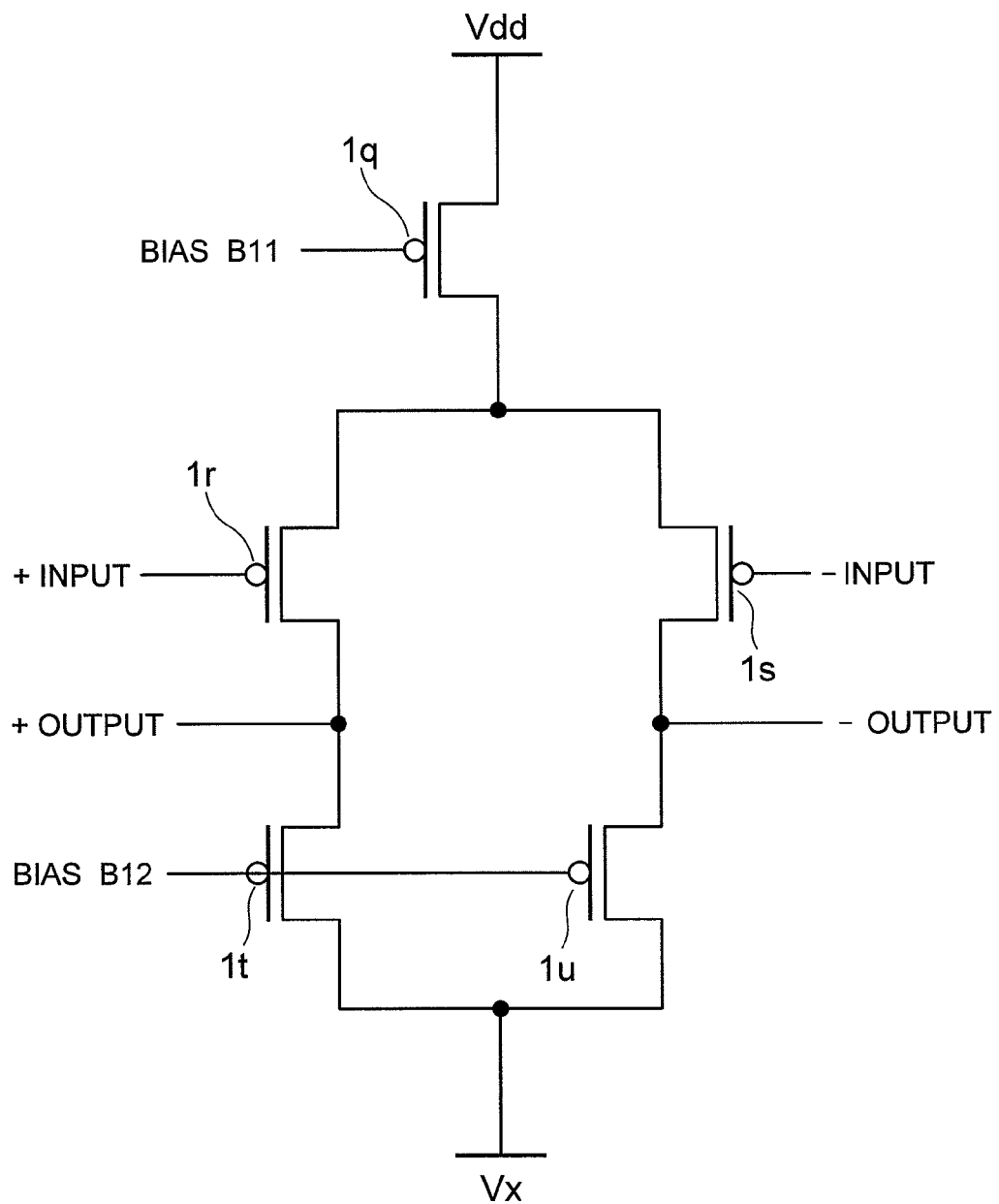
FIG. 57 is a circuit block diagram showing a delay generating part according to Example 12.

The voltage controlled oscillator according to one of the exemplary embodiments and Examples described above can be used for generating a reference clock inside an apparatus. This reference clock can be used as a clock RCK of a circuit as shown in FIG. 57, for example. With this structure, a reference clock generating circuit can also be formed in the apparatus, so that it is unnecessary to provide an element for the reference clock (for example, a quartz oscillator with a temperature compensator) which is required to be provided externally with a conventional circuit.

Example 10

Figure 56A:
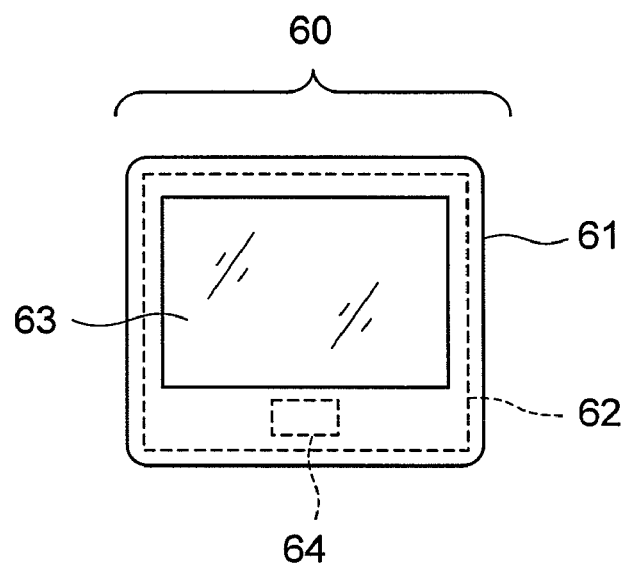
FIG. 56A is a plan view showing a display device according to Example 10 of the present invention.

FIG. 56A is a plan view showing a display device according to Example 10. Explanations will be provided hereinafter by referring to the drawings.

A display device 60 of Example 10 is, for example, an LCD (Liquid Crystal Display), or an OLED (Organic Light Emitting Diode) display, and it has a functional circuit unit 62 and a display unit 63 formed integrally within a casing 61. A voltage controlled oscillator 64 according to one of the exemplary embodiments and Examples described above is provided to the functional circuit unit 62.

With Example 10, necessary clock signals can be generated within the display device 60. Further, it is possible to set the duty ratio of the clock signal to be a value other than 50%, and a clocked inverter and the like which are used often in the display device 60 can be driven stably. Further, when the display unit 63 and the like of the display device 60 and the like have temperature dependency, a temperature control bias can be used such that the clock signals change in the same manner in accordance with the temperature dependency of the display unit 63, other than employing the method which controls the clock signals so as not to be changed by the temperatures. In that case, the frequency of the entire display device 60 comes to change in accordance with the changes in the temperature of the display unit 62.

Further, it is also possible to generate a signal for compensating the temperature dependency of the display unit 63 simultaneously with generation of the clock signal. That is, it is possible to generate a compensating bias for the temperature dependency of the display unit 63 at the point when generating the temperature compensating bias for the voltage controlled oscillator 60. As a method for generating the compensating bias, the technique disclosed by the Inventors of the present invention in Japanese Unexamined Patent Publication 2006-071564 (Patent Document 2) and the like can be utilized. With this, the clock signal can be stabilized for changes in the temperature, while keeping the frequency of the entire display device 60. At the same time, it is possible to lighten the temperature dependency of the display unit 63 so as to stabilize the property of display and the like.

Example 11

Figure 56B:
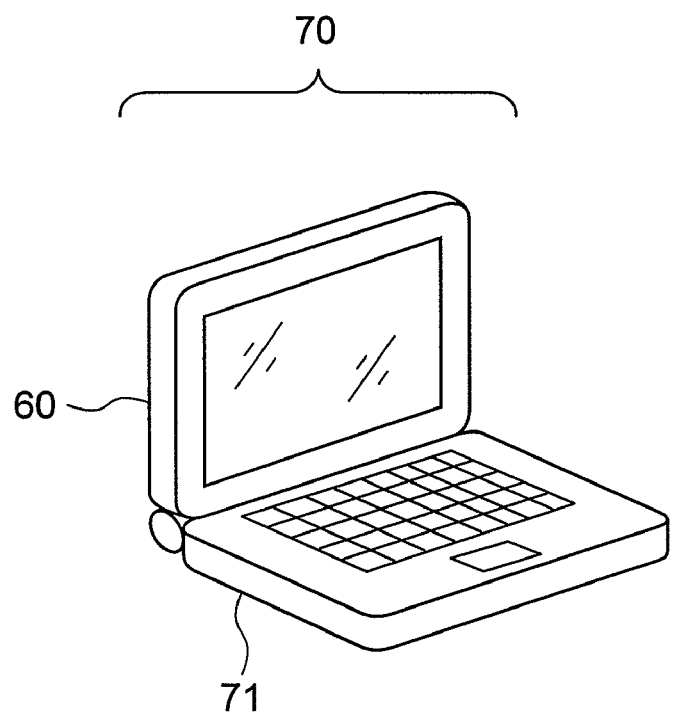
FIG. 56B is a perspective view showing a system according to Example 11 of the present invention.

FIG. 56B is a perspective view showing a system according to Example 11. Explanations will be provided hereinafter by referring to FIG. 56A and FIG. 56B.

A system 70 of Example 11 is a notebook-type personal computer, for example, including the display device 60 according to Example 10 as one of the structural modules. That is, the system 70 includes the display device 60 and a main body 71. The main body 71 is in a typical structure which has a microcomputer, a hard disk, a keyboard, and the like.

The system 70 of Example 11 to which the display device 60 having the voltage controlled oscillator 64 is loaded normally requires no external reference clock. Thus, it is unnecessary to transmit the reference clock. Further, amplification processing is unnecessary, when the reference clock has small amplitude. Therefore, the system 70 can have a simplified structure and have reduced power consumption. Further, it is possible to have the reference clock connected only when calibrating the system 70 so as to correct the reference value of the oscillation frequency. The reference value for the calibration is stored to a memory inside the system 70, and the oscillation frequency can be controlled based on the reference value stored to the memory for a normal operation after the calibration is completed. That is, the control bias is controlled based on the reference value, so that the oscillation frequency can be in the calibrated value.

When there is a change in the temperature, a temperature compensating bias is generated automatically, and the temperature is compensated internally. For generating the temperature compensating bias, the technique disclosed by the Inventors of the present invention in Patent Document 2 or other various kinds of techniques, for example, can be used as the temperature sensor for monitoring the temperature. As in the case of the control circuit with a response speed of the temperature sensor disclosed in Patent Document 2, the control circuit of the voltage controlled oscillator 64 can be configured by utilizing the output of the temperature sensor. Such system 70 is of low power consumption, and it is capable of compensating the property independently to stabilize the system.

Example 12

Above described Examples illustrate a structure in which a transistor having two polarities is used as the delay element and the voltage controlled oscillator. In Example 12, a structure in which only a transistor having either one of polarities is used will be illustrated. FIG. 57 shows an example of a circuit diagram of the delay element that uses only a transistor having either one of polarities. Here, the example using only PMOS is showed, but it is easy to employ a circuit using only NMOS by paying attention to the potential relation.

The delay generating part shown in FIG. 57 includes five PMOS transistors 1*q*, 1*r*, 1*s*, 1*t*, and 1*u*. This circuit has a structure similar to that of a circuit having the delay generating part using differential inputs, as shown in FIG. 8, with the polarities reversed. That is, PMOS transistors 1*r* and 1*s* in FIG. 57 form a differential input pair, as NMOS transistors 2*c* and 2*d* in FIG. 8. PMOS 1*q* in FIG. 57 that corresponds to NMOS 2*e* in FIG. 8 is controlled by the bias B11 and used as a current source. If the polarities of a circuit that corresponds to PMOS 1*c* and 1*d* in FIG. 8 are simply inverted, two of NMOS are required. In FIG. 57, two PMOS 1*t* and 1*u* are used instead of the NMOS. The bias 12B is applied so as to operate the PMOS 1*t* and 1*u* in a linear region (triode region). At the same time, by setting a low-voltage side power source potential Vx as ground or a negative source, the PMOS 1*t* and 1*u* are made to be operated in the linear region. In this structure, since a differential signal is used as is in the case of FIG. 8, an influence of the noise is suppressed. Therefore, when the voltage controlled oscillator is formed by using this structure, stability of the oscillation frequency can be high.

The adjustment of the delay amount and compensating bias are realized by the biases E11 and B12. A connecting method at forming the voltage controlled oscillator can be performed in the track of the voltage controlled oscillator using the differential signal.

Example 13

Figure 58:
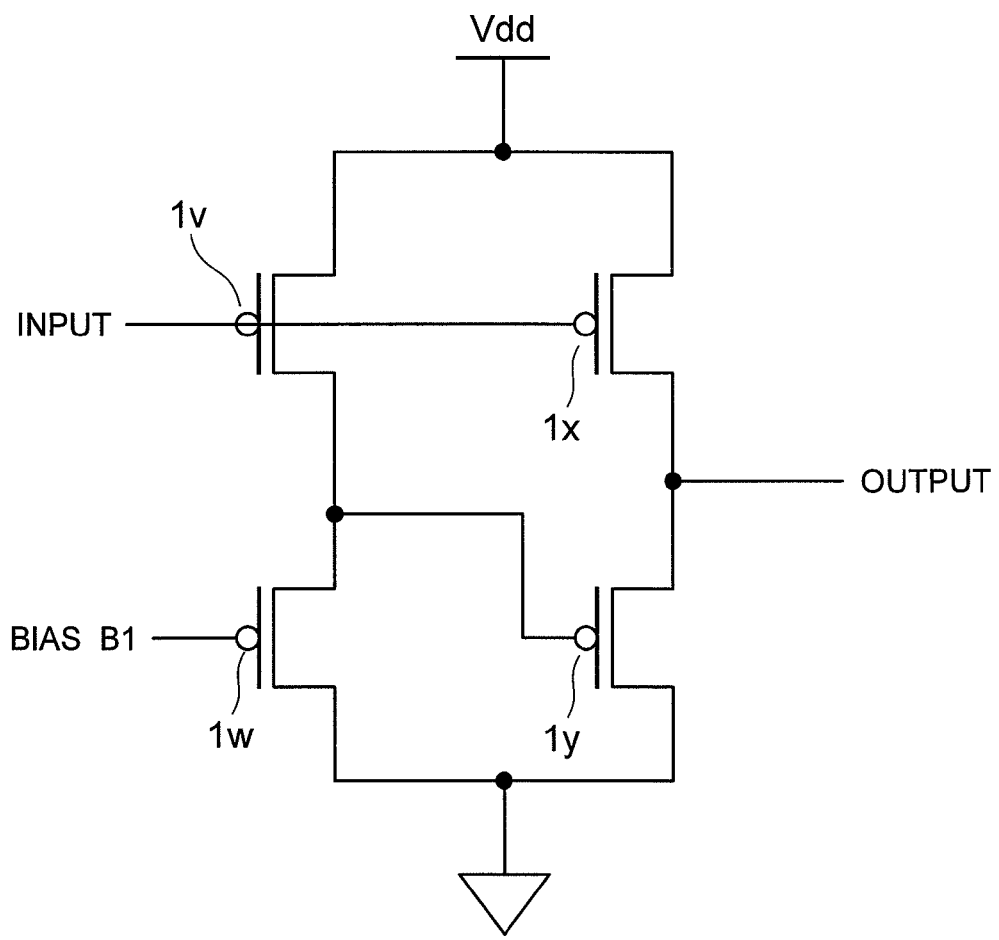
FIG. 58 is a circuit block diagram showing a delay generating part according to Example 13.

Here, Example 13, in which only a transistor having either one of polarities is used, will be described, as Example. 12. FIG. 58 shows a delay generating part according to example 13 which includes four PMOS transistors 1*v*, 1*w*, 1*x*, and 1*y*. In this structure, PMOS 1*x* and PMOS 1*y* form an inverter. Also, an operating point of the inverter can be adjusted by the bias B1 applied to PMOS 1*v* and PMOS 1*w*. That is, when the bias B1 is changed, the potential between PMOS 1*v* and PMOS 1*w* is also changed, then the changed potential is input to the gate of PMOS 1*y*, and the operating point is changed. The delay amount can be changed by adjusting the operating point of the inverter. By using a plurality of the delay generating parts and connecting to be looped, the voltage controlled oscillator can be obtained. In Example 13, the number of transistors arranged in series between the high-voltage side power supply Vdd and the low-voltage side power supply Vss is smaller compared to the case of Example 12 (three in Example 12, two in Example 13). Therefore, an amount of divergence of the voltage of the output node from each source voltage is also small. With this reason, a ground voltage is employed as the low-voltage side power supply voltage in FIG. 58 of the Example 13.

This Example 13 is advantageous in that the number of transistors is small and the number of types of the source voltage can be reduced compared to Example 12 since a new low-voltage side power supply is not required.

Example 14

Figure 59:
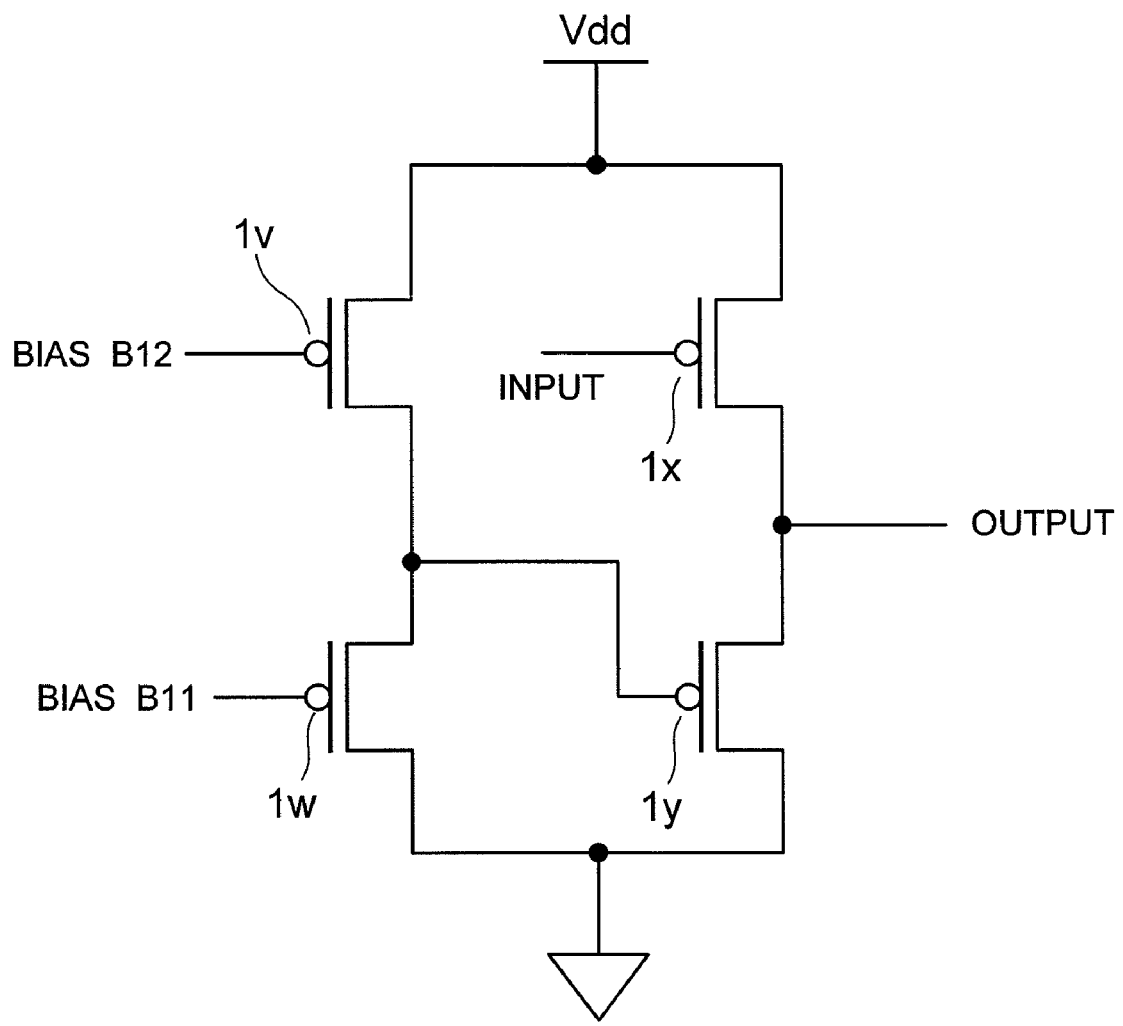
FIG. 59 is a circuit block diagram showing a delay generating part according to Example 14.

A structure that is almost the same as Example 13, with the number of input biases being two, is shown in FIG. 59.

In FIG. 58 of Example 13, the input signals inputted to the gate electrodes of PMOS 1*v* and PMOS 1*w* are equivalent. Meanwhile, in FIG. 59 of Example 14, though the input signal is inputted to PMOS 1*x* as shown in FIG. 58, the bias B12 is applied to PMOS 1*v*. In this structure, it is possible to adjust the operating point of the inverter configured with PMOS 1*x* and 1*y* by respective biases of PMOS 1*v* and PMOS 1*w*. With this, an operation of a normal voltage control with one of biases and an operation of temperature compensation or the like with the other bias become possible. By connecting the delay generating parts to be looped, the voltage controlled oscillator can be formed.

Figure 60:
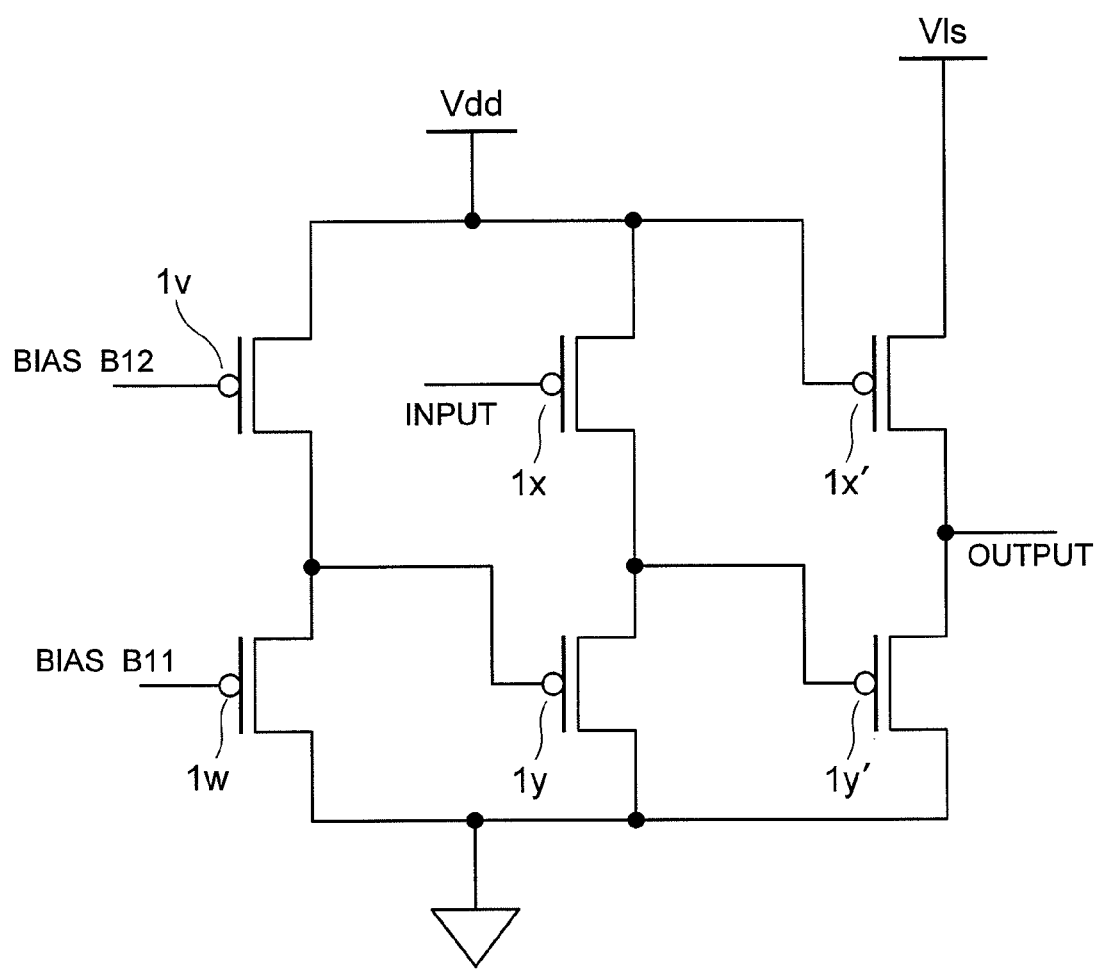
FIG. 60 is a circuit block diagram showing a delay generating part having a level shift circuit according to Example 13 and Example 14.

When the voltage controlled oscillator is configured as shown in Example 14 and Example 13, and the bias is adjusted in order to adjust the oscillation frequency, there is a case that the amplitude of the output voltage is changed. To deal with this case, it is considered to provide a level shift circuit at the part from which the oscillation output is taken out to adjust the output. Also, there is such a method of providing the level shift circuit at each delay generating part to adjust the output at every step. An example of this method is shown in FIG. 60. An output of the inverter with the PMOS 1*x* and 1*y* is connected to the inverter with the PMOS 1*x*' and 1*y*'. Also, the high-voltage side power supply of the inverter with the PMOS 1*x*' and 1*y*' is set as V1*x*. With this configuration, the amplitude of the output signal can be adjusted by changing the potential of V1x.

Example 15

Figure 61:
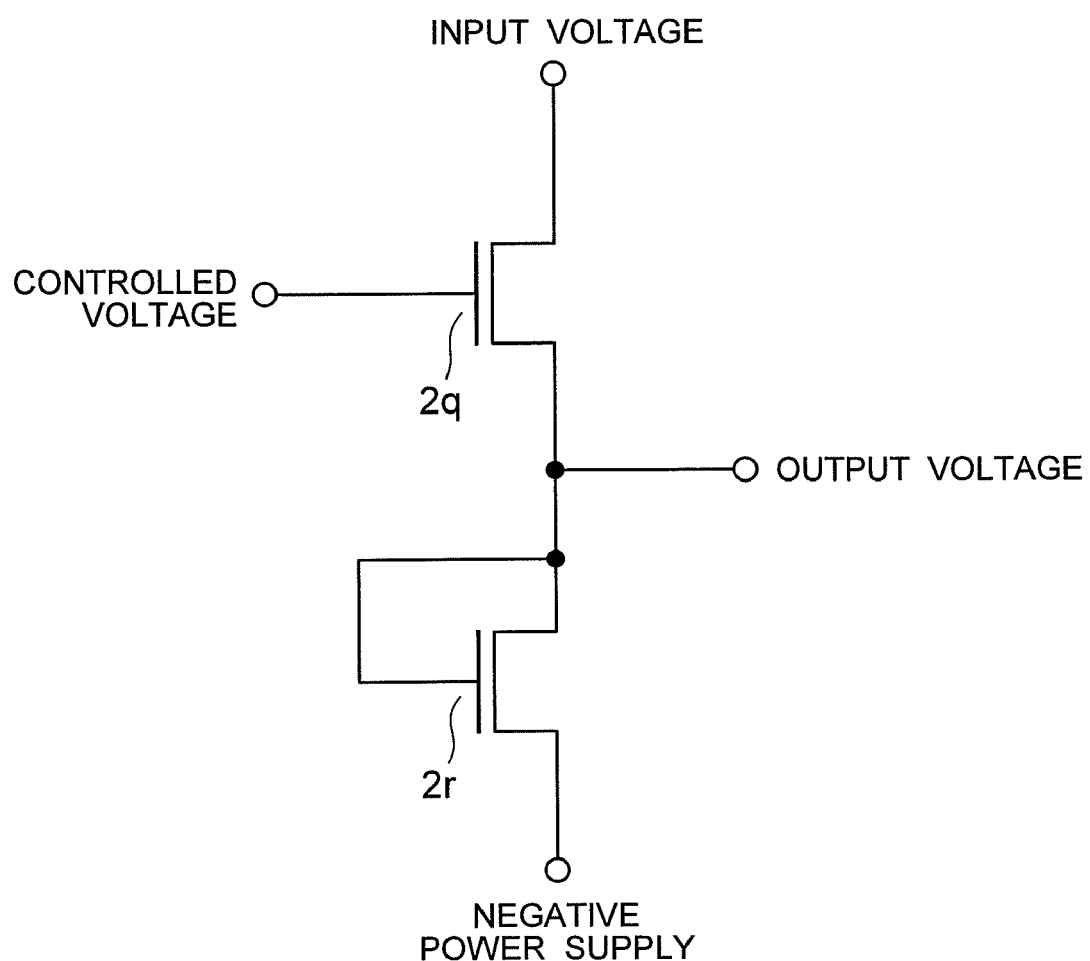
FIG. 61 is a circuit block diagram showing a core part of a temperature sensor described in Patent Document 2, used in Example 15.

A drawing of a core part of the technique of the temperature sensor (FIG. 2A of Patent Document 2) disclosed by the Inventors of the present invention in Patent Document 2 is shown in FIG. 61. In FIG. 61, NMOS 2q is a current-voltage converting unit, and NMOS 2r is a temperature detecting unit. As is clear from the drawing, the core part of this temperature sensor is configured from only transistors having either one of the polarities. Therefore, the control can be performed, including the temperature compensating bias, by only the transistors with either one of the polarities used together with the structure of Example 12 or Example 13. Here, this structure is Example 15. For example, FIG. 61 shows a structure using NMOS, but it is possible to configure with only transistors having the same polarity as that of FIG. 57 etc, by configuring it with PMOS. With this, it is advantageous in that the manufacturing process of the transistor can be decreased drastically, and the cost can be reduced. Also, it is advantageous when using a transistor technique in which configuring a transistor having both polarities is difficult.

In this Example, since the temperature sensor can be configured in the neighbor of the voltage controlled oscillator by using the same process, it is possible to measure the change in temperature of the voltage controlled oscillator itself, and provide feedback. This means that the temperature control can be performed more precisely compared to the case of providing the temperature sensor outside, and a stable oscillation frequency can be obtained. As described, it is advantageous in that the same process (the insulating film of the same material and the same film thickness, the same doping concentration, the same active layer, etc.) can be utilized for the temperature sensor and the voltage controlled oscillator.

Example 16

Figure 62:
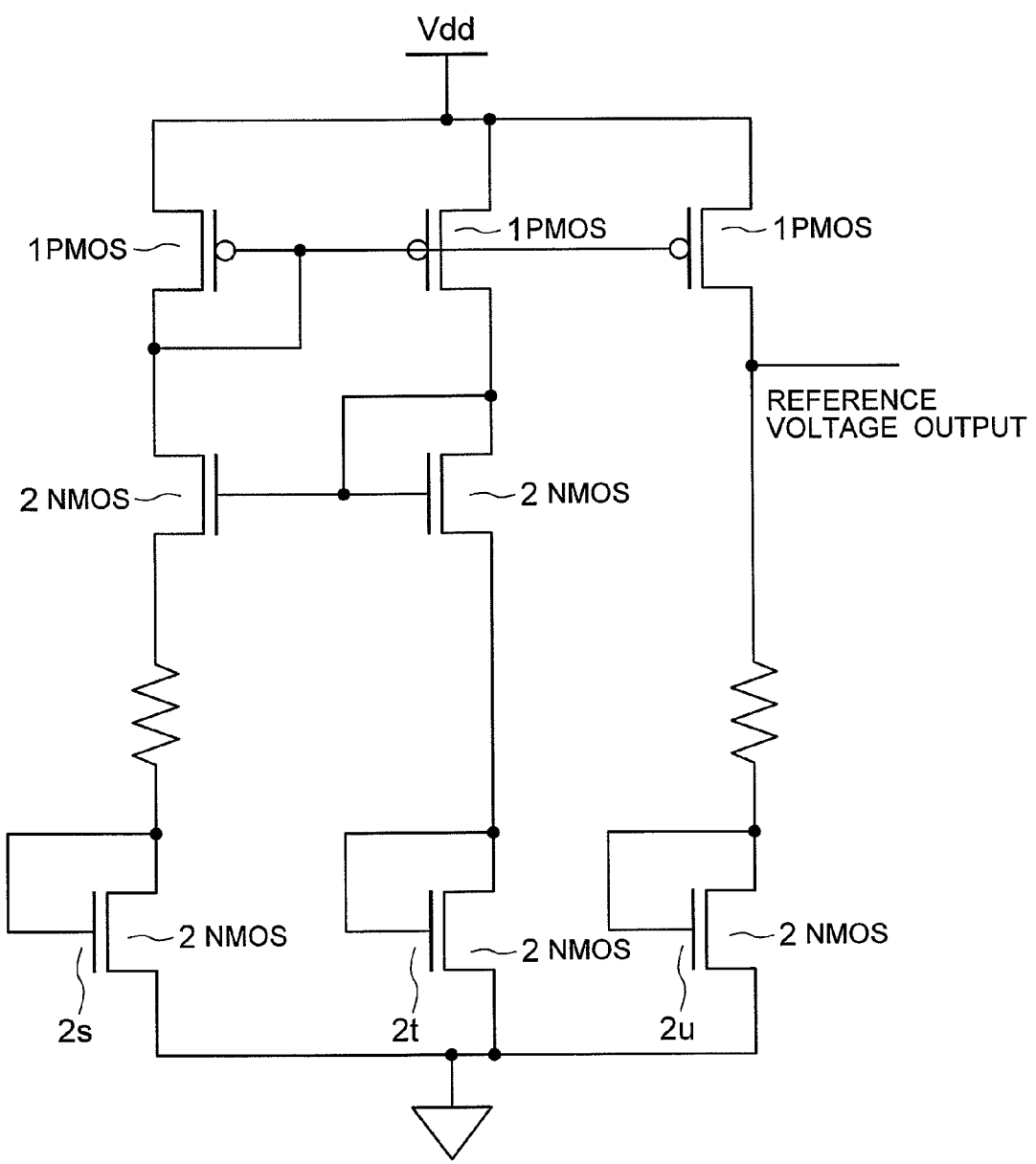
FIG. 62 is a circuit block diagram showing a reference voltage generating circuit according to Example 16.
Figure 63:
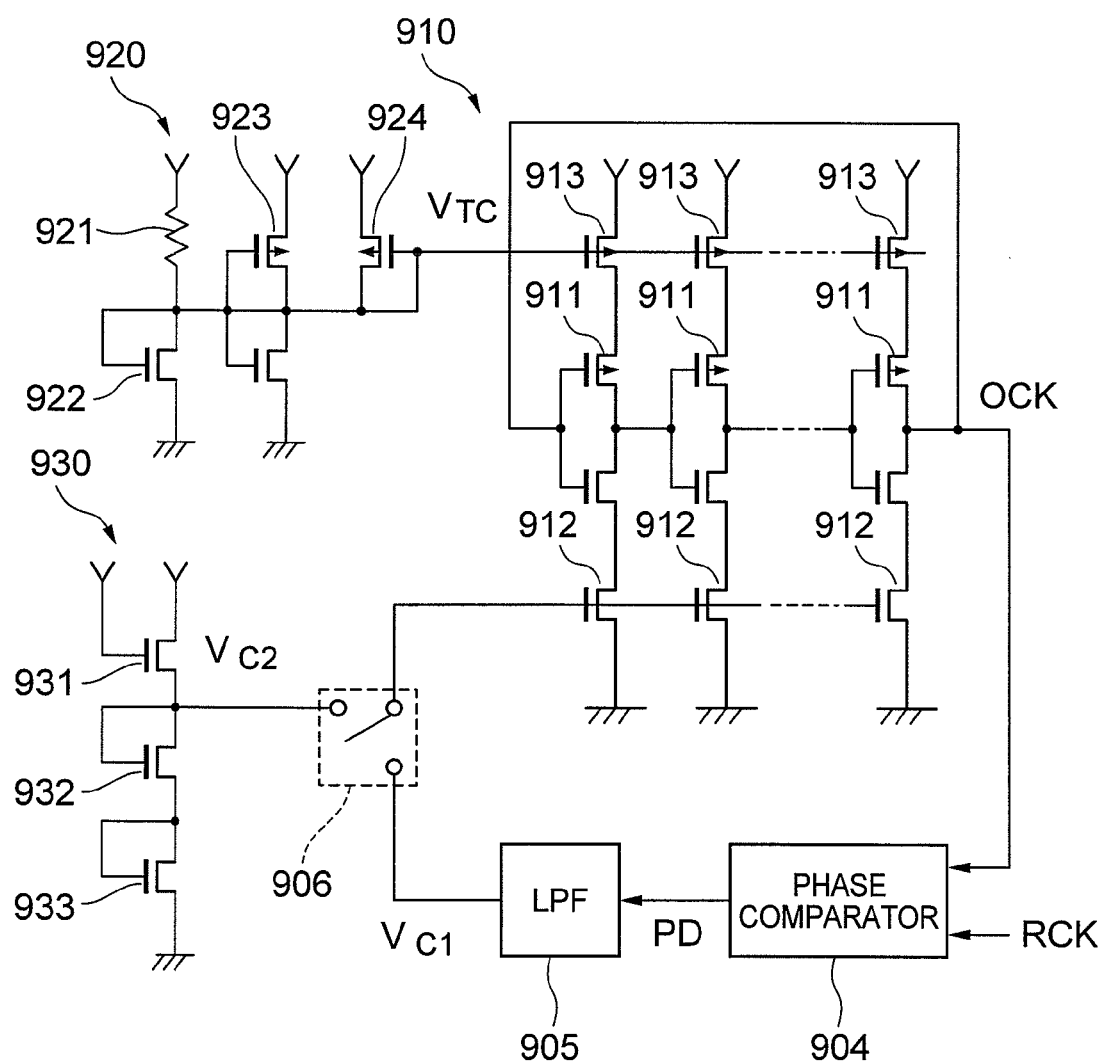
FIG. 63 is a circuit block diagram showing a structure of a phase lock loop using a voltage controlled oscillator of related art.

In each Example described above, a reference voltage source having a weak dependency for temperature is sometimes required when the bias applied to the delay element or the voltage controlled oscillator is to be generated. Therefore, in this Example, an example of the reference voltage source configured by transistors is described. FIG. 62 is a drawing which shows an example of a reference voltage generating circuit configured by transistors. This circuit includes three PMOS transistors, five NMOS transistors, and two resistors. NMOS being marked in the drawing, 2s, 2t, and 2u, may be diodes or bipolar transistors (BJT), instead of NMOS transistors. In such a case, the bipolar transistor is used such that the collector is to be the ground side, and the base and the collector are connected. The reference voltage generating circuit shown in this drawing is one type of circuits called band gap reference (BGR) circuits. The fluctuation in the output of this circuit with temperature is very small. For example, if this circuit is configured with a low temperature polysilicon transistor, the fluctuation in the output voltage is about several hundreds ppm per one degree C. when the temperature is changed about 100 degrees from the room temperature (from 25 degrees C. to 125 degrees C., for example). That is, the control bias, required for 3V in FIG. 41, can be output from 2.9997 V to 3.0003 V, for example, in a temperature range of 100 degrees. The circuit from which a stable output is obtained in such a wide temperature range can be utilized preferably for the control bias as shown in this Example. Also, it can be utilized as the reference voltage that doesn't fluctuate with temperature when generating the compensating bias of the temperature sensor. Further, it also can be utilized as the reference voltage for a circuit to which a feedback is provided in order that the source voltage and the like are not fluctuated with temperature. By incorporating such a reference voltage circuit, the output of the voltage controlled oscillator can be stabilized extremely.

In the description of the Examples of this Specification, there are several examples in which a polycrystal silicon thin film transistor is used as a transistor. For example, FIG. 23 and FIG. 24, showing characteristics of a single transistor, are such cases. However, it is clear that this invention is not limited to be applied to only the polycrystal silicon thin film transistor, but applicable to various transistors. Particularly, the exemplary embodiment using either one of polarities can be preferably used for an amorphous silicon thin film transistor, an organic transistor, an oxide transistor, and the like. Also, the exemplary embodiment using either one of polarities may be applied to the polycrystal silicon thin film transistor or a bulk silicon transistor, in order to reduce the cost.

Supplementary Explanations

The structures, operations, and effects of the present invention can also be expressed as follows.

First, the structure of the present invention will be described. The first delay element of the present invention is a delay element that is capable of controlling delay from outside by a delay control part that is configured with a delay adjusting circuit and a temperature compensating circuit connected in series. Further, the second delay element of the present invention is a delay element that is capable of controlling delay from outside by a delay control part that is configured with a delay adjusting circuit, a temperature compensating circuit, and a synthesizing circuit that is connected to those circuits.

The first variable delay line of the present invention is configured by connecting, in series, a plurality of delay elements having a delay control part that is configured with the delay adjusting circuit and the temperature compensating circuit connected in series, or a plurality of delay elements having a delay control part that is configured with the delay adjusting circuit, the temperature compensating circuit, and the synthesizing circuit connected to those circuits. Further, the second variable delay line of the present invention is configured by connecting a plurality of delay generating parts in series, and the delay control part for controlling the delay amount of the delay generating part from outside is provided in common to all the delay generating parts. The delay control part is configured with the delay adjusting circuit and the temperature compensating circuit connected in series, or configured with the delay adjusting circuit, the temperature compensating circuit, and the synthesizing circuit connected to those circuits.

The first voltage controlled oscillator of the present invention is formed as a closed loop by connecting, in series, a plurality of delay elements having a delay control part that is configured with the delay adjusting circuit and the temperature compensating circuit connected in series, or a plurality of delay elements having a delay control part that is configured with the delay adjusting circuit, the temperature compensating circuit, and the synthesizing circuit connected to those circuits. Further, the second voltage controlled oscillator of the present invention is configured by connecting a plurality of delay generating parts in series, and the delay control part for controlling the delay amount of the delay generating part from outside is provided in common to all the delay generating parts. The delay control part is configured with the delay adjusting circuit and the temperature compensating circuit connected in series, or configured with the delay adjusting circuit, the temperature compensating circuit, and the synthesizing circuit connected to those circuits.

Next, operations (actions of the devices for obtaining the effects) of the present invention will be described. The first delay element of the present invention has the delay adjusting circuit and the temperature compensating circuit, so that it is possible to adjust the delay amount from outside and to compensate the temperature characteristic from outside as well. Signals are transmitted to the delay generating parts by the delay control part that is configured by connecting the delay adjusting circuit and the temperature compensating circuit in series. Since the control signals are transmitted to the delay generating parts from the delay control part that is configured by connecting the delay adjusting circuit and the temperature compensating circuit in series, the number of control signal lines connected directly to the delay generating parts is small. That is, the control signal of the delay adjusting circuit and the compensation control signal of the temperature compensating circuit are synthesized as a new control signal for adjusting the delay amount within the delay control part. Since the delay adjusting circuit and the temperature compensating circuit are connected in series, control information transmitted to the delay control part works only at one section of the delay element. Thus, it is unnecessary to have a plurality of control sections in the delay control part, so that the structure becomes simple. Further, since it is unnecessary to have a plurality of control sections in the delay control part, various types can be used for the delay control part.

The second delay element of the present invention is controlled by the delay control part that is configured with the delay adjusting circuit, the temperature compensating circuit, and the synthesizing circuit that is connected to those circuits. Thus, the number control signal lines is small, as in the case of the above-described delay control part in which the delay adjusting circuit and the temperature compensating circuit are connected in series. Further, control information works only at one section of the delay element.

The variable delay line of the present invention is configured by connecting, in series, a plurality of delay elements having a delay control part that is configured with the delay adjusting circuit and the temperature compensating circuit connected in series, or a plurality of delay elements having a delay control part that is configured with the delay adjusting circuit, the temperature compensating circuit, and the synthesizing circuit connected to those circuits. Therefore, it is possible to take out an arbitrary temperature-compensated delay amount by selecting an arbitrary junction point.

The voltage controlled oscillator of the present invention is formed as a closed loop by connecting, in series, a plurality of delay elements having a delay control part that is configured with the delay adjusting circuit and the temperature compensating circuit connected in series, or a plurality of delay elements having a delay control part that is configured with the delay adjusting circuit, the temperature compensating circuit, and the synthesizing circuit connected to those circuits. Therefore, it is possible to change the frequency by the frequency control bias, and to take out a signal with a temperature-compensated frequency.

Next, effects of the present invention will be described. The first effect is that it is possible to provide, with a simple structure, the voltage controlled oscillator whose center oscillation frequency is stable even if there is a change in the temperature. Particularly, it is possible to provide the voltage controlled oscillator capable of executing excellent temperature compensation with a simple structure, without using an external element such as a temperature compensation quartz oscillator or the like.

The second effect is that it is possible to provide the voltage controlled oscillator that satisfies the following three points by the use of a symmetrical load in particular. The three points are: (1) oscillation signals can be obtained regardless of the control bias; (2) the change in the oscillation frequency is in a linear form with respect to the change in the control bias; (3) gain of the change in the oscillation frequency with respect to the change in the control bias is small. At the same time, it is possible to provide the voltage controlled oscillator that has smaller change in the frequency even if there is a change in the temperature.

The third effect is that it is possible to provide the voltage controlled oscillator which exhibits an excellent property even when the characteristic of the element is fluctuated largely from a prescribed characteristic due to the process condition or the like.

The fourth effect is that it is possible to provide the delay element having a function of controlling the delay amount and compensating the property change caused due to the temperature, through working only at one section of the delay element. Further, it is possible to provide the variable delay line and the voltage controlled oscillator capable of adjusting the frequency and compensating the temperature, by utilizing that delay element.

The fifth effect is that it is possible to provide delay elements of various structures, having a function of controlling the delay amount and compensating the property change caused due to the temperature, through working only at one section of the delay element. Further, it is possible to provide the variable delay line and the voltage controlled oscillator capable of adjusting the frequency and compensating the temperature, by utilizing such delay element.

The sixth effect is that it is possible to provide the display device in which the display unit and the functional circuit unit whose temperature characteristic is compensated are formed integrally. Further, it is possible to provide various kinds of devices and the system, which use the display device as one of the structural modules. Particularly, it is possible to provide the system which is of low power consumption and capable of compensating the property independently.

While the present invention has been described above by referring to each of the exemplary embodiments and Examples, the present invention is not limited to those exemplary embodiments and Examples. Various changes and modifications that occur to those skilled in the art may be applied to the structures and details of the present invention. Further, it is to be understood that the present invention includes combinations of a part of or the whole part of the structures described in each of the exemplary embodiments and Examples.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A delay element, comprising a delay generating part which generates an output signal by adding a specific delay amount to an input signal, and a delay control part for controlling the delay amount, wherein:

the delay control part includes a delay adjusting circuit for adjusting the delay amount and a temperature compensating circuit for compensating a property change caused due to a temperature, the delay control part outputs a second control signal to control the delay amount, the delay adjusting circuit and the temperature compensating circuit are voltage-current conversion elements such that the delay amount is adjusted by a first control signal applied to the delay adjusting circuit from an external circuit and the property change is compensated by a voltage applied to the temperature compensating circuit, and the delay adjusting circuit and the temperature compensating circuit are connected in series such that current output from the temperature adjusting circuit is effected by the first control signal applied to the delay adjusting circuit and current output from the delay adjusting circuit is effected by the voltage applied to the temperature compensating circuit, and such that an effect of adjusting the delay amount by the delay adjusting circuit and an effect of compensating the property change by the temperature compensating circuit are synthesized to generate the second control signal.

2. The delay element as claimed in claim 1, wherein the voltage applied to the delay adjusting circuit is applied to the delay adjusting circuit from a source external to the delay control part.

3. The delay element as claimed in claim 2, wherein the delay generating part includes a differential input terminal for inputting the input signal.

4. The delay element as claimed in claim 2, wherein the delay generating part is configured with a current-starved inverter.

5. The delay element as claimed in claim 4, wherein an additional capacitance by a mirror capacitance is added to the current-starved inverter.

6. A delay element, comprising a delay generating means for generating an output signal by adding a specific delay amount to an input signal, and a delay control means for controlling the delay amount, wherein:

the delay control means includes a delay adjusting means for adjusting the delay amount and a temperature compensating means for compensating a property change caused due to a temperature, the delay control means outputs a second control signal to control the delay amount, the delay adjusting means and the temperature compensating means are voltage-current conversion elements such that the delay amount is adjusted by a first control signal applied to the delay adjusting means from an external circuit and the property change is compensated by a voltage applied to the temperature compensating means, and the delay adjusting means and the temperature compensating means are connected in series such that current output from the temperature adjusting circuit is effected by the first control signal applied to the delay adjusting circuit and current output from the delay adjusting circuit is effected by the voltage applied to the temperature compensating circuit, and such that an effect of adjusting the delay amount by the delay adjusting means and an effect of compensating the property change by the temperature compensating means are synthesized to generate the second control signal.

7. A variable delay line, comprising a plurality of delay elements connected in series:

each one of the delay elements comprising: a delay generating part which generates an output signal by adding a specific delay amount to an input signal, and a delay control part for controlling the delay amount, wherein:

the delay control part includes a delay adjusting circuit for adjusting the delay amount and a temperature compensating circuit for compensating a property change caused due to a temperature, the delay control part outputs a second control signal to control the delay amount, the delay adjusting circuit and the temperature compensating circuit are voltage-current conversion elements such that the delay amount is adjusted by a first control signal applied to the delay adjusting circuit from an external circuit and the property change is compensated by a voltage applied to the temperature compensating circuit, and the delay adjusting circuit and the temperature compensating circuit are connected in series such that current output from the temperature adjusting circuit is effected by the first control signal applied to the delay adjusting circuit and current output from the delay adjusting circuit is effected by the voltage applied to the temperature compensating circuit, and such that an effect of adjusting the delay amount by the delay adjusting circuit and an effect of compensating the property change by the temperature compensating circuit are synthesized to generate the second control signal.

8. The variable delay line as claimed in claim 7, comprising a single piece of the delay control part provided to be used in common for the plurality of delay elements, wherein the single delay control part outputs the control signal to a plurality of the delay generating parts provided respectively to the plurality of delay elements to control the delay amount.

9. A voltage controlled oscillator configured with a variable delay line, comprising a closed loop in which an output terminal of one of the plurality of delay elements is connected to an input terminal of one of the delay elements of earlier stage than that delay element, each one of the delay elements comprising: a delay generating part which generates an output signal by adding a specific delay amount to an input signal, and a delay control part for controlling the delay amount, wherein:

the delay control part includes a delay adjusting circuit for adjusting the delay amount and a temperature compensating circuit for compensating a property change caused due to a temperature, the delay control part outputs a second control signal to control the delay amount, the delay adjusting circuit and the temperature compensating circuit are voltage-current conversion elements such that the delay amount is adjusted by a first control signal applied to the delay adjusting circuit from an external circuit and the property change is compensated by a voltage applied to the temperature compensating circuit, and the delay adjusting circuit and the temperature compensating circuit are connected in series such that current output from the temperature adjusting circuit is effected by the first control signal applied to the delay adjusting circuit and current output from the delay adjusting circuit is effected by the voltage applied to the temperature compensating circuit, and such that an effect of adjusting the delay amount by the delay adjusting circuit and an effect of compensating the property change by the temperature compensating circuit are synthesized to generate the second control signal.

10. The voltage controlled oscillator as claimed in claim 9, wherein an output terminal of the delay element of a last stage out of the plurality of delay elements is connected to an input terminal of the delay element of a first stage.

11. The voltage controlled oscillator as claimed in claim 9, wherein the plurality of delay elements are an odd-number of delay elements, and each of the delay elements is configured with a voltage-controlled type inversion element.

12. The voltage controlled oscillator as claimed in claim 9, wherein the delay element is configured with a differential-input type delay element.

13. The voltage controlled oscillator as claimed in claim 9, wherein at least the delay adjusting circuit or the temperature compensating circuit includes one or more multi-gate transistor.

14. The voltage controlled oscillator as claimed in claim 9, wherein at least the delay adjusting circuit or the temperature compensating circuit includes one or more element that is configured by connecting a transistor and a diode-connected transistor in parallel.

15. The voltage controlled oscillator as claimed in claim 9, wherein a section for outputting the control signal to the delay generating part from the delay control part is formed with an element that is configured by connecting a transistor and a diode-connected transistor in parallel.

16. The voltage controlled oscillator as claimed in claim 9, wherein the control signal is an analog signal.

17. The voltage controlled oscillator as claimed in claim 9, wherein the control signal is a digital signal.

18. A display device, comprising the voltage controlled oscillator of claim 9 and a functional circuit unit including the voltage controlled oscillator.

19. A system, comprising the display device of claim 18 as one of structural modules.

* * * * *